(12) United States Patent
Ogata

(10) Patent No.: US 10,153,293 B2
(45) Date of Patent: Dec. 11, 2018

(54) SEMICONDUCTOR DEVICE AND METHOD OF MANUFACTURING SEMICONDUCTOR DEVICE

(71) Applicant: Renesas Electronics Corporation, Tokyo (JP)

(72) Inventor: Tamotsu Ogata, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/658,759

(22) Filed: Jul. 25, 2017

(65) Prior Publication Data

US 2018/0090508 A1    Mar. 29, 2018

(30) Foreign Application Priority Data

Sep. 28, 2016   (JP) ................. 2016-190230

(51) Int. Cl.
| | |
|---|---|
| H01L 27/115 | (2017.01) |
| H01L 27/11568 | (2017.01) |
| H01L 23/535 | (2006.01) |
| H01L 27/11573 | (2017.01) |
| H01L 29/423 | (2006.01) |

(52) U.S. Cl.
CPC ...... *H01L 27/11568* (2013.01); *H01L 23/535* (2013.01); *H01L 27/11573* (2013.01); *H01L 29/42344* (2013.01)

(58) Field of Classification Search
CPC .............................. H01L 27/11563–27/11582
See application file for complete search history.

(56) References Cited

U.S. PATENT DOCUMENTS

| | | | |
|---|---|---|---|
| 7,504,689 B2 | 3/2009 | Hisamoto et al. | |
| 8,951,869 B2 | 2/2015 | Tsukamoto et al. | |
| 9,318,500 B2 | 4/2016 | Shinohara | |
| 2006/0022260 A1* | 2/2006 | Hisamoto ......... | H01L 21/28273 257/324 |
| 2014/0227843 A1* | 8/2014 | Tsukamoto ....... | H01L 29/66507 438/275 |

FOREIGN PATENT DOCUMENTS

| | | |
|---|---|---|
| JP | 2006-041354 A | 2/2006 |
| JP | 2014-154789 A | 8/2014 |
| JP | 2014-154790 A | 8/2014 |

* cited by examiner

*Primary Examiner* — Daniel Shook
(74) *Attorney, Agent, or Firm* — Mattingly & Malur, PC

(57) ABSTRACT

A semiconductor device having a nonvolatile memory cell arranged in a p-type well (active region) PW1 in a memory cell region 1A in a semiconductor substrate 1 and an MISFET arranged in a p-type well PW2 (active region) or an n-type well (active region) in a peripheral circuit region 2A is constructed as follows. The surface of an element isolation region STI1 surrounding the p-type well PW1 is set lower than the surface of an element isolation region STI2 surrounding the p-type well PW2 or the n-type well (H1<H2). By making the surface of the element isolation region STI1 receded and lowered, the effective channel width of both a control transistor and a memory transistor can be increased. Since the surface of the element isolation region STI2 is not made receded, an undesired film can be prevented from being residual over a dummy gate electrode.

8 Claims, 84 Drawing Sheets

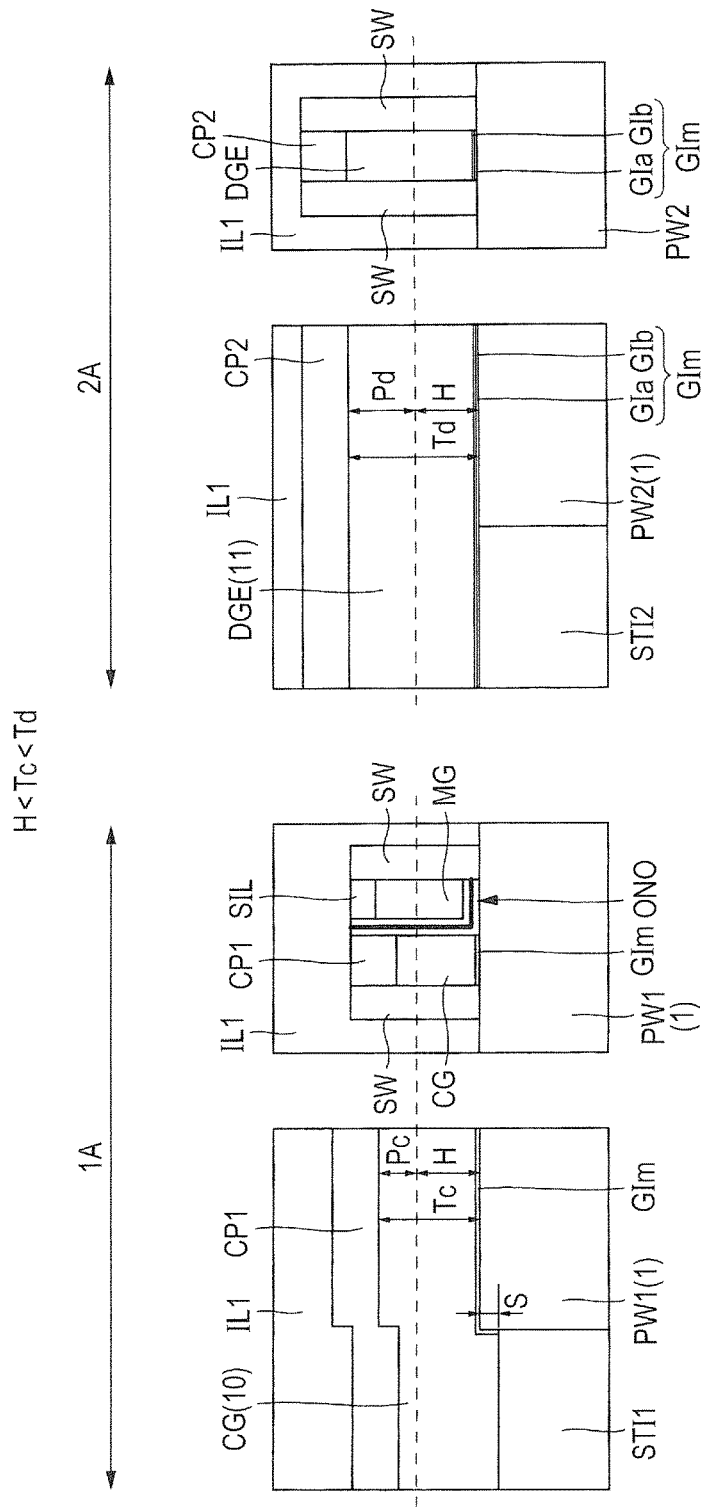

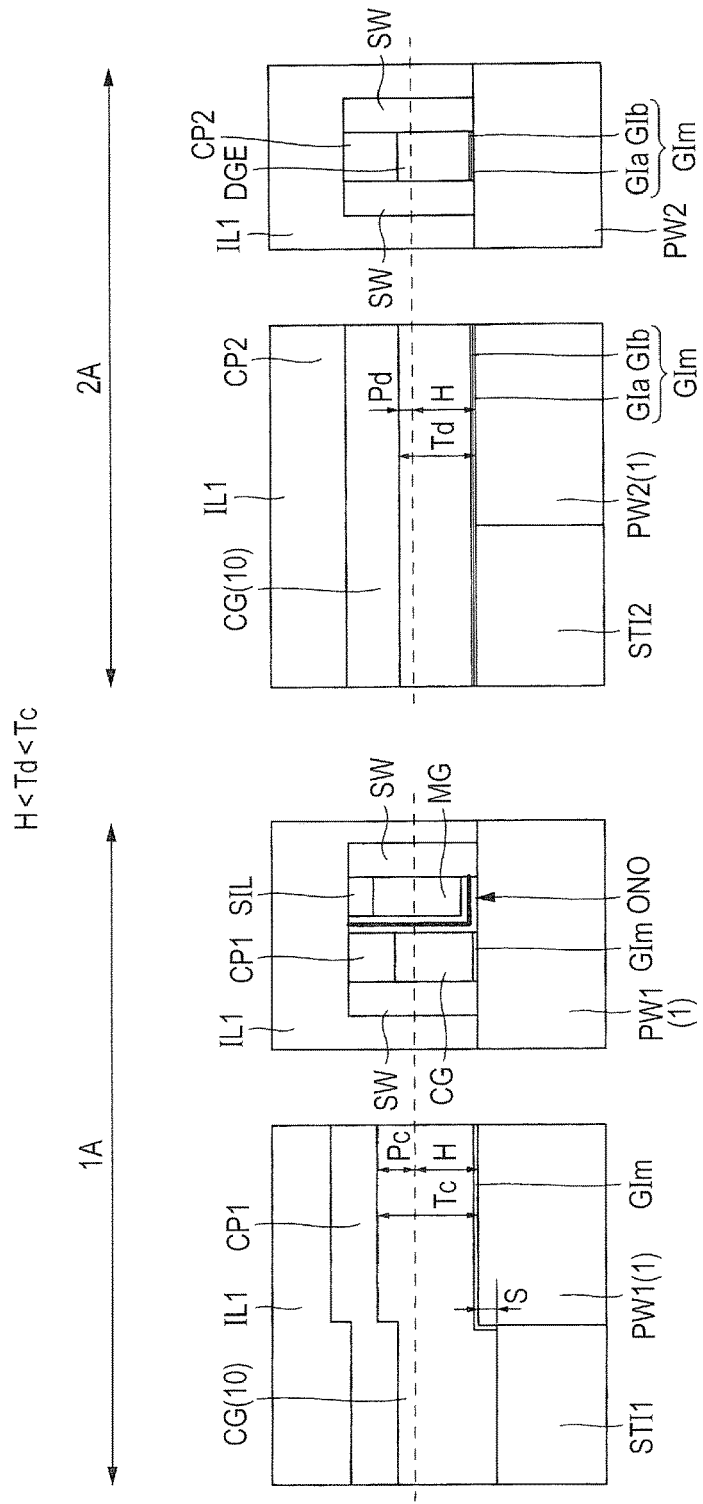

SEMICONDUCTOR DEVICE AND METHOD OF MANUFACTURING SEMICONDUCTOR DEVICE

CROSS-REFERENCE TO RELATED APPLICATIONS

The disclosure of Japanese Patent Application No. 2016-190230 filed on Sep. 28, 2016 including the specification, drawings and abstract is incorporated herein by reference in its entirety.

BACKGROUND

The present invention relates to a semiconductor device and a method of manufacturing a semiconductor device and can be suitably used for a semiconductor device having a nonvolatile memory cell and an MISFET and a method of manufacturing the same.

A semiconductor device having a nonvolatile memory cell formed in a memory region and an MISFET (Metal Insulator Semiconductor Field Effect Transistor) formed in a peripheral circuit region is widely used.

For example, there is a case that a memory cell made by a split-gate-type cell using an MONOS (Metal Oxide Nitride Oxide Semiconductor) film is formed as a nonvolatile memory. There is also a case that an MISFET using a high-dielectric-constant film, a so-called high-k film as a gate insulating film is formed.

Japanese Unexamined Patent Application Publication No. 2014-154789 (patent literature 1) discloses a technique of forming a control gate electrode and a memory gate electrode for a memory cell in a memory cell region and, after that, forming a gate electrode for an MISFET in a peripheral circuit region in a method of manufacturing a semiconductor device.

Japanese Unexamined Patent Application Publication No. 2014-154790 (patent literature 2) discloses a technique of forming a control gate electrode and a memory gate electrode for a memory cell in a memory cell region, forming a dummy gate electrode for an MISFET in a peripheral circuit region, removing the dummy gate electrode, and replacing to a gate electrode for the MISFET in a method of manufacturing a semiconductor device.

Japanese Unexamined Patent Application Publication No. 2006-41354 (patent literature 3) discloses a technique of forming a memory gate on a convexed substrate and using the side face as a channel in a nonvolatile semiconductor device of a split-gate structure.

SUMMARY

The inventors of the present invention are engaged in research and development of a semiconductor device having a nonvolatile memory cell and an MISFET and keenly examine improvement of the characteristics of the semiconductor device. In the process, it was found out that there is further room for improvement in a semiconductor device having a nonvolatile memory cell and an MISFET and a method of manufacturing the same.

Particularly, in the case of forming a memory cell which is a split-gate-type cell using an MONOS film and an MISFET using a high-k film as a gate insulating film over the same semiconductor substrate, it is demanded to improve the characteristics of each of the elements. Configuration of a manufacture process of effectively manufacturing elements having excellent characteristics is also demanded.

The other problems and novel features will become apparent from the description of the specification and appended drawings.

Outline of the configuration described in a representative embodiment disclosed in the present application will be briefly described as follows.

A semiconductor device of a representative embodiment disclosed in the present application has a nonvolatile memory cell arranged in a first active region in a first region of a semiconductor substrate and an MISFET arranged in a second active region in a second region. In the first region, the surface of a first element isolation region surrounding the first active region in the first region is lower than the surface of a second element isolation region surrounding the second active region in the second region.

A method of manufacturing a semiconductor device in a representative embodiment disclosed in the present application is a method of manufacturing a semiconductor device having a nonvolatile memory cell arranged in a first active region in a first region of a semiconductor substrate and an MISFET arranged in a second active region in a second region, and has a step of making the surface of the first element isolation region surrounding the first active region receded.

By the semiconductor device of the representative embodiment disclosed in the present application, its characteristics can be improved.

By the method of manufacturing a semiconductor device of the representative embodiment disclosed in the present application, a semiconductor device with excellent characteristics can be manufactured.

BRIEF DESCRIPTION OF THE DRAWINGS

FIG. 81 is a diagram for explaining the first application of the third embodiment.

FIG. 82 is a diagram for explaining the first application of the third embodiment.

DETAILED DESCRIPTION

Figure 1:
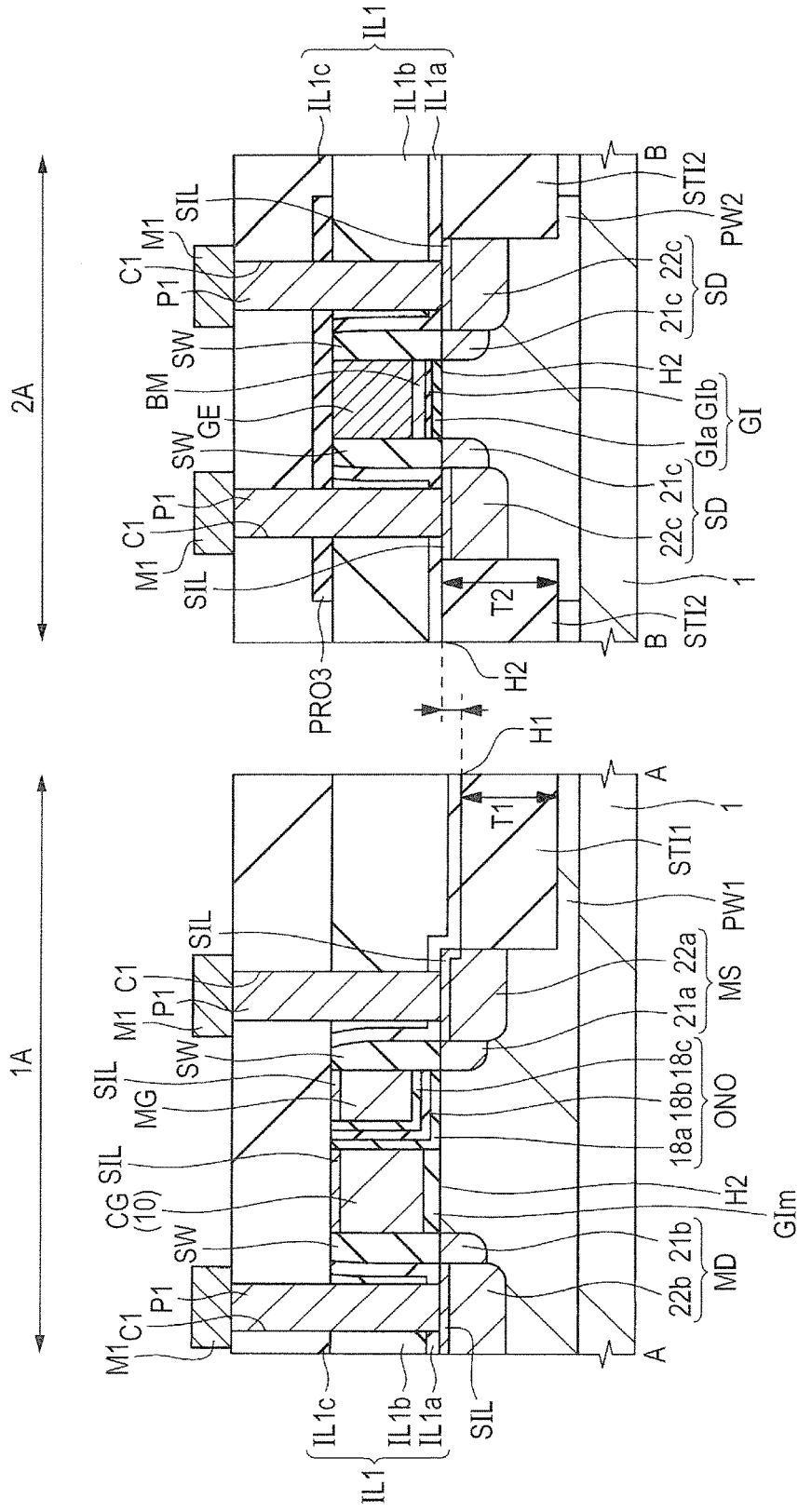
FIG. 1 is a cross section illustrating the configuration of a semiconductor device of a first embodiment.

In the following embodiments, when it is necessary for convenience, an embodiment will be described by being divided to a plurality of sections or examples. Unless otherwise clearly specified, they are not non-related but have relations such as modification, application, detailed description, and supplementary explanation in which one is a part or all of the other. In the following embodiments, in the case of mentioning the number of elements and the like (including the number of pieces, numerical value, quantity, and range), except for the case where it is clearly mentioned, the case where the invention is principally clearly limited to a specific value, and the like, the invention is not limited to the specific value. The number may be larger or smaller than the specific value.

Further, in the following embodiments, obviously, components (including element steps) are not always necessary except for the case where it is clearly mentioned, the case where it is considered that a component is principally clearly necessary, and the like. Similarly, in the following embodiments, when shape, position relation, and the like of components are mentioned, they substantially include shape and the like close or similar to them except for the case where it is clearly mentioned, the case where it is considered that the shape and the like are not principally clearly similar. This is similarly applied also to the number (including the number of pieces, numerical value, quantity, and range).

Hereinafter, embodiments will be described in detail with reference to the drawings. In all of the drawings for explaining the embodiments, the same or related reference numerals are designated to members having the same function and repetitive description will not be given. When a plurality of similar members (parts) exist, in some cases, a sign is added to a generic reference numeral to indicate an individual or specific part. In the following embodiments, unless otherwise necessary, description of the same or similar parts will not be repeated.

In the drawings used in the embodiments, in some cases, hatching is omitted even in a cross section so that the drawing is easily seen. There are also cases that hatching is added even in a plan view so that the drawing is easily seen.

In the cross sections and plan views, the sizes of parts do not correspond to those of actual devices. For easier understanding of the drawings, in some cases, a specific part is displayed relatively large. Also in the case where a cross section and a plan view correspond to each other, for easier understand of the drawings, in some cases, a specific part is displayed relatively large.

First Embodiment

Hereinbelow, the structure of a semiconductor device (semiconductor storage device) of a first embodiment will be described with reference to the drawings.

Description of Structure

Figure 2:
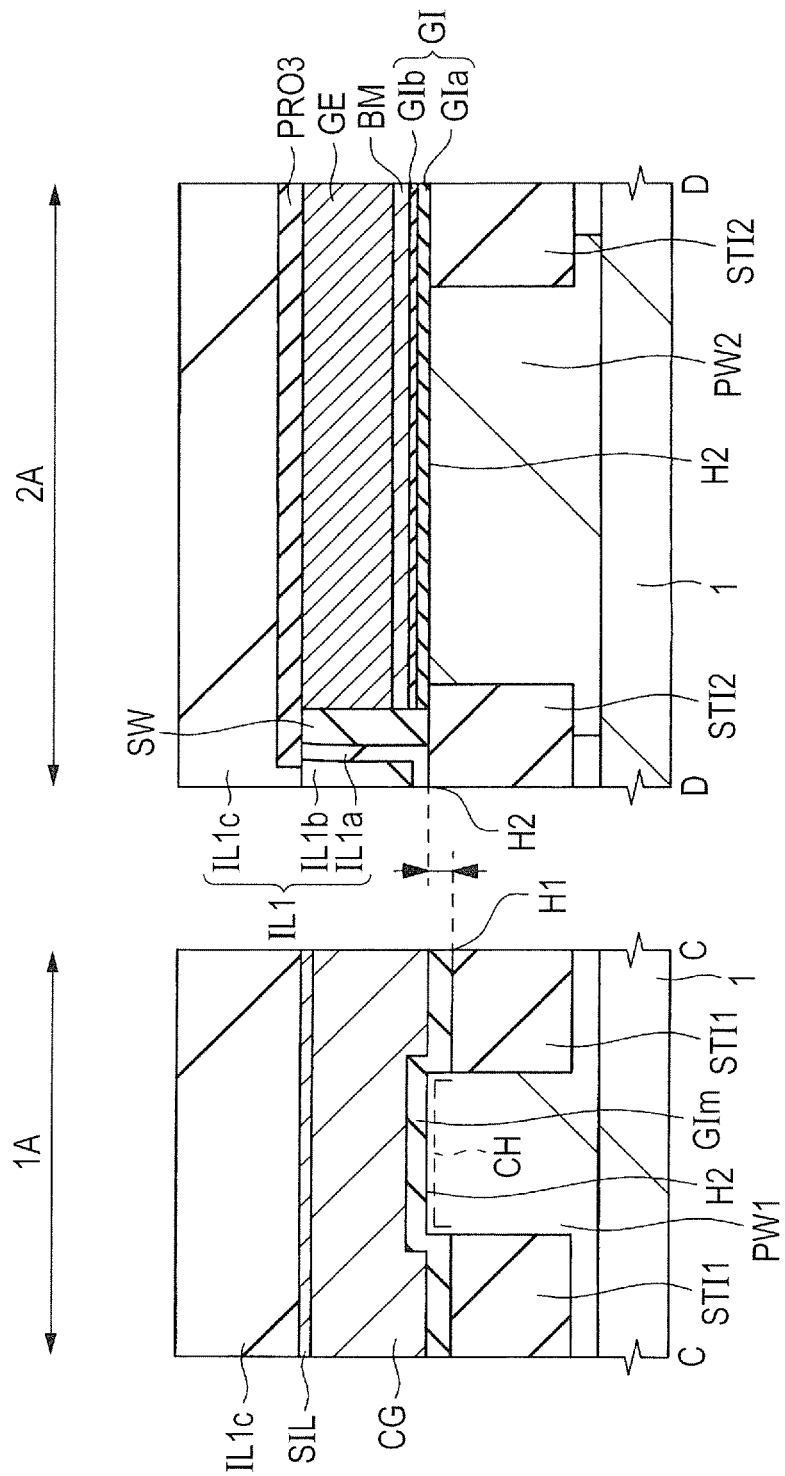
FIG. 2 is a cross section illustrating the configuration of the semiconductor device of the first embodiment.
Figure 3:
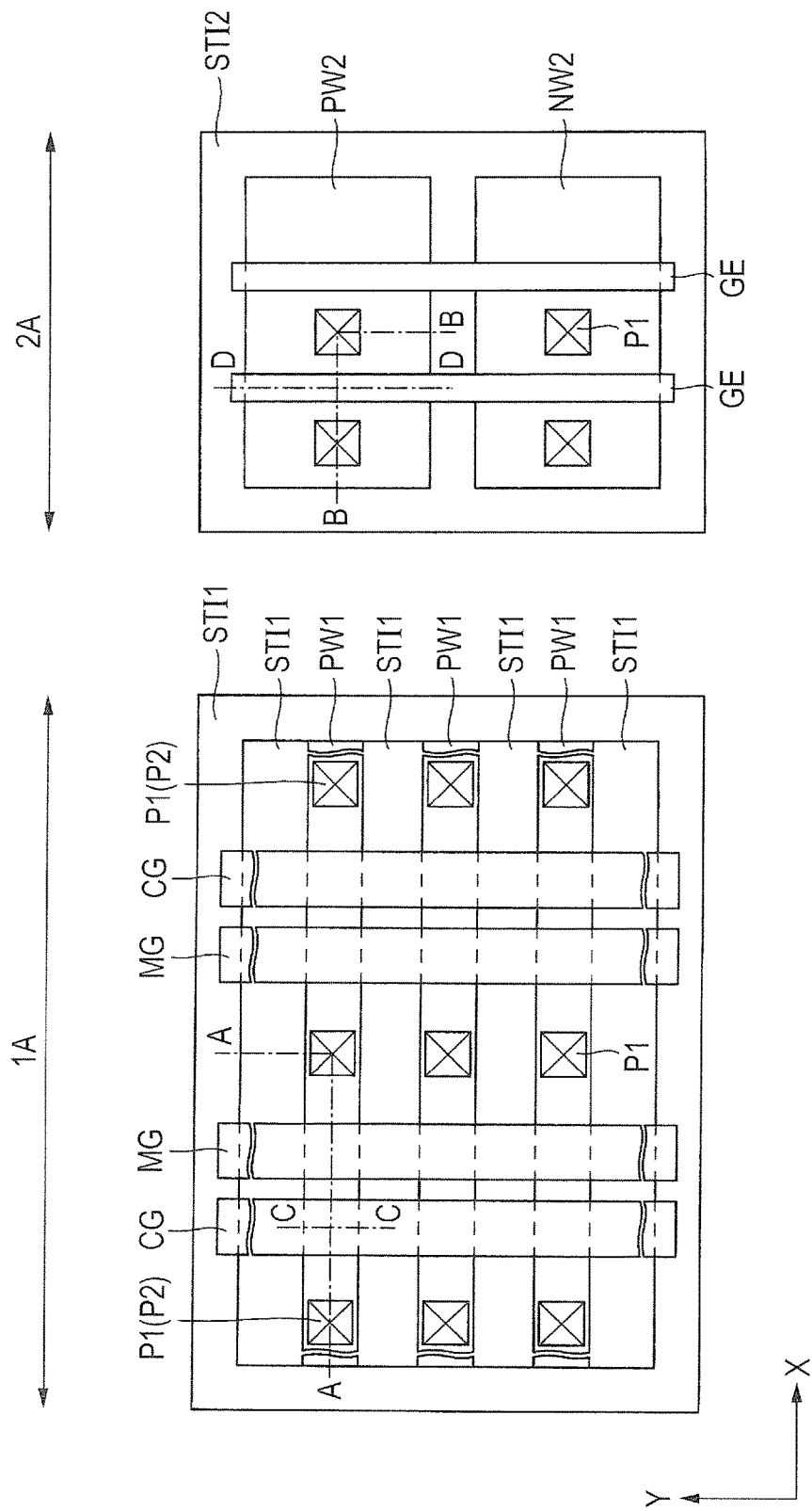
FIG. 3 is a plan view illustrating the configuration of the semiconductor device of the first embodiment.
Figure 4:
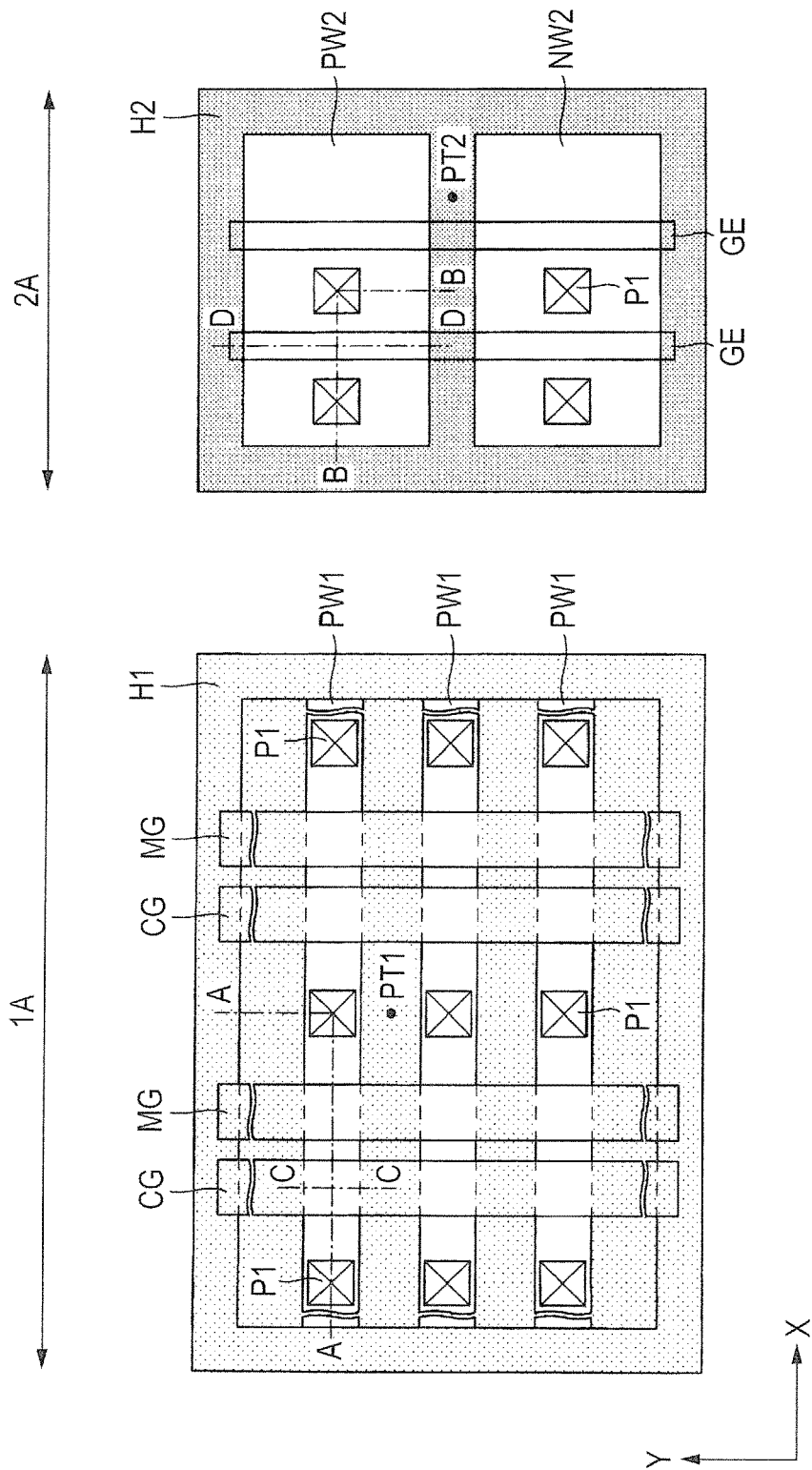
FIG. 4 is a plan view illustrating the configuration of the semiconductor device of the first embodiment.
Figure 5:
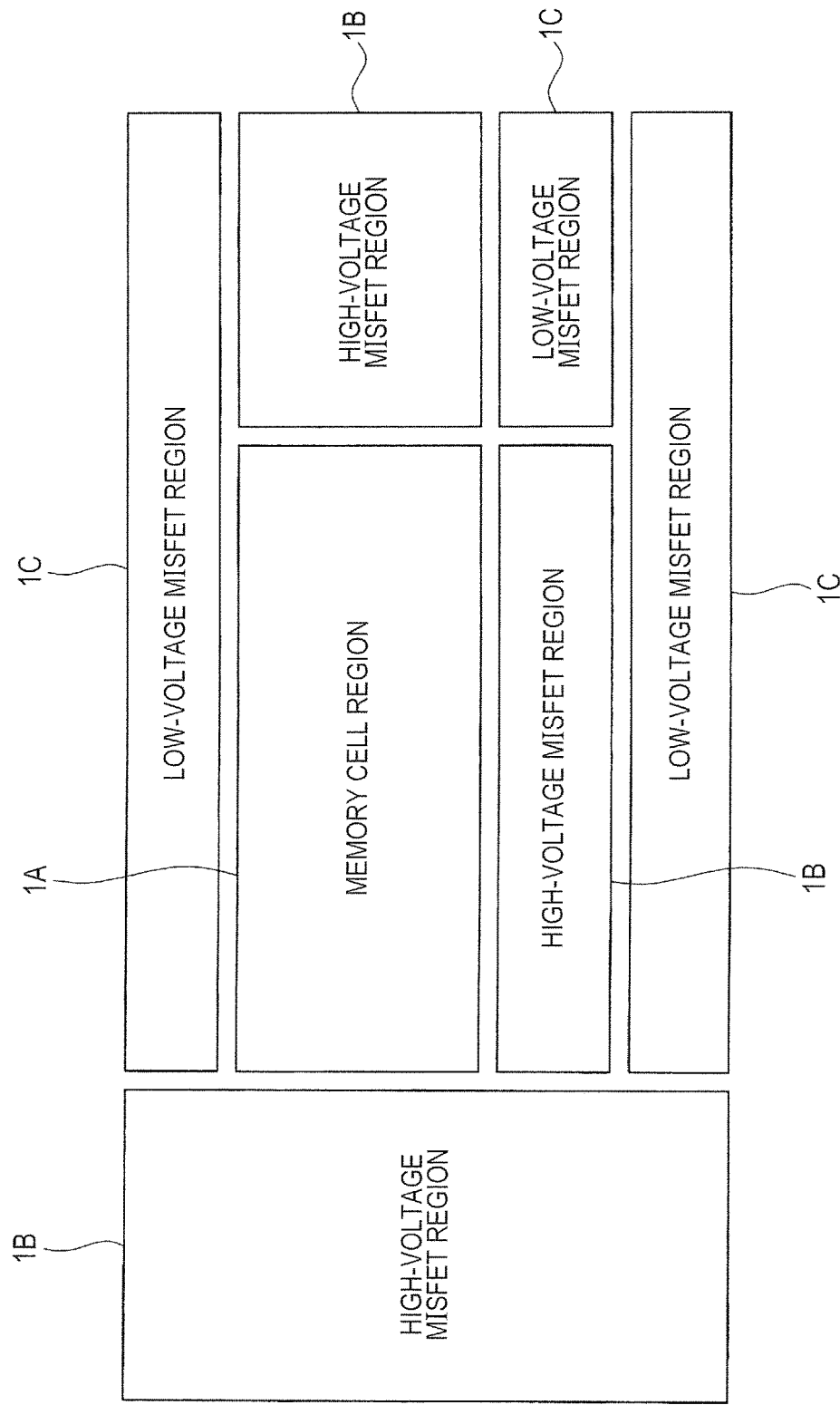
FIG. 5 is a plan view illustrating a layout configuration example of the semiconductor device of the first embodiment.
Figure 6:
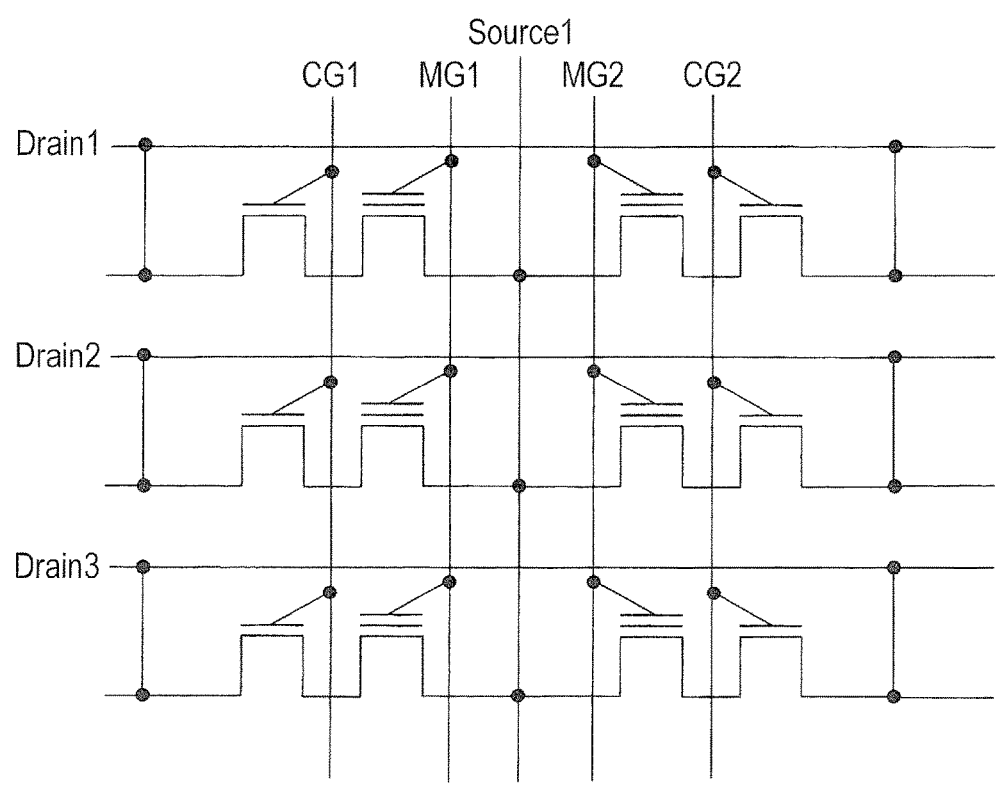
FIG. 6 is a circuit diagram illustrating a memory array in the semiconductor device of the first embodiment.

FIGS. 1 and 2 are cross sections illustrating the configuration of the semiconductor device of the embodiment. FIGS. 3 and 4 are plan views illustrating the configuration of the semiconductor device of the embodiment. FIG. 5 is a plan view illustrating a layout configuration example of the semiconductor device of the embodiment. FIG. 6 is a circuit diagram illustrating a memory array in the semiconductor device of the embodiment.

As illustrated in FIG. 1, the semiconductor device of the embodiment has, as regions as a part of a semiconductor substrate 1, a memory cell region 1A and a peripheral circuit region 2A. The semiconductor substrate 1 is, for example, a semiconductor wafer made of p-type single-crystal silicon or the like having resistivity of about 1 to 10 Ωcm. In the memory cell region 1A, a memory cell as a nonvolatile memory (also called a nonvolatile memory cell, a nonvolatile storage element, a nonvolatile semiconductor storage device, an EEPROM, or a flash memory) is formed. In the peripheral circuit region 2A, a low-voltage MISFET, in other words, a low-withstand-voltage MISFET is formed.

Although only a low-voltage MISFET is drawn in FIG. 1, in the peripheral circuit region 2A, a high-voltage MISFET region and a low-voltage MISFET region may be provided (refer to FIG. 5). A high-withstand-voltage MISFET is formed in the high-voltage MISFET region, and a low-withstand-voltage MISFET is formed in the low-voltage MISFET region.

The memory cell region 1A and the low-voltage MISFET region in the peripheral circuit region 2A may be adjacent to each other or may not be adjacent to each other. The memory cell region 1A and the high-voltage MISFET in the peripheral circuit region 2A may be adjacent to each other or may not be adjacent to each other. The high-voltage MISFET region and the low-voltage MISFET region may be adjacent to each other or may not be adjacent to each other (refer to FIG. 5). For easier understanding, in the cross section of FIG. 1, the peripheral circuit region 2A is illustrated next to the memory cell region 1A.

In the embodiment, the peripheral circuit is a circuit other than a nonvolatile memory and is, for example, a processor such as a CPU (Central Processing Unit), a control circuit, a sense amplifier, a column decoder, a row decoder, an input/output circuit, or the like. The MISFET formed in the peripheral circuit region 2A is a MISFET for the peripheral circuit.

Although only the low-withstand-voltage MISFET is drawn in FIG. 1, since the configuration of the high-withstand-voltage MISFET is similar to that of the low-withstand-voltage MISFET, the following description will be made simply as a MISFET. A MISFET of low withstand voltage is formed in the low-voltage MISFET region. In some cases, the configuration of the high-withstand-voltage MISFET is different from that of the low-withstand-voltage MISFET with respect to the following point. For example, the gate length of the low-withstand-voltage MISFET is smaller than that of the high-withstand-voltage MISFET (for example, about 30 to 50 nm). Such a MISFET having relatively small gate length is used for, for example, a circuit (core circuit) for driving a memory cell MC. On the other hand, the gate length of the high-withstand-voltage MISFET is larger than that of the low-withstand-voltage MISFET. Such a MISFET of a relatively large gate length is used for, for example, an input/output circuit or the like.

Configuration of Memory Cell

In the memory cell region 1A, the semiconductor device has an active region. The active region is surrounded by an element isolation region STI1. In the active region, a p-type well PW1 is formed. The p-type well has a conductivity type of the p type.

In the p-type well PW1 in the memory cell region 1A, a memory cell made by a memory transistor and a control transistor is formed. In the memory cell region 1A, actually, a plurality of memory cells are formed in an array (refer to FIG. 3). The left part of FIG. 1 is a section of one of the memory cells. The left part of FIG. 1 corresponds to, for example, the section taken along line A-A in FIG. 3.

The memory cell is a memory cell of a split gate type. Specifically, as illustrated in FIG. 1, the memory cell has a control transistor having a control gate electrode (control gate electrode part) CG and a memory transistor coupled to the control transistor and having a memory gate electrode (memory gate electrode part) MG.

The memory cell has a semiconductor region MS (source side) of the n type, a semiconductor region MD (drain side) of the n type, the control gate electrode CG, and the memory gate electrode MG. The semiconductor region MS of the n type and the semiconductor region MD of the n type have the n-type conduction type as the conduction type opposite to the p-type conduction type. The memory cell also has a CG gate insulating film GIm formed between the control gate electrode CG and the p-type well PW1 and a trap insulating film ONO formed between the memory gate electrode MG and the p-type well PW1 and between the memory gate electrode MG and the control gate electrode CG. That is, the memory cell is formed by the CG gate insulating film GIm, the control gate electrode CG, the trap insulating film ONO, and the memory gate electrode MG.

The control gate electrode CG and the memory gate electrode MG extend along the main face of the semiconductor substrate 1 in a state where the trap insulating film ONO is provided between their side faces opposed to each other, that is, the side walls, and are arranged side by side. The extension direction of the control gate electrode CG and the memory gate electrode MG is a direction perpendicular to the sheet of FIG. 1 (refer to FIG. 3). The control gate electrode CG is formed over the p-type well PW1 in the part positioned between the semiconductor regions MD and MS via the CG gate insulating film GIm. The memory gate electrode MG is formed over the p-type well PW1 in the part positioned between the semiconductor regions MD and MS via the trap insulating film ONO. The memory gate electrode MG is arranged on the semiconductor region MS side, and the control gate electrode CG is arranged on the semiconductor region MD side. The control gate electrode CG and the memory gate electrode MG are gate electrodes forming a memory cell, that is, a nonvolatile memory.

The control gate electrode CG and the memory gate electrode MG are adjacent to each other via the trap insulating film ONO. The memory gate electrode MG is formed over the side face, that is, the side wall of the control gate electrode CG via the trap insulating film ONO in a side-wall spacer state. The trap insulating film ONO extends in both the region between the memory gate electrode MG and the p-type well PW1 and the region between the memory gate electrode MG and the control gate electrode CG.

The CG gate insulating film GIm formed between the control gate electrode CG and the p-type well PW1 functions as the gate insulating film of the control transistor. The trap insulating film ONO formed between the memory gate electrode MG and the p-type well PW1 functions as the gate insulating film of the memory transistor.

The CG gate insulating film GIm includes an insulating film formed over the semiconductor substrate 1. The insulating film is a silicon oxide film, a silicon nitride film, or a silicon oxynitride film, or a high-dielectric-constant film which is a so-called high-k film having relative permittivity higher than that of the silicon nitride film. In the specification, the high-k film or high-dielectric-constant film denotes a film having relative permittivity higher than the relative permittivity (for example, about 7.0 to 8.0) of silicon nitride, for example, 8.0. On the other hand, in the specification, there is a case that a film having relative permittivity equal to or lower than that of silicon nitride, for example, 8.0 or less is called a low-dielectric-constant film. As the material of the high-dielectric-constant film, for example, a metal oxide such as hafnium oxide ($HfO_2$), zirconium oxide ($ZrO_2$), aluminum oxide ($Al_2O_3$), tantalum oxide ($Ta_2O_5$) or lanthanum oxide ($La_2O_3$) can be used.

The trap insulating film ONO includes a silicon oxide film 18a, a silicon nitride film 18b as a charge accumulation part over the silicon oxide film, and a silicon oxide film 18c over the silicon nitride film. In some cases, such a layer-stack film is called an ONO (Oxide Nitride Oxide) film. As described above, the trap insulating film ONO between the memory gate electrode MG and the p-type well PW1 functions as a gate insulating film of the memory transistor. On the other hand, the trap insulating film ONO between the memory gate electrode MG and the control gate electrode CG functions as an insulating film for insulating, that is, electrically isolating the memory gate electrode MG and the control gate electrode CG.

The silicon nitride film 18b in the trap insulating film ONO is an insulating film for accumulating charges and functions as a charge accumulation unit. That is, the silicon nitride film 18b is a trap insulating film having trap level, which is formed in the trap insulating film ONO. Consequently, the trap insulating film ONO can be regarded as an insulating film having therein a charge accumulation part.

As the trap insulating film having trap level, in place of the silicon nitride film 18b, a high-dielectric-constant film having permittivity higher than that of a silicon nitride film such as an aluminum oxide (alumina) film, a hafnium oxide film, or a tantalum oxide film can be used.

The silicon oxide films 18a and 18c positioned above and below the silicon nitride film 18b can function as charge block layers confining charges. By employing the structure in which the silicon nitride film 18b is sandwiched by the silicon oxide films 18a and 18c, charges can be accumulated in the silicon nitride film 18b.

The control gate electrode CG includes a conduction film formed over the CG gate insulating film GIm. A conductive film containing silicon can be used as a conductive film. For example, an n-type polysilicon film containing a polycrystalline silicon film in which n-type impurity is introduced or the like can be used.

The memory gate electrode MG can use a conductive film containing silicon and, for example, an n-type polysilicon film containing polycrystalline silicon in which n-type impurity is introduced or the like can be used. The memory gate electrode MG is formed by performing anisotropic etching, that is, etching back the conductive film formed over the semiconductor substrate 1 so as to cover the control gate electrode CG to leave the conductive film containing silicon over the side wall of the control gate electrode CG via the trap insulating film ONO. Consequently, the memory gate electrode MG is formed in a side-wall spacer state over the side wall of the control gate electrode CG adjacent to the memory gate electrode MG via the trap insulating film ONO.

The semiconductor region MS is a semiconductor region functioning as either a source region or a drain region, and the semiconductor region MD is a semiconductor region functioning the other one of the source region and the drain region. In this embodiment, the semiconductor region MS is, for example, the semiconductor region functioning as the source region, and the semiconductor region MD is, for example, the semiconductor region functioning as the drain region. Each of the semiconductor regions MS and MD is a semiconductor region in which n-type impurity is introduced and has an LDD (Lightly Doped Drain) structure.

The semiconductor region MS for source has an $n^-$ type semiconductor region 21a, and an $n^+$ type semiconductor region 22a having impurity concentration higher than that of the $n^-$ type semiconductor region 21a. The semiconductor region MD for drain has an $n^-$ type semiconductor region 21b, and an $n^+$ type semiconductor region 22b having impurity concentration higher than that of the $n^-$ type semiconductor region 21b. The $n^+$ type semiconductor region 22a has deeper junction depth and higher impurity concentration as compared with the $n^-$ type semiconductor region 21a. The $n^+$ type semiconductor region 22b has deeper junction depth and higher impurity concentration as compared with the $n^-$ type semiconductor region 21b. Although not illustrated, to suppress the short channel effect, a p-type pocket region or a halo region may be formed so as to surround the n– type semiconductor region (21a, 21b).

Over sidewalls on the sides the memory gate electrode MG and the control gate electrode CG are not adjacent to each other, a sidewall spacer SW made by an insulating film which is a silicon oxide film, a silicon nitride film, or a stack layer of the silicon oxide film and the silicon nitride film is formed. Specifically, the sidewall spacer SW is formed over the sidewall or side face of the memory gate MG on the side opposite to the side adjacent to the control gate electrode CG via the trap insulating film ONO, and the sidewall or side face of the control gate electrode CG on the side opposite to the side adjacent to the memory gate electrode MG via the trap insulating film ONO.

A not-illustrated sidewall insulating film may be interposed between the memory gate electrode MG and the sidewall spacer SW and between the control gate electrode CG and the sidewall spacer SW.

The $n^-$ type semiconductor region 21a on the source side is formed in a self-aligned manner to the side face of the memory gate electrode MG, and the $n^+$ type semiconductor region 22a on the source side is formed in a self-aligned manner to the side face of the sidewall spacer SW. Consequently, the $n^-$ type semiconductor region 21a on the source side is formed in a self-aligned manner to the side face of the memory gate electrode MG, and the $n^+$ type semiconductor region 22a on the high-concentration source side is formed on the outside of the $n^-$ type semiconductor region 21a on the low-concentration source side. Therefore, the $n^-$ type semiconductor region 21a on the low-concentration source side is formed so as to be adjacent to the p-type well PW1 as the channel region of the memory transistor. The $n^+$ type semiconductor region 22a on the high-concentration source side is formed so as to be in contact with the $n^-$ type semiconductor region 21a on the low-concentration source side and to be apart from the p-type well PW1 as the channel region in the memory transistor only by the amount of the $n^-$ type semiconductor region 21a on the source side.

The $n^-$ type semiconductor region 21b on the drain side is formed in a self-aligned manner to the side face of the control gate electrode CG, and $n^+$ type semiconductor region 22b on the drain side is formed in a self-aligned manner to the side face of the sidewall spacer SW. Consequently, the n⁻ type semiconductor region 21b on the low-concentration drain side is formed below the sidewall spacer SW over the side wall of the control gate electrode CG, and the n⁺ type semiconductor region 22b on the high-concentration drain side is formed on the outside of the n⁻ type semiconductor region 21b on the low-concentration drain side. Therefore, the n⁻ type semiconductor region 21a of low concentration is formed so as to be adjacent to the p-type well PW1 as the channel region in the control transistor. The n⁺ type semiconductor region 22b on the high-concentration drain side is formed so as to be in contact with the n⁻ type semiconductor region 21b on the low-concentration drain side and to be apart from the p-type well PW1 as the channel region in the control transistor only by the amount of the n⁻ type semiconductor region 21b on the drain side.

The channel region in the memory transistor is formed below the trap insulating film ONO below the memory gate electrode MG, and the channel region in the control transistor is formed below the gate insulating film GIm below the control gate electrode CG.

Over the top face of the n⁺ type semiconductor region (22a, 22b), a metal silicide layer SIL is formed by the salicide (Self Aligned Silicide) technique or the like. The metal silicide layer SIL is made by, for example, a cobalt silicide layer, a nickel silicide layer, or a platinum-added nickel silicide layer. By the metal silicide layer SIL, the contact resistance of the n⁺ type semiconductor region 22a or the n⁻ type semiconductor region 22b can be lowered.

Over the control gate electrode CG or the top face of the memory gate electrode MG, the metal silicide layer SIL is formed by the salicide technique or the like. Like the metal silicide layer SIL over the n⁺ type semiconductor region (22a, 22b), the metal silicide layer SIL is made by, for example, a cobalt silicide layer, a nickel silicide layer, or a platinum-added nickel silicide layer. By the metal silicide layer SIL, the contact resistance of the control gate electrode CG or the memory gate electrode MG can be lowered.

Although not illustrated, as described above, the memory cell may have a pocket region or a halo region. The conduction type of the pocket region or the halo region is opposite to that of the n⁻ type semiconductor region (21a, 21b) and the same as that of the p-type well PW1. The pocket region or the halo region is formed to suppress the short channel characteristic (punch through). The pocket region or the halo region is formed so as to wrap the n⁻ type semiconductor region (21a, 21b), and the p-type impurity concentration in the pocket region or the halo region is higher than that in the p-type well PW1.

Configuration of MISFET

Next, the configuration of an MISFET formed in the peripheral circuit region 2A will be concretely described using an MISFET of low withstand voltage.

In the low-voltage MISFET region in the peripheral circuit region 2A, the semiconductor device has an active region. The active region is surrounded by the element isolation region STI2. In the active region, a p-type well PW2 is formed. That is, the active region is the region in which the p-type well PW2 is formed. The p-type well PW2 has the conductivity type of p type. Alternatively, an n-type well NW2 may be formed. The n-type well NW2 has the conductivity type of n type, and the p-type channel MISFET is formed (refer to the right part of FIG. 4). Hereinbelow, a configuration example of an MISFET of an n-type channel will be described.

As illustrated in the right part of FIG. 1, in the p-type well PW2 in the low-voltage MISFET region in the peripheral circuit region 2A, the MISFET of low withstand voltage is formed. In the low-voltage MISFET region, actually, a plurality of MISFETs are formed. In the right part of FIG. 1, the section perpendicular to the gate width direction of one of the MISFETs is illustrated.

As illustrated in FIG. 1, the MISFET of low voltage has a semiconductor region SD made by an n⁻ type semiconductor region 21c and an n⁺ type semiconductor region 22c, a gate insulating film GI formed over the p-type well PW2, and a metal film BM and a gate electrode (gate electrode part) GE formed over the gate insulating film GI. That is, by the gate insulating film GI and the gate electrode GE, the MISFET of low voltage is formed. In some cases, the gate electrode GE includes the metal film BM. The metal film BM may be a metal compound film. The n⁻ type semiconductor region 21c and the n⁺ type semiconductor region 22c are formed in an upper layer part of the p-type well PW2 in the semiconductor substrate 1. The n⁻ type semiconductor region 21c and the n⁺ type semiconductor region 22c have the conductivity type of n type opposite to the conductivity type of p type.

The gate insulating film GI functions as a gate insulating film of the MISFET. The gate insulating film GI includes, in the low-voltage MISFET region, an insulating film GIa as a lower layer formed over the semiconductor substrate 1, specifically, over the p-type well PW2 and an insulating film GIb as an upper layer formed over the insulating film GIa. The insulating film GIa as the lower layer contains silicon oxide, silicon nitride, or silicon oxynitride. That is, the relative permittivity of the insulating film GIa as the lower layer is equal to or less than that of silicon nitride.

On the other hand, the insulating film GIb included in the gate insulating film GI is made by a high-dielectric-constant film containing a high-dielectric-constant material or so-called high-k material having relative permittivity higher than that of silicon nitride. That is, the relative permittivity of the insulating film as the upper layer is higher than that of silicon nitride. As the high-k material, for example, a metal oxide such as hafnium oxide, zirconium oxide, aluminum oxide, tantalum oxide or lanthanum oxide can be used.

The gate electrode GE (including the metal film BM) functions as the gate electrode of the MISFET. As the gate electrode GE includes a metal film which is in contact with the gate insulating film GI, it is a so-called metal gate.

As the metal film BM, a metal film containing a metal nitride such as titanium nitride, tantalum nitride, or tungsten nitride, a metal carbide such as titanium carbide, tantalum carbide, or tungsten carbide, tantalum carbonitride, tungsten, or the like can be used. From the viewpoint of increasing electric conductivity and the viewpoint of making the metal film function as an etching stopper at the time of eliminating a conductive film in a semiconductor device manufacture process, more preferably, a metal film made of titanium nitride can be used as the metal film. As a conductive film over the metal film BM, a metal film such as an aluminum (Al) film can be used.

The semiconductor region SD made by the n⁻ type semiconductor region 21c and the n⁺ type semiconductor region 22c is a semiconductor region for the source and drain in which n-type impurity is introduced and has, like the semiconductor regions MS and MD, the LDD structure. That is, the n⁺ type semiconductor region 22c has deeper junction depth and higher impurity concentration as compared with the n⁻ type semiconductor region 21c.

Over the sidewall of the gate electrode GE, the sidewall spacer SW made by an insulating film such as a silicon oxide film, a silicon nitride film, or a stack film of a silicon oxide film and a silicon nitride film is formed.

Over the n⁺ type semiconductor region 22c, like over the n⁺ type semiconductor region 22a and the n⁺ type semiconductor region 22b in the memory cell, the metal silicide layer SIL is formed by the salicide technique or the like. By the metal silicide layer SIL, the contact resistance of the n⁺ type semiconductor region 22c can be lowered.

Over the gate electrode GE, a metal silicide layer is not formed by the salicide technique or the like for the following reason. In the case of using a metal film such as an aluminum film as a conductive film, it is unnecessary to lower the contact resistance of the gate electrode by the metal silicide layer.

Although not illustrated, the MISFET of low voltage may have a pocket region or a halo region. The conductivity type of the pocket region or halo region is opposite to that of the n⁻ type semiconductor region 21c and the same as that of the p-type well PW2. The halo region is formed so as to wrap the n⁻ type semiconductor region 21c, and the impurity concentration of p type in the pocket region or halo region is higher than that in the p-type well PW2.

Configuration of Upper Part of Element

Next, the configuration over the memory cell formed in the memory cell region 1A and over the MISFET of low withstand voltage formed in the low-voltage MISFET region will be concretely described.

Over the semiconductor substrate 1, insulating films (IL1a and IL1b) burying the gaps in the memory cell and the MISFET of low withstand voltage are formed. The insulating films (IL1a, IL1b) are, for example, a silicon nitride film IL1a and a silicon oxide film IL1b over the silicon nitride film IL1a. The top face of each of the control gate electrode CG, the memory gate electrode MG, the gate electrode GE, the sidewall spacer SW, and the insulating films (IL1a, IL1b) is planarized.

An insulating film IL1c is formed over each of the control gate electrode CG, the memory gate electrode MG, the gate electrode GE, the sidewall spacer SW, and the insulating films (IL1a, IL1b). The insulating film IL1c is a single film of a silicon oxide film or a stack film of a silicon nitride film and a silicon oxide film. The top face of the insulating film IL1c is planarized. In the MISFET region of low voltage, a protection film PRO3 is formed between the gate electrode GE and the insulating film IL1b. The protection film PRO3 is, for example, a silicon oxide film. The insulating films IL1a, IL1b, and IL1c will be called in a lump an interlayer insulating film IL1. The protection film PRO3 may be included in the interlayer insulating film IL1.

A contact hole 1 is formed in the interlayer insulating film IL1, and a conductive plug P1 is buried as a conductor part in the contact hole C1.

The plug P1 is formed by the bottom of the contact hole C1, a thin barrier conductive film formed on the sidewall or side face, and a main conductive film formed over the barrier conductive film so as to bury the contact hole C1. In FIG. 1, the barrier conductive film and the main conductive film constructing the plug P1 are integrally illustrated for simplicity of the drawing. For example, the barrier conductive film as a component of the plug P1 is a titanium (Ti) film, a titanium nitride (TiN) film, or a stack film of a titanium film and a titanium nitride film, and the main conductive film as a component of the plug P1 is a tungsten (W) film.

The contact hole C1 and the plug P1 buried in it are formed over the n⁺ type semiconductor region (22a, 22b, 22c). In the bottom of the contact hole C1, for example, a part of the metal silicide layer SIL over the surface of each of the n⁺ type semiconductor regions (22a, 22b, and 22c) is exposed. The plug P1 is coupled to the exposed part. Although not illustrated, the contact hole C1 and the plug P1 buried in it may be formed over the control gate electrode CG, the memory gate electrode MG, and the gate electrode GE.

Over the interlayer insulating film IL1 in which the plug P1 is buried, a wire M1 in the first layer made of the main conductive material is formed. Although wires upper than the wire M1 in the first layer are also formed, they are not illustrated and described here. The wires upper than the wire M1 in the first layer can be formed by patterning a conductive film for wiring. For example, a tungsten (W) wire, an aluminum (Al) wire, or the like can be formed. The wire M1 in the first layer and upper wires may be, for example, buried wires whose main conductive material is copper (Cu).

Memory Operation

Next, an operation example of the memory cell formed in the memory cell region 1A will be described.

Injection of electrons to the silicon nitride film as the charge accumulation part in the trap insulating film of the memory transistor is defined as "writing" and injection to holes, that is, positive holes is defined as "erasure". Further, a power supply voltage Vdd is set to, for example, 1.5 V.

As a writing method, hot-electron writing called the source side injection (SSI) method can be used. In this case, a voltage Vd applied to the semiconductor region MD is set to, for example, about 0.8 V, a voltage Vcg applied to the control gate electrode CG is set to, for example, about 1 V, and a voltage Vmg applied to the memory gate electrode MG is set to, for example, about 12 V. A voltage Vs applied to the semiconductor region MS is set to, for example, about 6 V, and a voltage Vb applied to the p-type well PW1 is set to, for example, about 0 V. The above-described voltages are applied to the parts in the memory cell to which writing is performed to inject electrons into the silicon nitride film 18b in the trap insulating film ONO in the memory cell.

Hot electrons are generated mainly in the channel region in the part positioned below the memory gate electrode MG via the trap insulating film ONO and injected to the silicon nitride film 18b as the charge accumulation part in the trap insulating film ONO. The injected hot electrons are captured at the trap level in the silicon nitride film 18b in the trap insulating film ONO. As a result, a threshold voltage (Vth) of the memory transistor rises.

As an erasing method, a hot-hole injection erasing method using the band-to-band tunneling (BTBT) phenomenon can be used. Specifically, by injecting holes, that is, positive holes generated by the BTBT phenomenon to the charge accumulation part, that is, the silicon nitride film 18b in the trap insulating film ONO, erasure is performed. In this case, the voltage Vd is set to, for example, about 0 V, the voltage Vcg is set to, for example, about 0 V, the voltage Vmg is set to, for example, about −6 V, the voltage Vs is set to, for example, about 6 V, and the voltage Vb is set to, for example, about 0 V. By applying the voltages to the parts in the memory cell to which erasure is performed to generate holes by the BTBT phenomenon and accelerate electric field, the holes are injected into the silicon nitride film 18b in the gate insulating film (ONO) in the memory cell, thereby decreasing the threshold voltage of the memory transistor.

As the erasing method, another erasing method by hole injection using the Fowler-Nordheim (FN) tunneling phenomenon can be also used. Specifically, by injecting holes into the charge accumulation part, that is, the silicon nitride film 18b in the trap insulating film ONO by the FN tunneling phenomenon, erasure is performed. The voltage Vmg is set to, for example, about 12 V, and the voltage Vb is set to, for example, about 0 V. By the setting, holes are injected from the memory gate electrode MG side to the charge accumulation part, that is, the silicon nitride film 18b via the silicon oxide film by the FN tunneling phenomenon and cancel out the electrons in the silicon nitride film 18b, thereby performing erasure. Alternatively, when the holes injected in the silicon nitride film 18b are captured to the trap level in the silicon nitride film 18b, erasure is performed. Consequently, the threshold voltage of the memory transistor decreases, and an erasure state is set. In the case of using such an erasing method, consumption current can be reduced more than the case of using the erasing method by the BTBT phenomenon.

At the time of reading, the voltage Vd is set to, for example, about the power supply voltage Vdd, the voltage Vcg is set to, for example, about the power supply voltage Vdd, the voltage Vmg is set to, for example, about 0 V, the voltage Vs is set to, for example, about 0 V, and the voltage Vb is set to, for example, about 0 V. The voltages are applied to the parts in the memory cell from which data is read. By setting the voltage Vmg applied to the memory gate electrode MG at the time of reading to a value between the threshold voltage of the memory transistor in the writing state and the threshold voltage of the memory transistor in the erasing state, the writing state and the erasing state can be discriminated.

Plane Configuration of Memory Cell and MISFET

Next, the plane configuration of the memory cell (memory array) and the MISFET will be described with reference to FIG. 3. The left part in FIG. 3 illustrates an example of the plane configuration of the memory cell (memory array) and the right part in FIG. 3 illustrates an example of the plane configuration of the MISFET.

As illustrated in the left part of FIG. 3, in the memory cell region 1A, a plurality of p-type wells (active regions) PW1 are provided in lines extending in the X direction. A region between the neighboring p-type wells PW1 is an element isolation region STI1. The periphery of the region in which the plurality of p-type wells PW1 are arranged at predetermined intervals is the element isolation region STI1.

The control gate electrode CG and the memory gate electrode MG in the memory cell extend in the Y direction (the direction perpendicularly crossing the A-A cross section or drawing sheet vertical direction) so as to cross across the p-type well PW1. A source line (not illustrated) is arranged between the memory gate electrodes MG. The source line extends in the Y direction so as to cross across the p-type well PW1 above the p-type well PW1. The source regions (MS and the n$^+$ type semiconductor region 22a) and the source line are coupled via the plug (contact plug or connection part).

The control gate electrode CG and the memory gate electrode MG are arranged symmetrically with respect to the source line. The drain regions (MD and the n+ type semiconductor region 22b) in the p-type well PW1 and a drain line (not illustrated) are coupled via the plugs (contact plug and coupling part) P1, P2, and the like. Wires (M2) are arranged in the X direction so as to couple the plugs P2 over the drain regions MD arranged side by side in the X direction over the p-type wells PW1.

As illustrated in FIG. 6, the memory cells (memory transistors, control transistors) are arranged in an array state at crossing points of a source line Source1 and drain lines (Drain1, Drain2, Drain3).

As illustrated in the right part of FIG. 3, in the peripheral circuit region 2A, the p-type well (active region) PW2 has an almost rectangular shape having long sides in the X direction. In the peripheral circuit region 2A, along the p-type well (active region) PW2, the n-type well (active region) NW2 as an almost rectangular shape having long sides in the X direction is arranged. The p-type well PW2 and the n-type well NW2 are arranged side by side in the Y direction. Between the p-type well PW2 and the n-type well NW2, an element isolation region STI2 is provided.

The gate electrode GE extends in the Y direction above the p-type well PW2 and the n-type well NW2. The gate electrode GE is a gate electrode common to the MISFET of the n channel type provided over the p-type well PW2 and the MISFET of the p channel type provided over the n-type well NW2. The plug P1 is provided between the gate electrodes GE, and the wires (M1, M2) and the like are provided so as to properly couple the plugs P1.

Layout Configuration Example of Semiconductor Device

Next, a layout configuration example of the semiconductor device will be described. As illustrated in FIG. 5, the semiconductor device of the embodiment has the memory cell region 1A, a low-voltage MISFET region 1C, and a high-voltage MISFET region 1B. In the memory cell region 1A, the memory cell (nonvolatile memory) is formed.

In the embodiment, the surface height H1 of the element isolation region STI1 in the memory cell region 1A is lower than the surface height H2 of the element isolation region STI2 in the peripheral circuit region 2A (refer to FIG. 1).

In other words, in the memory cell region 1A, the surface height H1 of the element isolation region STI1 is receded from the surface height H2 of the semiconductor substrate 1. On the other hand, in the element isolation region STI2 in the peripheral circuit region 2A, the surface height H2 of the element isolation region STI2 is not receded from the surface height H2 of the semiconductor substrate 1 but is set to almost the same as that of the surface height H2.

As described above, by making the surface of the element isolation region STI1 in the memory cell region 1A receded and lowered, an effective channel width of both of the control transistor and the memory transistor can be increased. For example, as illustrated in the left part of FIG. 2, the top part of the p-type well PW1 becomes a convex shape below the control gate electrode CG and a channel CH is formed also on the sidewalls of the p-type well CH, so that the effective channel width can be increased. Similarly, also below the memory gate electrode MG, the top part of the p-type well PW1 becomes a convex shape, and the channel CH is formed also on the sidewalls of the p-type well PW1, so that the effective channel width can be increased.

Figure 7:
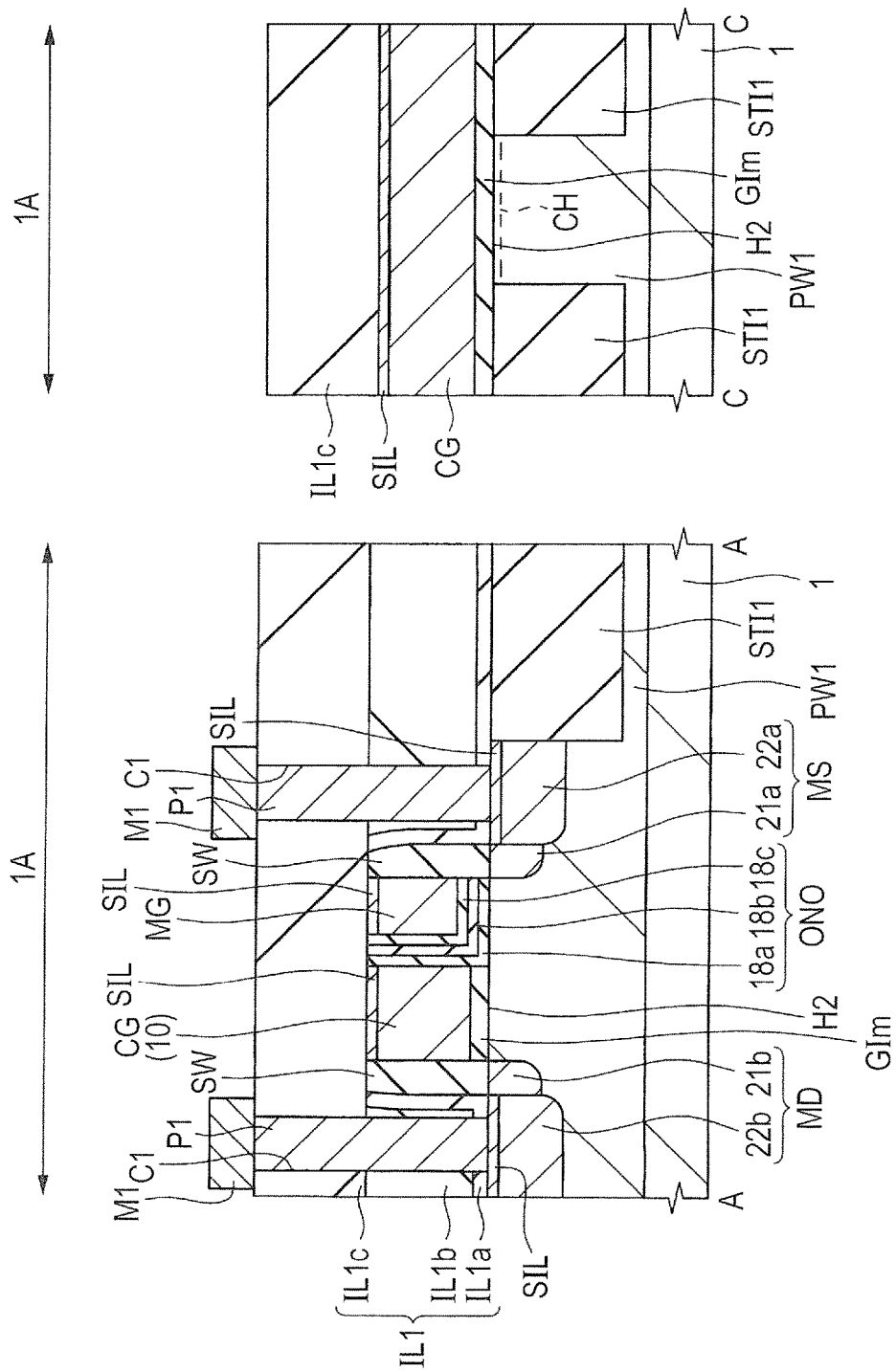
FIG. 7 is a cross section illustrating the configuration of a semiconductor device of a first comparison example.

For example, in the case that the surface of the element isolation region STI1 is not receded as illustrated in FIG. 7, the channel width is limited to the width of the element isolation region STI1 (the width of the exposed region of the p-type well PW1). FIG. 7 is a cross section illustrating the configuration of a semiconductor device of a first comparative example. A plan view in the case where the surface of the element isolation region STI1 is not receded is similar to that of FIG. 3. Therefore, the left part of FIG. 7 corresponds to the A-A section in FIG. 3, and the right part of FIG. 7 corresponds to the C-C section in FIG. 3. The difference between the effective channel widths is clear also from comparison between the left part of FIG. 2 and the right part of FIG. 7.

On the other hand, in the peripheral circuit region 2A, the surface height H2 of the element isolation region STI2 is not receded from the surface height H2 of the semiconductor substrate 1 but is set to almost the same, thereby maintaining a desired characteristic of the MISFET and enabling the manufacture process of the memory cell formed in the memory cell region 1A and that of the MISFET formed in the peripheral circuit region 2A to be matched. Concretely, in the case of forming an MISFET of a so-called high-k metal structure using a high-k film as the gate insulating film GI and using a metal film (metal gate) for the gate electrode GE as an MISFET, the gate electrode GE can be formed with high precision. In addition, the gate electrode GE can be formed easily.

In the case of forming an MISFET of a high-k metal structure, a dummy gate electrode (dummy gate electrode part) DGE is formed in advance and replaced with a metal film, thereby forming the gate electrode (metal gate) GE. In some cases, a process of forming the gate electrode (metal gate) GE in a final phase of the process is called a "gate last process".

In the case of performing such a gate last process, flatness of the peripheral circuit region 2A is important.

Figure 8:
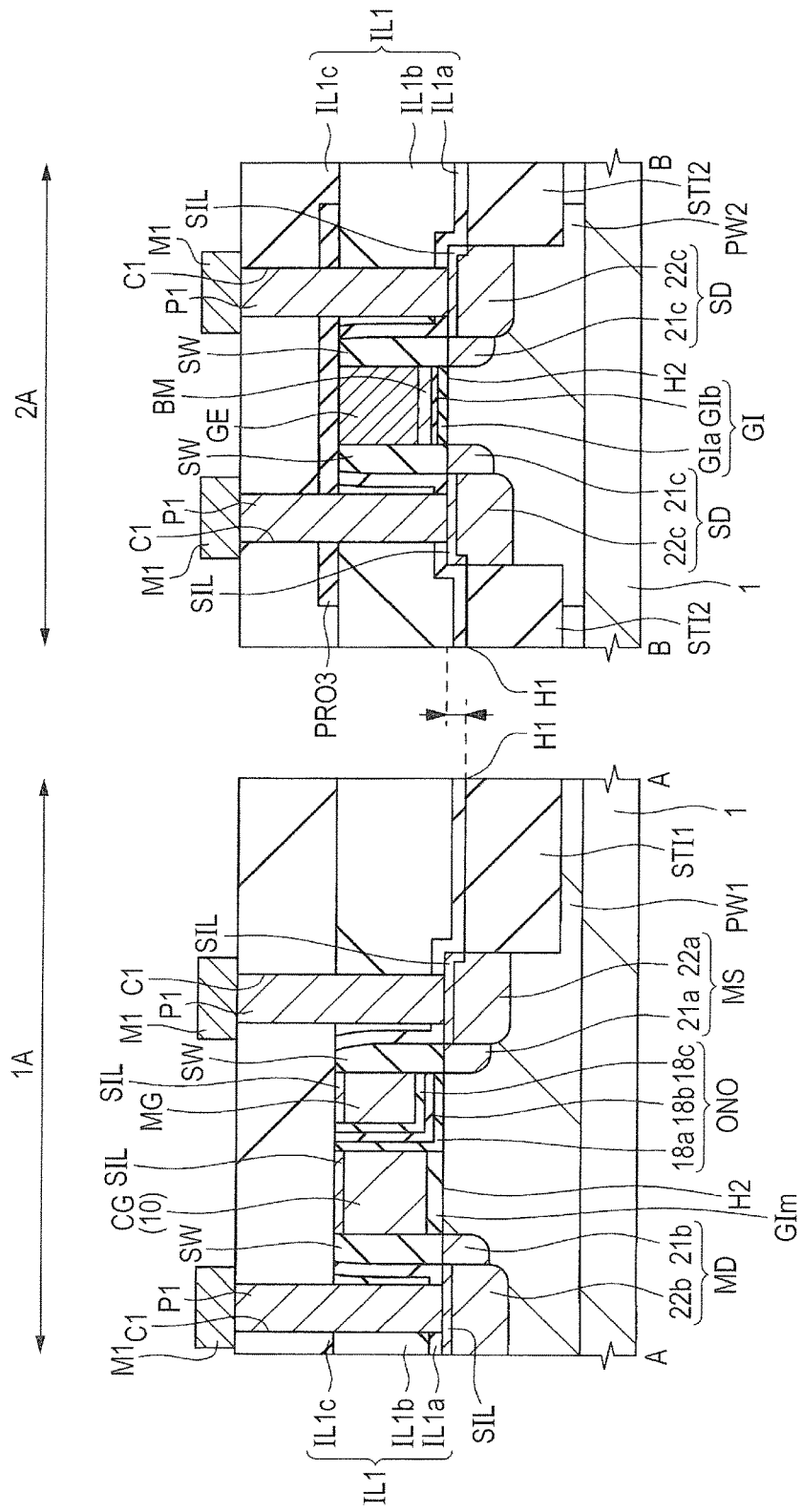
FIG. 8 is a cross section illustrating the configuration of a semiconductor device of a second comparison example.
Figure 9:
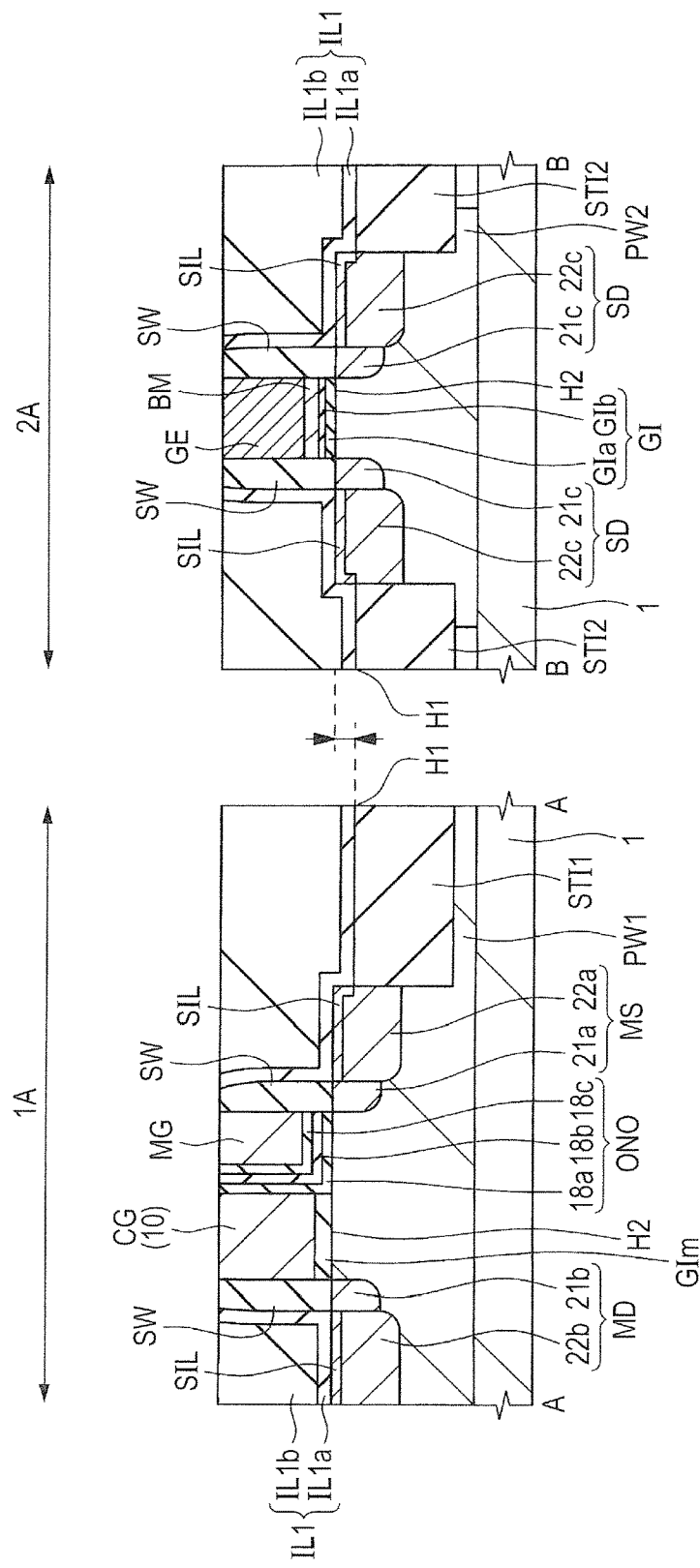
FIG. 9 is a cross section illustrating the configuration of the semiconductor device of the second comparison example.

For example, as illustrated in FIGS. 8 and 9, in the case where the surface of the element isolation region (STI1, STI2) is receded not only in the memory cell region 1A but also in the peripheral circuit region 2A, concave and convex parts corresponding to steps in the surface of the element isolation region STI2 are formed in the layers stacked in the peripheral circuit region 2A. FIGS. 8 and 9 are cross sections each illustrating the configuration of the semiconductor device of the second comparison example. The plan view in the case where the surfaces of both the element isolation regions STI1 and STI2 are receded is similar to that illustrated in FIG. 3. Therefore, the cross sections of FIGS. 8 and 9 correspond to the A-A section to the D-D section in FIG. 3.

The case of performing the gate last process in a state (refer to FIG. 10) where concave and convex parts corresponding to steps in the surface of the element isolation region STI2 in each of the layers stacked in the peripheral circuit region 2A will be described. FIGS. 10 to 13 are cross sections illustrating manufacture process of the semiconductor device of the second comparative example.

Figure 10:
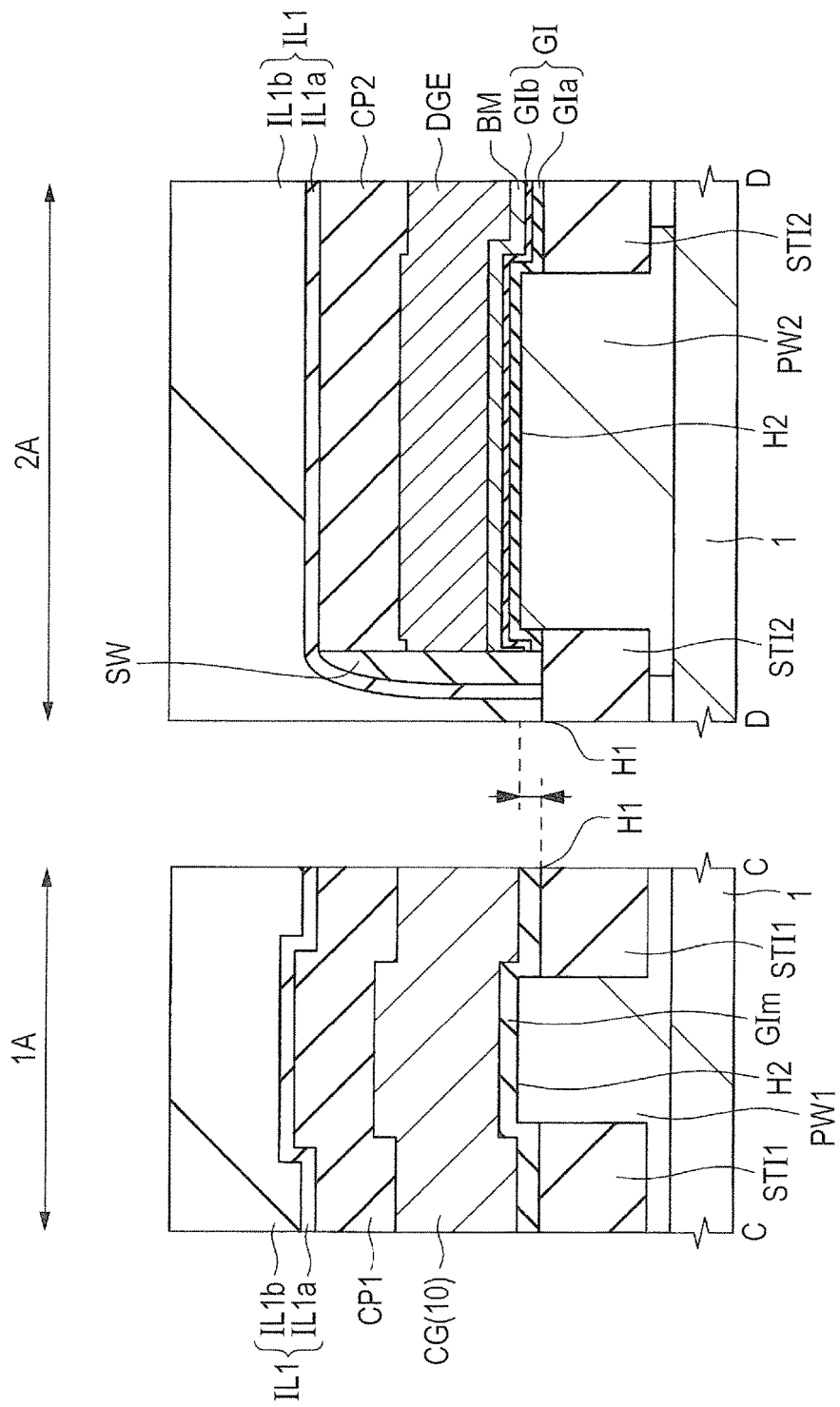
FIG. 10 is a cross section illustrating a process of manufacturing the semiconductor device of the second comparison example.

In the semiconductor device illustrated in FIG. 10, in the memory cell region 1A, the CG gate insulating film GIm, a polysilicon film 10 for the control gate electrode CG, a cap insulating film CP1, and the interlayer insulating film IL1 are stacked in order from the bottom. In the surface of the CG gate insulating film GIm, the polysilicon film for the control gate electrode CG, and the like, concave and convex parts corresponding to steps in the surface of the element isolation region STI1 are formed. In the peripheral circuit region 2A, the gate insulating film GI, the dummy gate electrode DGE, a cap insulating film CP2, and the interlayer insulating film IL1 are stacked in order from the bottom. In the surface of the gate insulating film GI, the dummy gate electrode DGE, and the like, concave and convex parts corresponding to the steps in the surface of the element isolation region STI2 are formed.

Figure 11:
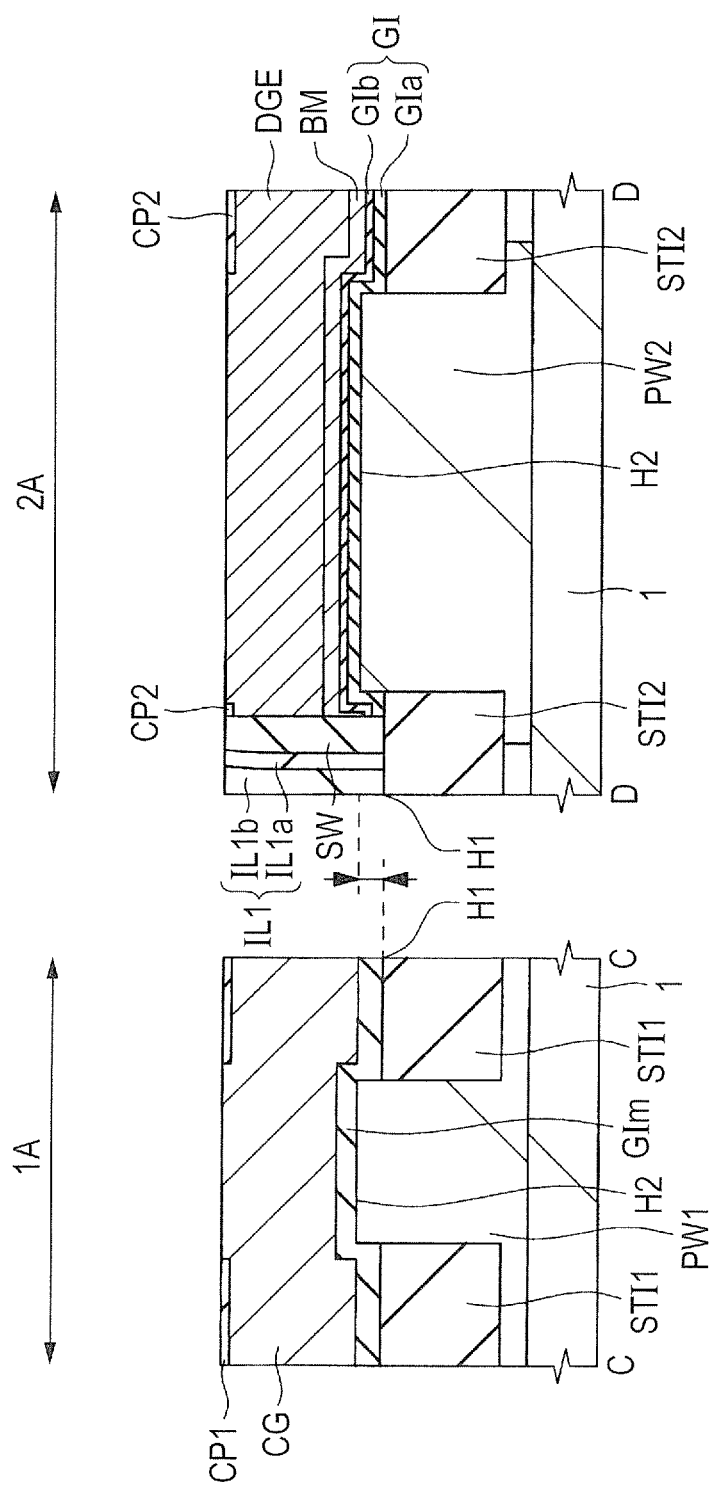
FIG. 11 is a cross section illustrating the process of manufacturing the semiconductor device of the second comparison example.
Figure 12:
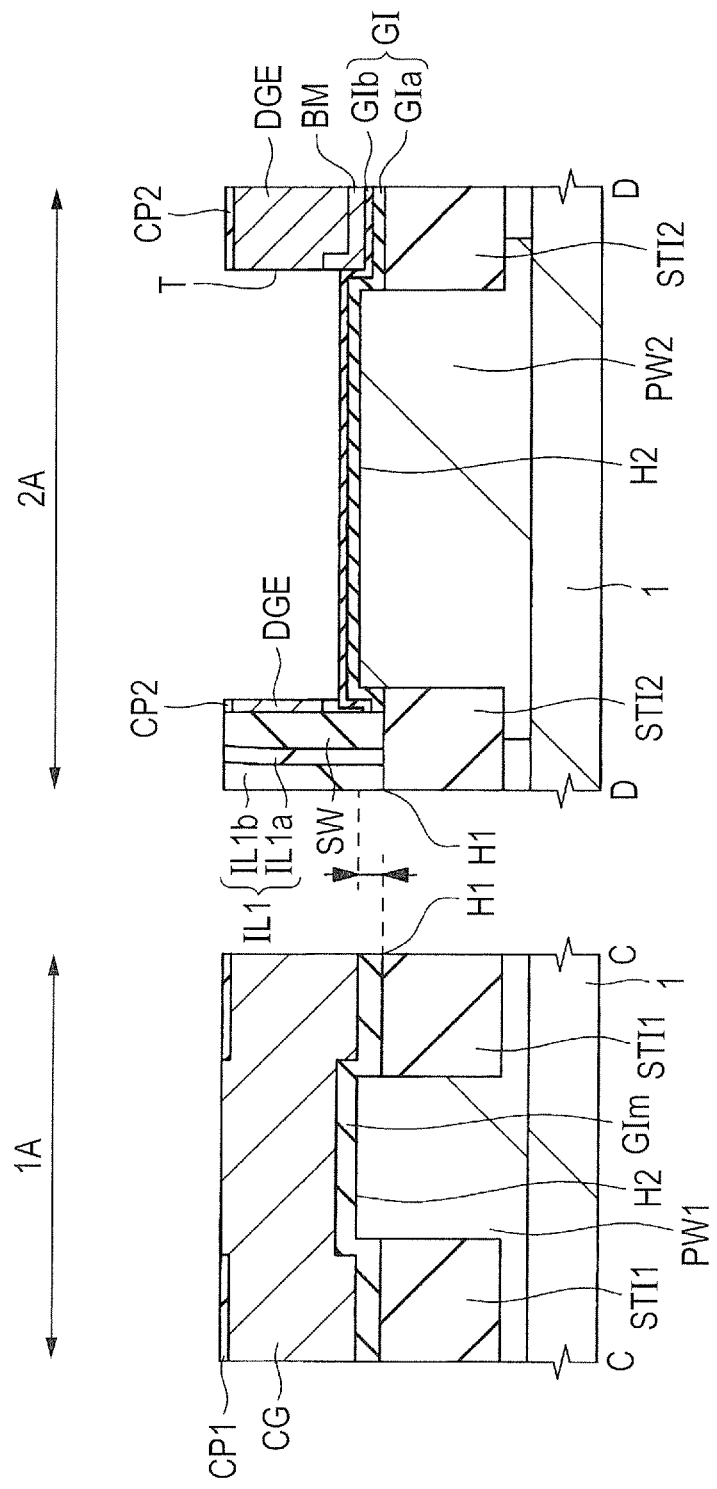
FIG. 12 is a cross section illustrating the process of manufacturing the semiconductor device of the second comparison example.
Figure 13:
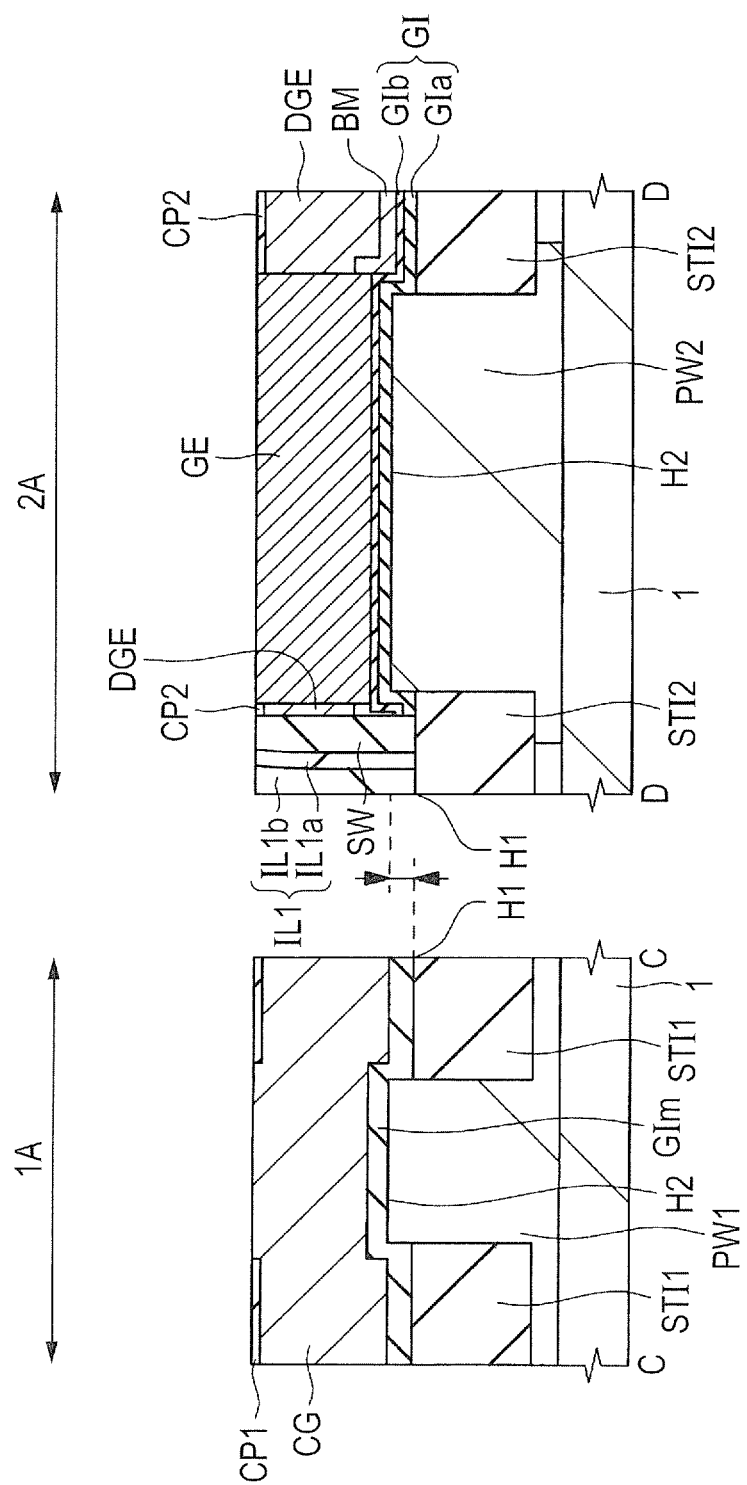
FIG. 13 is a cross section illustrating the process of manufacturing the semiconductor device of the second comparison example.

As illustrated in FIG. 11, the film in the upper layer of the dummy gate electrode DGE is removed by polishing by the CMP or the like to expose the surface of the dummy gate electrode DGE. Subsequently, as illustrated in FIG. 12, the exposed dummy gate electrode DGE is removed by etching to form a trench (opening) T. As illustrated in FIG. 13, by burying the trench T with a metal film, the gate electrode (metal gate) GE is formed.

However, as illustrated in FIG. 11, in the case where the surface of the dummy gate electrode DGE and the surface of the film above it (in this case, the cap insulating film CP2) have uneven parts corresponding to steps in the surface of the element isolation region STI2, the film to be removed by the CMP or the like (in this case, the cap insulating film CP2) remains and the dummy gate electrode DGE cannot be removed so that the dummy gate electrode DGE remains (refer to the right part of FIG. 12). As a result, the dummy gate electrode DGE is not replaced to the metal film and becomes faulty (refer to the right part of FIG. 13). In such a manner, by an undesired residual film over the dummy gate electrode DGE, a metal gate replacement error occurs.

To avoid such an inconvenience, by making the film thickness of the dummy gate electrode DGE which is formed in advance large and increasing the polish amount, the uneven parts corresponding to the steps in the surface of the element isolation region STI2 can be removed and, after that, the gate electrode (metal gate) GE can be formed. However, in this case, the number of processes increases.

To deal with it, in the embodiment, in the peripheral circuit region 2A, the surface height H2 of the element isolation region STI1 is not receded from the surface height H2 of the semiconductor substrate 1 and is set to the same degree. Consequently, the replacement error, the increase in the number of processes, and the like can be avoided.

On the other hand, also in the memory cell region 1A, there is the possibility that the cap insulating film CP1 remains over the control gate electrode CG (refer to FIG. 11). However, the cap insulating film CP1 is subject to two polishing processes of a process of polishing the film in the upper layer of the dummy gate electrode DGE (first polishing process) and a polishing process (second polishing process) performed at the time of burying the trench T with the metal film. Consequently, the possibility that the cap insulating film CP1 in the memory cell region 1A is removed by the following process and remains becomes low. As described above, the surface of the element isolation region STI1 in the memory cell region 1A has a margin to be receded to certain degree. The allowable recession amount is, as will be described later, for example, 10 nm to 20 nm.

As described in detail above, according to the embodiment, by increasing the effective channel width of both the control transistor and the memory transistor, the characteristic of the memory cell can be improved. Decrease of the yield due to the replacement error and deterioration of the characteristic of the MISFET can be avoided. In addition, the manufacture process of the memory cell formed in the memory cell region 1A and that of the MISFET formed in the peripheral circuit region 2A can be matched. More concretely, while maintaining or improving the characteristics of the devices formed in the memory cell region 1A and the peripheral circuit region 2A, the manufacture process can be simplified.

Height of Element Isolation Region

The region whose surface height H1 is relatively low in the memory cell region 1A is the gray (dot) part in the left part of FIG. 4 in plan view. The region whose surface height H2 is relatively high in the peripheral circuit region 2A is the gray part in the right part of FIG. 4.

In other words, in the left part (memory cell region 1A) of FIG. 4, the gray part whose surface height H1 is relatively low is lower than the p-type well PW1 (semiconductor substrate 1) whose surface height is H2. In the right part (peripheral circuit region 2A) of FIG. 4, the gray part whose surface height H2 is relatively high is almost the same height has the p-type well PW2 or n-type well NW2 (semiconductor substrate 1) whose surface height is H2.

With respect to the surface heights H1 and H2 of the memory cell region 1A and the peripheral circuit region 2A, the following points are references of measurement.

The surface height H1 of the element isolation region STI1 in the memory cell region 1A can be set to, for example, the height of the center in the p-type wells PW1 (for example, PT1 in FIG. 4). The surface height H2 of the p-type well PW1 in the memory cell region 1A can be set to the surface height of the p-type well PW1 (semiconductor substrate 1) below the memory gate electrode MG (trap insulating film ONO) (refer to FIG. 1).

The surface height H2 of the element isolation region STI2 in the peripheral circuit region 2A can be set to, for example, the height of the center between the p-type well PW2 and the n-type well NW2 (for example, PT2 in FIG. 4). The surface height H2 of the p-type well PW2 or n-type well NW2 (semiconductor substrate 1) in the peripheral circuit region 2A can be set to the surface height of the p-type well PW2 or n-type well NW2 (semiconductor substrate 1) below the gate electrode GE (refer to FIG. 1).

The difference between the surface height H1 of the element isolation region STI1 in the memory cell region 1A and the surface height H2 of the element isolation region STI2 in the peripheral circuit region 2A can be made correspond to the difference between the film thickness T1 of the element isolation region STI1 of the memory cell region 1A and the film thickness T2 of the element isolation region STI2 of the peripheral circuit region 2A. By checking the relation of "film thickness T2>film thickness Ti", "height H2>height H1" can be recognized (refer to FIG. 1). The film thickness T1 can be set to the thickness of the element isolation region STI1 in the center between the p-type wells PW1. The film thickness T2 can be set to the thickness of the element isolation region STI2 in the center between the p-type well PW2 and the n-type well NW2.

Each of the heights (H1, H2) and the film thicknesses (T1, T2) may be calculated as an average of values of two or more different points and they may be compared.

The difference between the heights H1 and H2 is between 10 nm and 20 nm. In other words, the difference between the film thicknesses T1 and T2 is between 10 nm and 20 nm. Although the gray part whose surface height H2 is relatively high in the right part (peripheral circuit region 2A) of FIG. 4 has height almost the same as the type well PW2 or n-type well NW2 (semiconductor substrate 1) whose surface height is H2, there may be a slight level difference in the heights. The level difference is less than 10 nm.

In short, the state that "the surface of the element isolation region STI1 is receded and set to H1 in the memory cell region 1A" can be described as follows.

a) The surface height (H1) of the element isolation region STI1 in the memory cell region 1A is lower than the surface height (H2) of the element isolation region STI2 in the peripheral circuit region 2A.

b) The surface height (H1) of the element isolation region STI1 in the memory cell region 1A is lower than the surface height (H2) of the p-type well PW1 (semiconductor substrate 1).

c) A first level difference between the surface height (H1) of the element isolation region STI1 and the surface height (H2) of the p-type well PW1 (semiconductor substrate 1) in the memory cell region 1A is larger than a second level difference between the surface height (H2) of the element isolation region STI2 and the surface height (H2) of the p-type well PW2 or the n-type well NW2 (semiconductor substrate 1) in the peripheral circuit region 2A. The first level difference is between 10 nm and 20 nm. The second level difference is less than 10 nm.

d) The film thickness (T1) of the element isolation region STI1 in the memory cell region 1A is smaller than the film thickness (T2) of the element isolation region STI2 in the peripheral circuit region 2A.

Description of Manufacturing Method

Next, a method of manufacturing the semiconductor device of the embodiment will be described with reference to FIGS. 14 to 59. FIGS. 14 to 59 are main part cross sections illustrating manufacturing processes of the semiconductor device of the embodiment.

Figure 14:
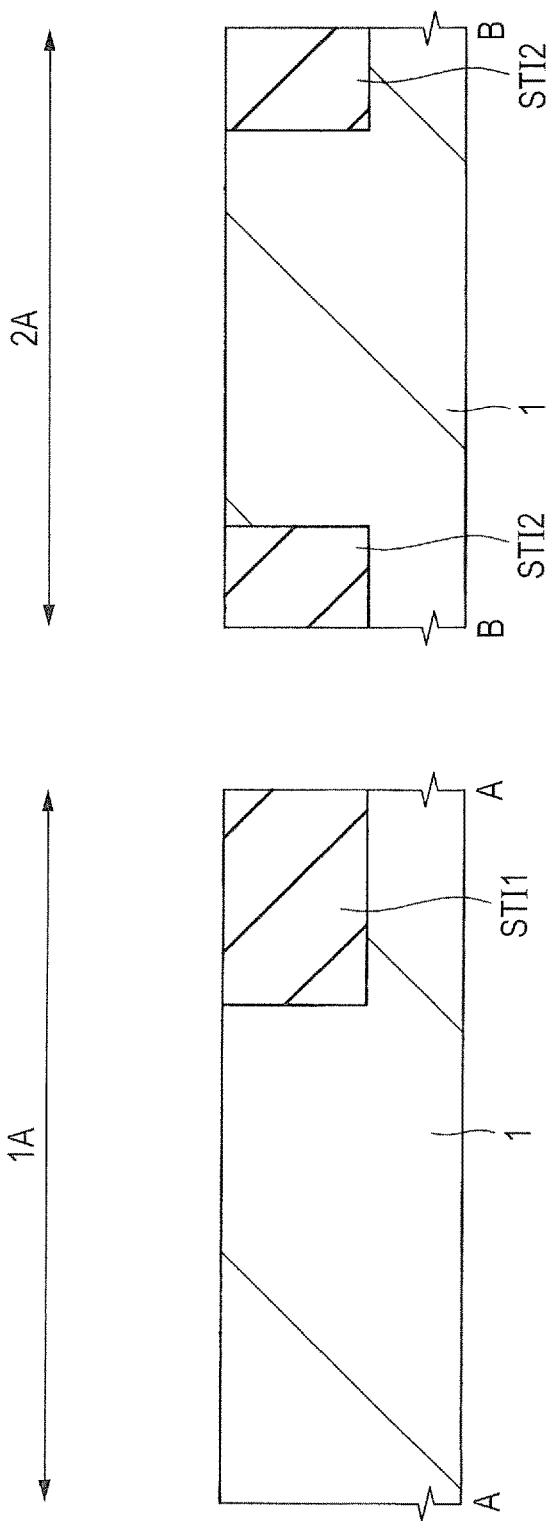
FIG. 14 is a cross section of a main part illustrating a process of manufacturing the semiconductor device of the first embodiment.
Figure 15:
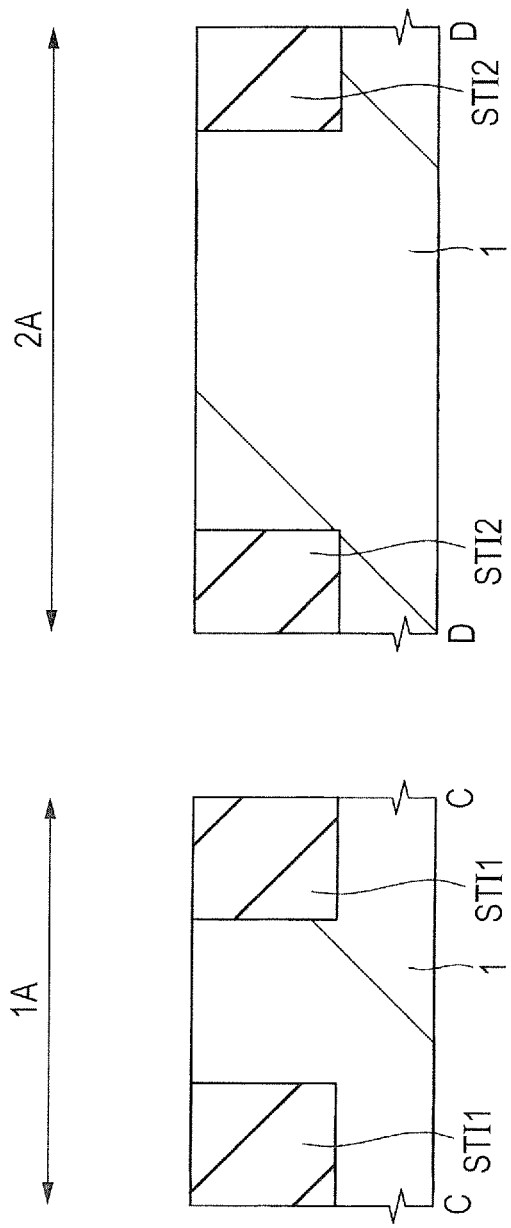
FIG. 15 is a cross section of the main part illustrating a process of manufacturing the semiconductor device of the first embodiment.

As illustrated in FIGS. 14 and 15, as the semiconductor substrate 1, for example, the semiconductor substrate 1 made of single-crystal silicon of the p type having specific resistance of about 1 to 10 Ωcm is prepared. Subsequently, a not-illustrated hard mask (for example, a stack film made of a silicon oxide film and a silicon nitride film over the silicon oxide film) is formed and the hard mask and the semiconductor substrate 1 are etched, thereby forming an element isolation trench. After that, a silicon oxide film is deposited over the hard mask including the inside of the element isolation trench by using the CVD method or the like, and the silicon oxide film on the outside of the element isolation trench is removed by using the CMP (Chemical Mechanical Polishing) or the like. In such a manner, the inside of the element isolation trench is buried with an insulating film such as a silicon oxide film to form the element isolation regions STI1 and STI2. Such an element isolation method is called an STI (Shallow Trench Isolation) method.

In the memory cell region 1A, the element isolation region STI defines an active region. The active region has a line shape having a predetermined width (length in the Y direction) (a rectangular shape having long sides in the X direction). A plurality of line-shaped active regions are arranged at predetermined intervals (pitches) in the Y direction (refer to PW1 in FIG. 3). In the peripheral circuit region 2A, the element isolation region STI2 defines an active region. The active region has an almost rectangular shape having long sides in the X direction (refer to PW2 in FIG. 3). In the peripheral circuit region 2A, the active region for the n-type well NW2 may be provided (refer to NW2 in FIG. 3).

Figure 16:
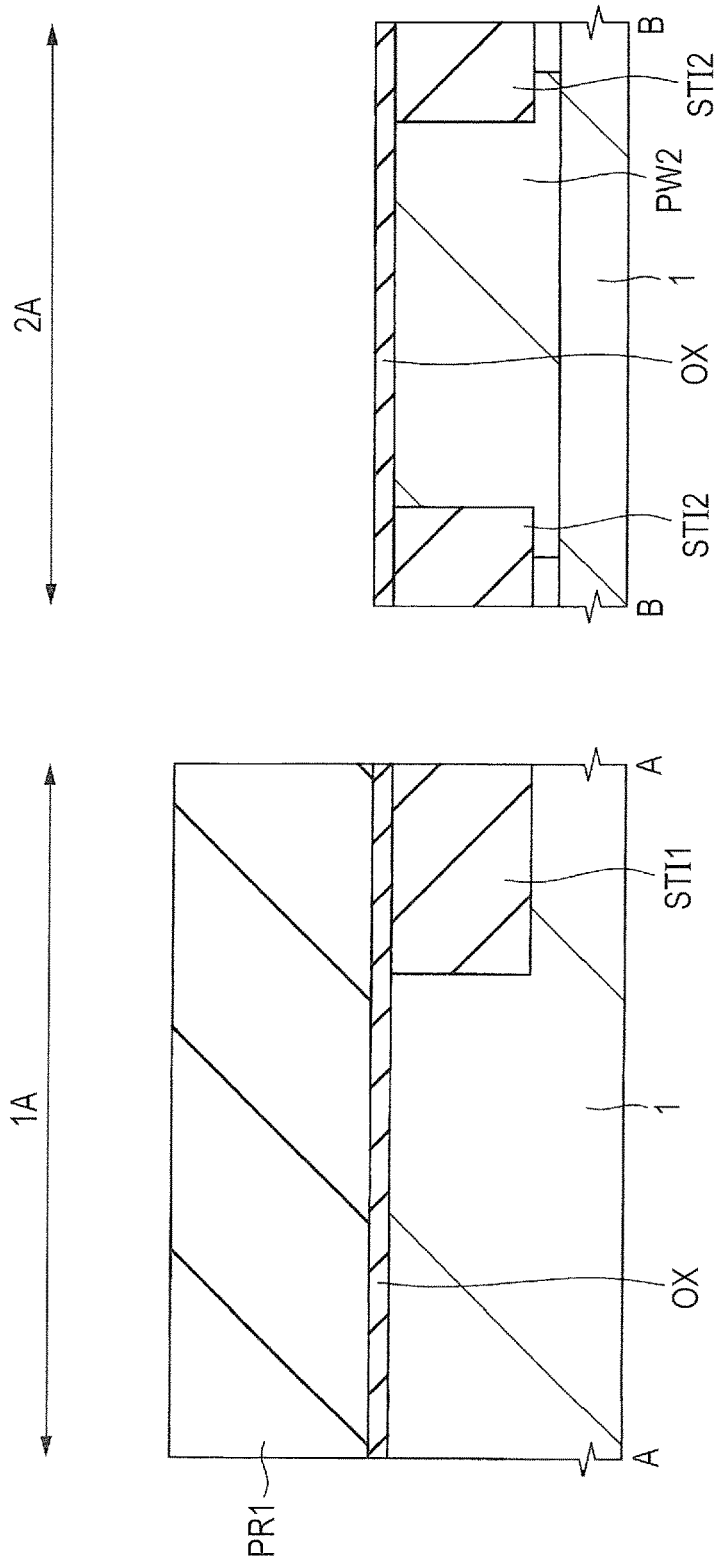
FIG. 16 is a cross section of the main part illustrating a process of manufacturing the semiconductor device of the first embodiment.
Figure 17:
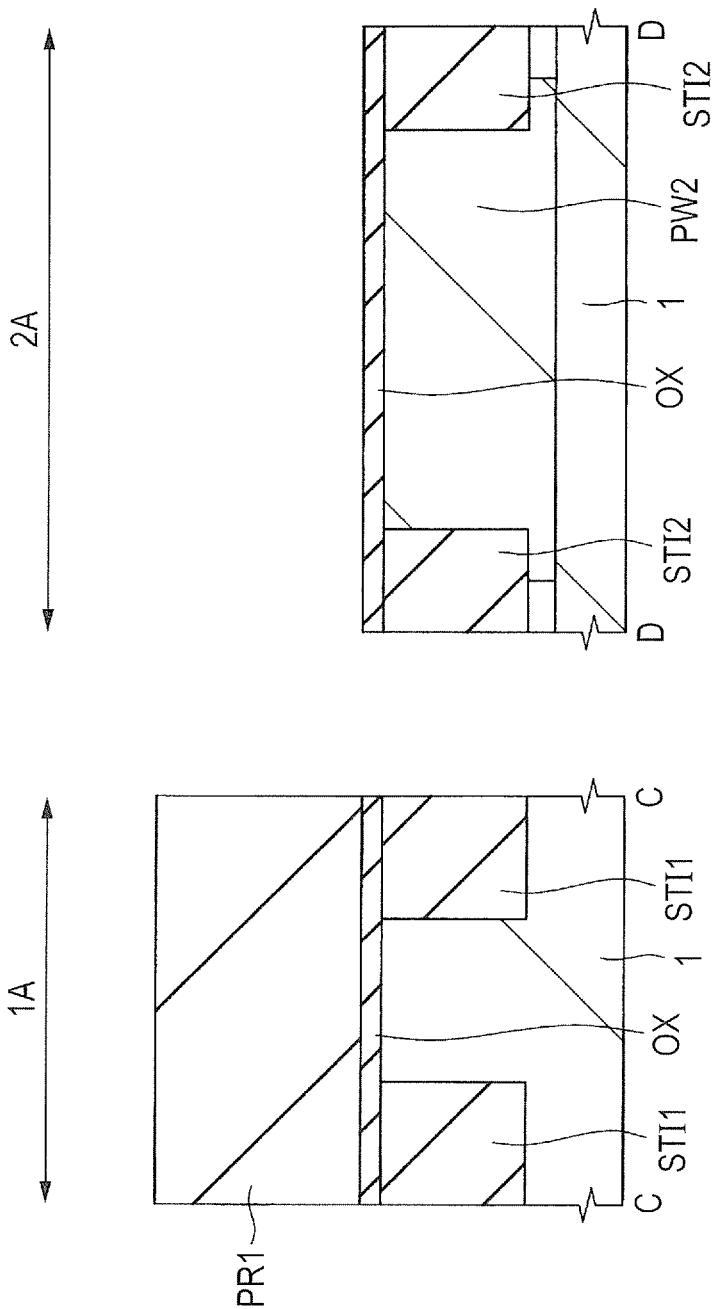
FIG. 17 is a cross section of the main part illustrating a process of manufacturing the semiconductor device of the first embodiment.

Next, refer to FIGS. 16 and 17, an underlayer oxide film OX is formed over the surface of the semiconductor substrate 1. The underlayer oxide film OX can be formed by, for example, the thermal oxidation method.

Next, in the peripheral circuit region 2A, the p-type well (active region) PW2 is formed. For example, the memory cell region 1A is covered with a photoresist film (mask film) PR1, and p-type impurity such as boron (B) is introduced into the semiconductor substrate 1 by the ion injection method or the like. The p-type well PW2 is formed from the surface of the semiconductor substrate 1 to a predetermined depth. Next, to adjust the threshold voltage of the MISFET formed in the peripheral circuit region 2A, channel dope ion injection is performed to the surface part of the p-type well PW2 as necessary. After that, the photoresist film PR1 in the memory cell region 1A is removed.

Figure 18:
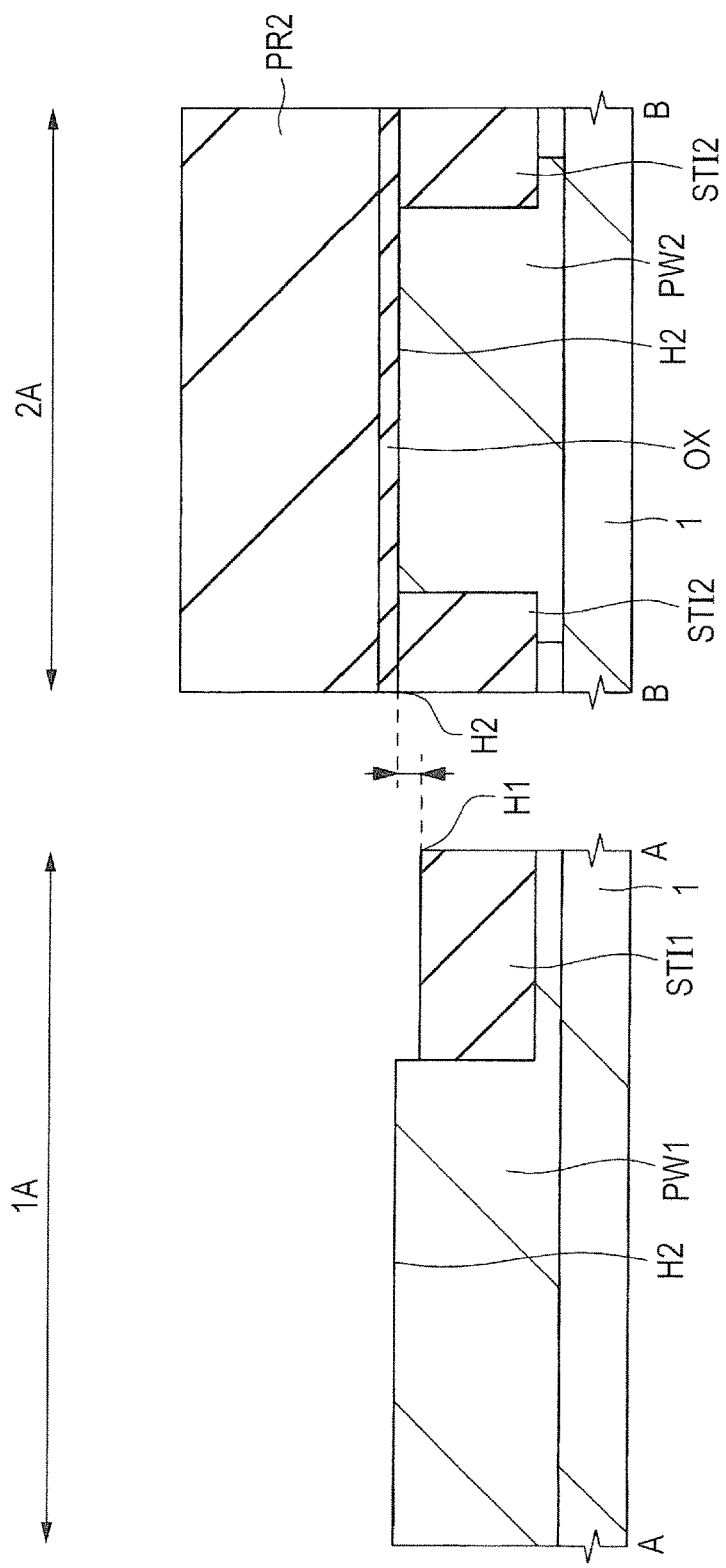
FIG. 18 is a cross section of the main part illustrating a process of manufacturing the semiconductor device of the first embodiment.
Figure 19:
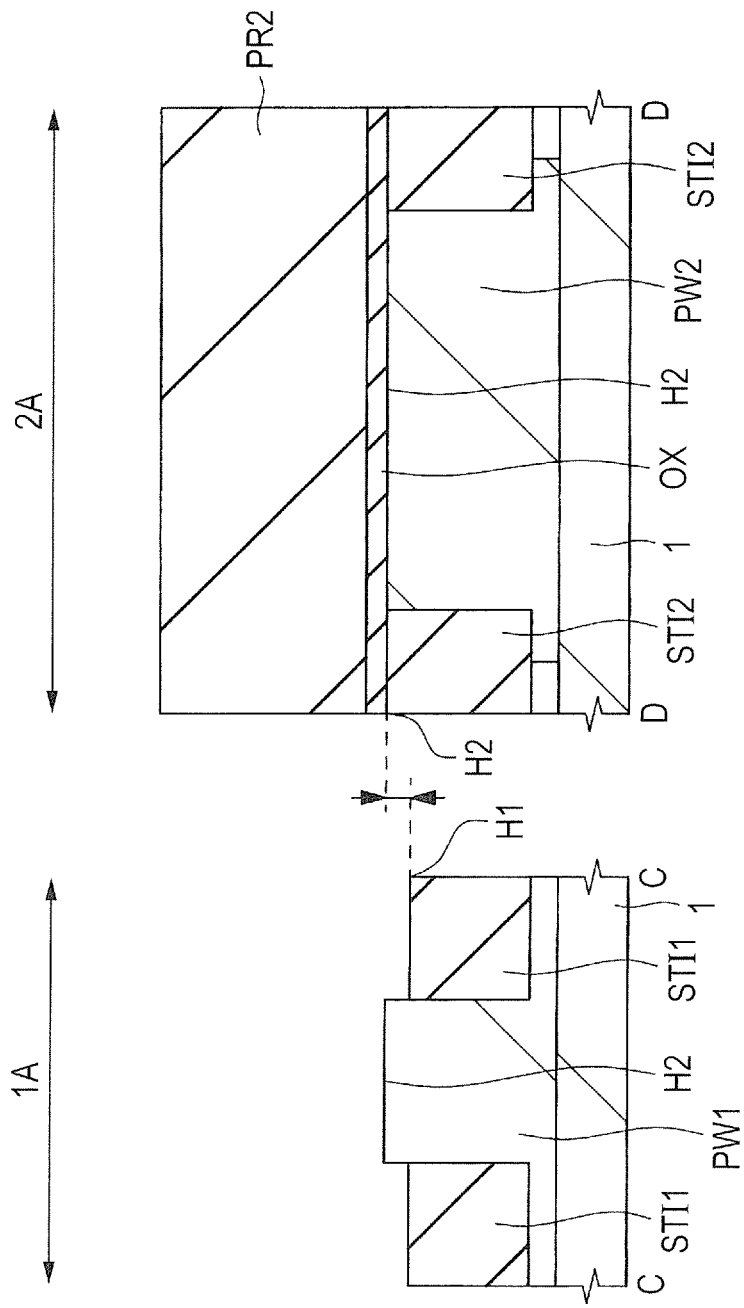
FIG. 19 is a cross section of the main part illustrating a process of manufacturing the semiconductor device of the first embodiment.

As illustrated in FIGS. 18 and 19, the p-type well (active region) PW1 is formed in the memory cell region 1A. For example, the peripheral circuit region 2A is covered with a photoresist film PR2, and a p-type impurity such as boron (B) is introduced into the semiconductor substrate 1 by the ion injection method or the like (well implantation process). The p-type well PW1 is formed by a predetermined depth from the surface of the semiconductor substrate 1. Next, to adjust the threshold voltage of the control transistor formed in the memory region 1A, channel dope injection is performed to the surface part of the p-type well as necessary.

Subsequently, the surface of the element isolation region STI1 in the memory region 1A is made receded. For example, using the photoresist film PR2 as a mask, the surface of the element isolation region STI1 in the memory cell region 1A is made receded by a predetermined amount by a predetermined amount. As an etching solution, a hydrofluoric acid (HF) aqueous solution can be used. The recession amount is, for example, 10 nm to 20 nm. Consequently, the surface height H1 of the element isolation region STI1 in the memory cell region 1A becomes lower than the surface height H2 of the element isolation region STI2 in the peripheral circuit region 2A. In other words, in the memory cell region 1A, the surface height H1 of the element isolation region STI1 is receded from the surface height H2 of the semiconductor substrate 1. After that, the photoresist film PR2 of the peripheral circuit region 2A is removed.

As described above, using the photoresist film PR2 for forming the p-type well PW1 in the memory cell region 1A, the surface of the element isolation region STI1 in the memory cell region 1A is etched. Therefore, without increasing a mask (exposure original plate), the surface of the element isolation region STI1 in the memory cell region 1A can be receded. After etching the surface of the element isolation region STI1 in the memory cell region 1A by using the photoresist film PR2, the p-type well PW1 may be formed in the memory cell region 1A. In other words, before or after the well implantation process, the surface of the element isolation region STI1 may be etched. The process of making the surface of the element isolation region STI1 in the memory cell region 1A receded has to be performed after formation of the element isolation regions STI1 and STI2, at least before deposition of the conductive film for the control gate electrode CG.

Figure 20:
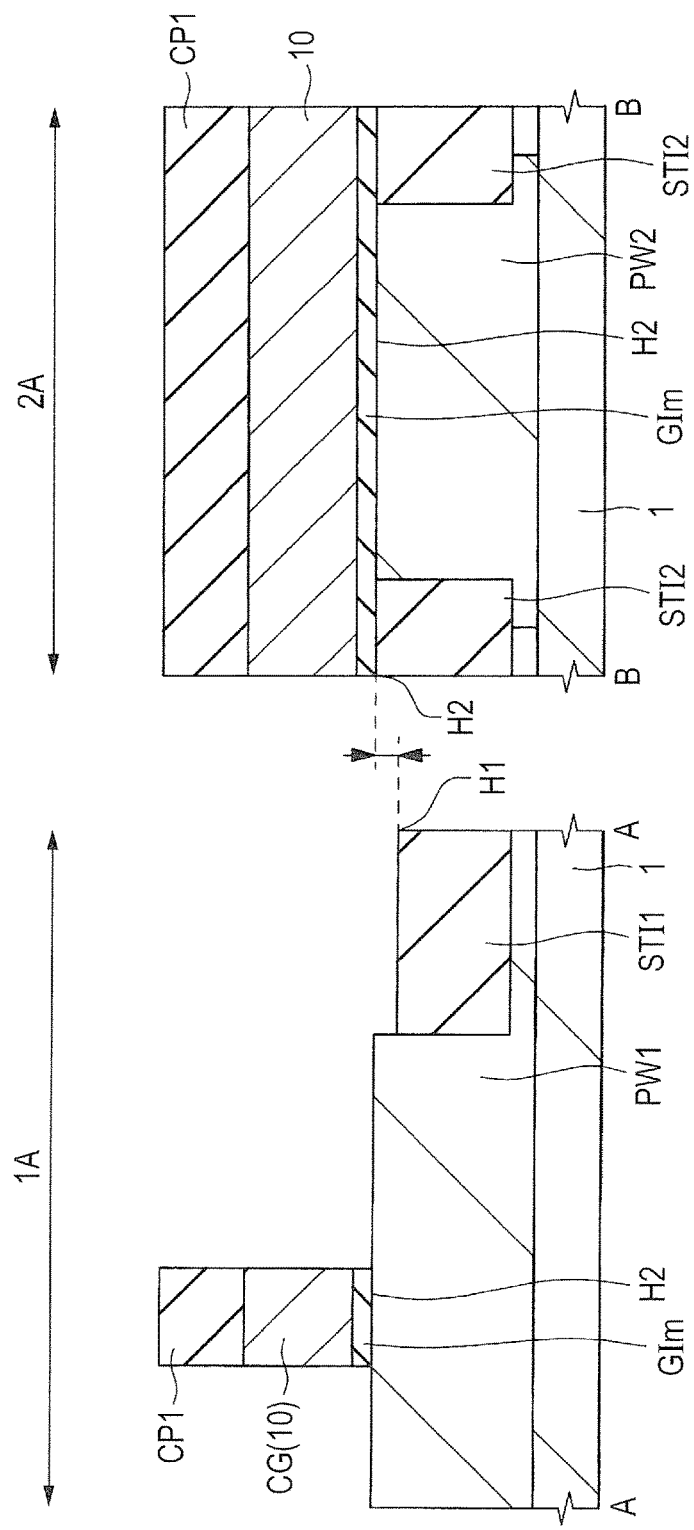
FIG. 20 is a cross section of the main part illustrating a process of manufacturing the semiconductor device of the first embodiment.
Figure 21:
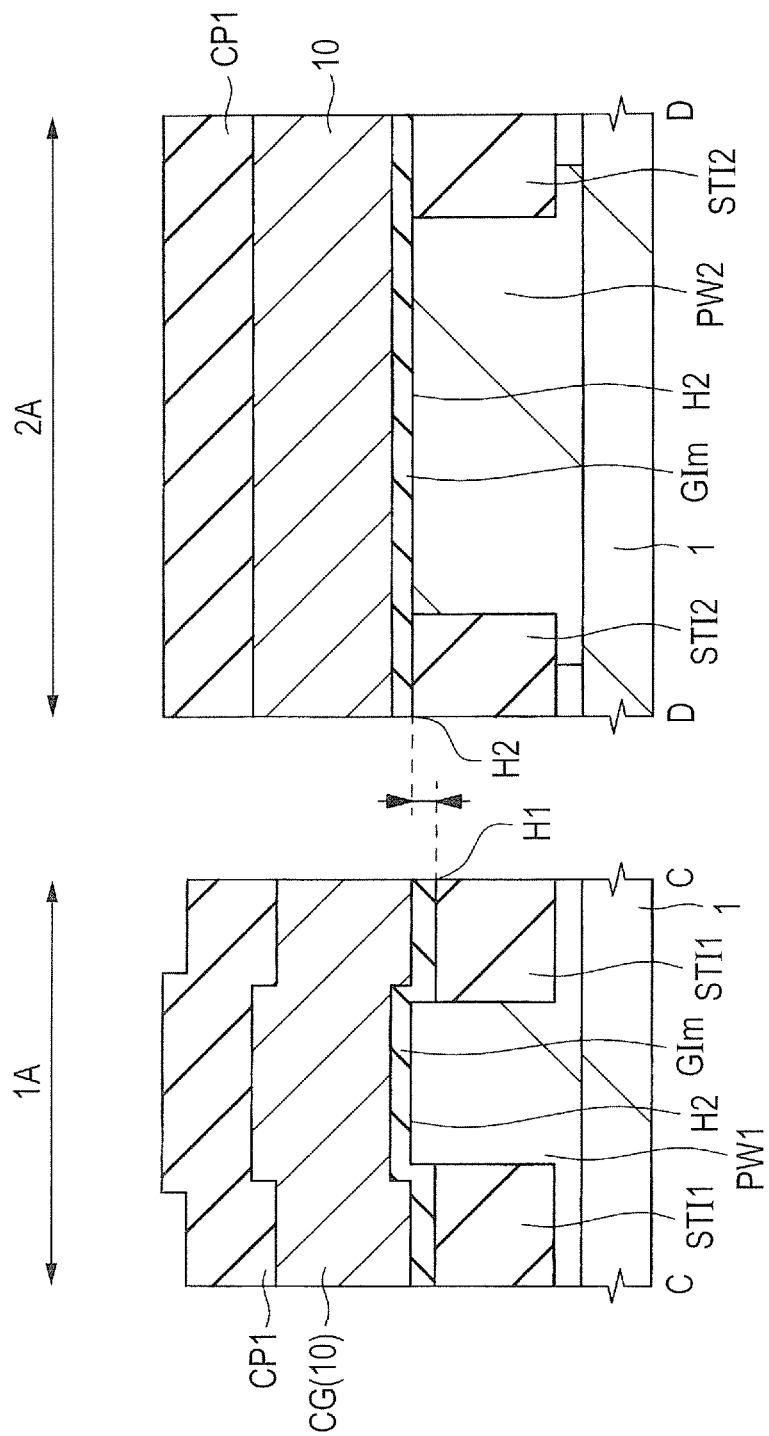
FIG. 21 is a cross section of the main part illustrating a process of manufacturing the semiconductor device of the first embodiment.

As illustrated in FIGS. 20 and 21, over the surface of the semiconductor substrate 1 (p-type wells PW1 and PW2), the CG gate insulating film GIm, the conductive film for the control gate electrode CG, and the cap insulating film CP1 are sequentially formed.

The thickness of the CG gate insulating film GIm is, for example, about 2 to 3 nm. As the CG gate insulating film GIm, a silicon oxide film, a silicon nitride film, a silicon oxynitride film, or a high-k film (high-dielectric-constant film) can be used. The CG gate insulating film GIm can be formed by using the thermal oxidation method, the sputtering method, the atomic layer deposition (ALD) method, the chemical vapor deposition (CVD) method, or the like.

Subsequently, the conductive film (for example, the polysilicon film 10) for the control gate electrode CG is formed over the CG gate insulating film GIm. The thickness of the polysilicon film 10 is, for example, about 50 to 100 nm. As the conductive film, preferably, a conductive film containing silicon, for example, a film whose resistivity is lowered by introducing an n-type impurity such as phosphor (P) or arsenic (As) is used. Such a conductive film can be formed by using the CVD method or the like. The impurity can be introduced at the time of or after formation of the conductive film. In the case of introducing impurity at the time of forming the conductive film, doping gas is included in gas for forming the conductive film. On the other hand, in the case of introducing impurity after formation of the conductive film, the impurity is introduced into the conductive film by the ion injection method or the like.

After that, the gap insulating film CP1 is formed over the conductive film (for example, the polysilicon film 10) for the control gate electrode CG. The thickness of the cap insulating film CP1 is, for example, about 20 to 100 nm. As the cap insulating film CP1, for example, an insulating film such as a silicon nitride film can be used. The cap insulating film CP1 can be formed by using, for example, the CVD method.

Subsequently, the stack body of the CG gate insulating film GIm, the polysilicon film 10 for the control gate electrode CG, and the cap insulating film CP1 is processed into a desired shape. The stack body is patterned by using the photolithography technique and the etching technique. For example, a photoresist film (not illustrated) is formed in a formation region of the peripheral circuit region 2A and the control gate electrode CG and, using the photoresist film as a mask, the stack body is etched. By the operation, the control gate electrode CG is formed in the memory cell region 1A.

To adjust the threshold voltage of the memory transistor, channel dope ion injection is performed to the p-type well PW1 in the memory cell 1A as necessary.

Figure 22:
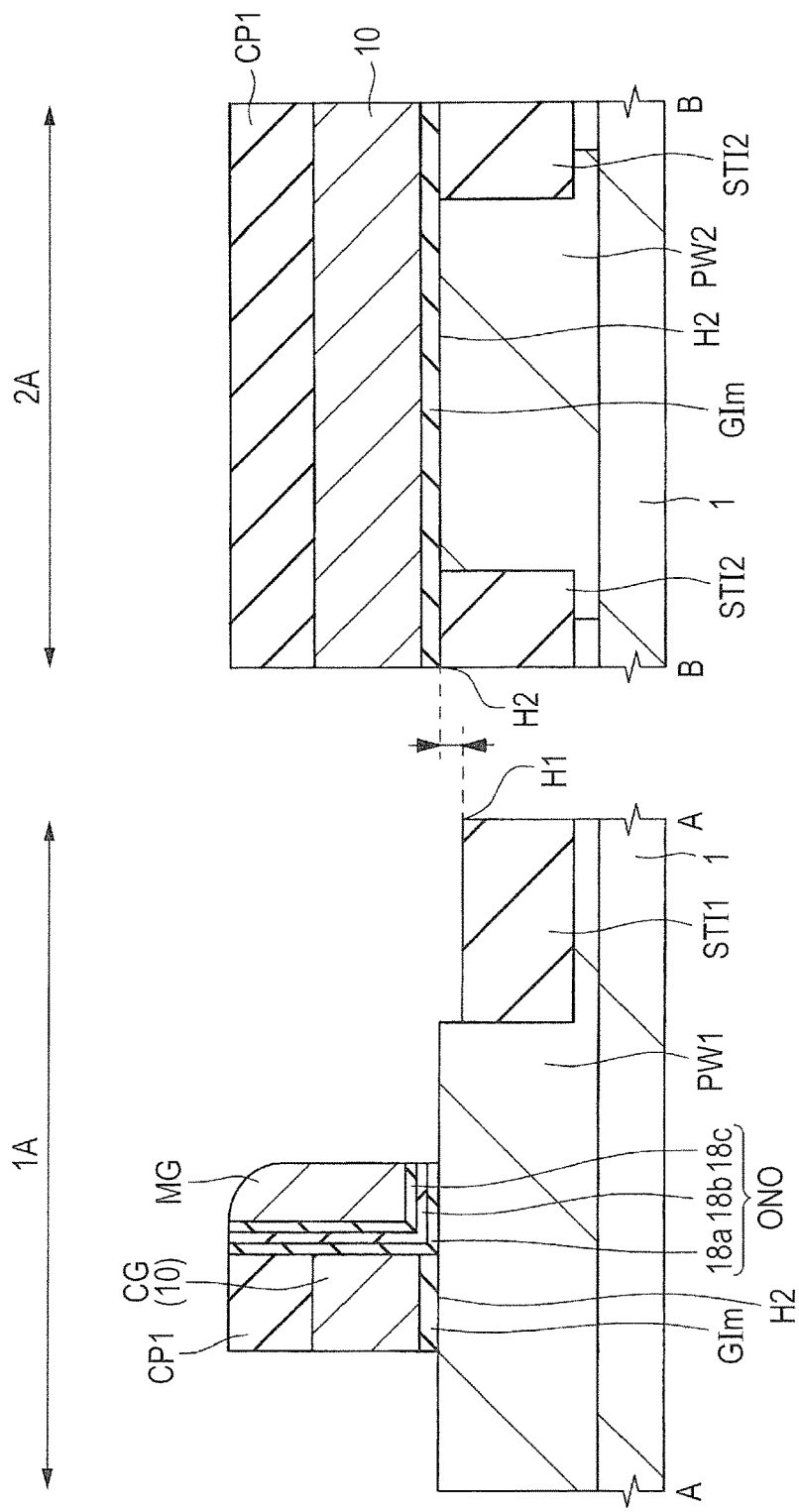
FIG. 22 is a cross section of the main part illustrating a process of manufacturing the semiconductor device of the first embodiment.
Figure 23:
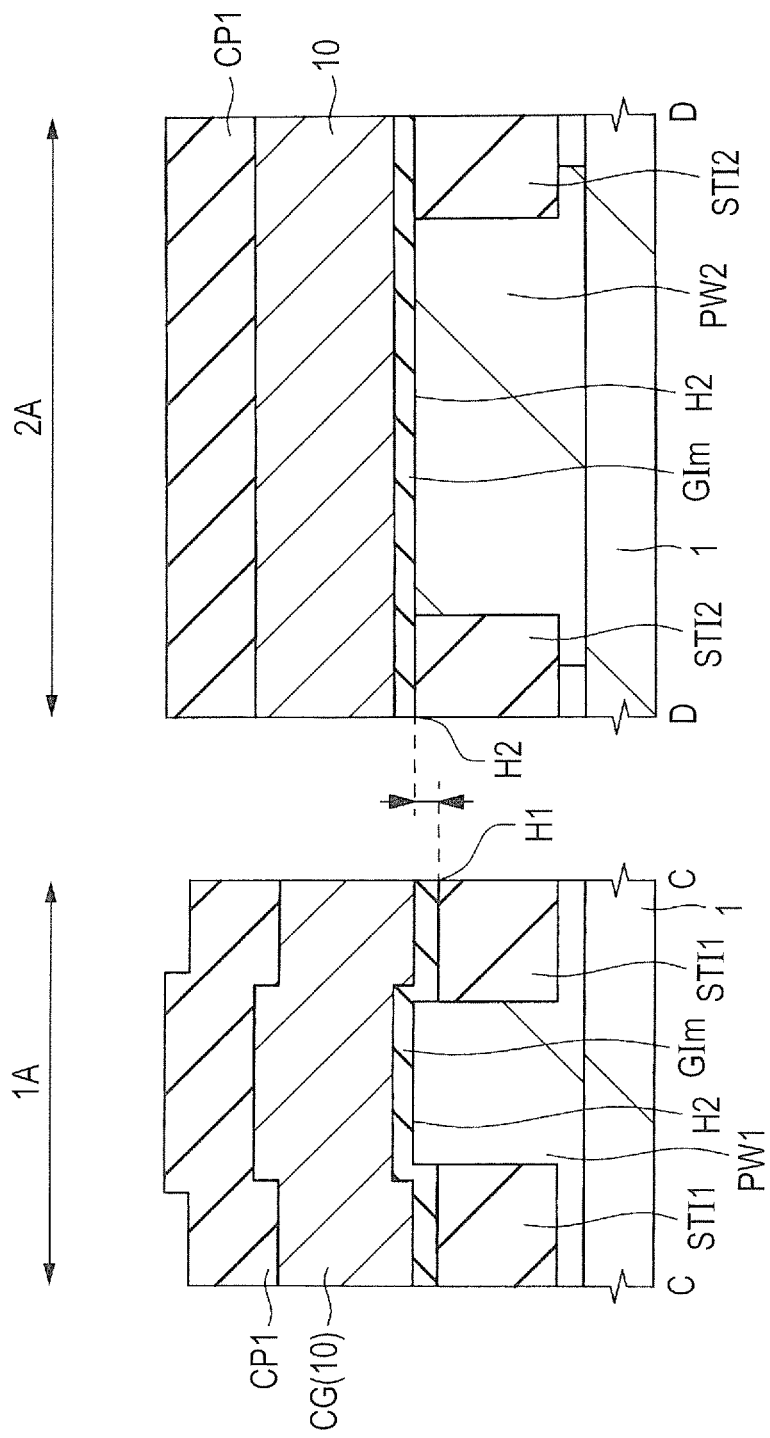
FIG. 23 is a cross section of the main part illustrating a process of manufacturing the semiconductor device of the first embodiment.

Next, as illustrated in FIGS. 22 and 23, the trap insulating film ONO as the gate insulating film for the memory transistor is formed. The trap insulating film ONO is an insulating film having therein a charge accumulation part, and is a stack film of the silicon oxide film 18$a$, the silicon nitride film 18$b$, and the silicon oxide film 18$c$ which are formed in order from the bottom.

The thickness of the silicon oxide film 18$a$ can be set to, for example, about 2 to 5 nm, the thickness of the silicon nitride film 18$b$ can be set to, for example, about 5 to 15 nm and the thickness of the silicon oxide film 18$c$ can be set to, for example, about 5 to 15 nm. In place of the silicon oxide films 18$a$ and 18$c$, a silicon oxynitride film may be used.

The silicon oxide film 18$a$ can be formed by the thermal oxidation method, the ISSG oxidation method, or the like. The treatment temperature is, for example, about 900 to 1000° C. After formation of the silicon oxide film 18$a$, nitriding treatment may be performed at high temperature. The treatment temperature is, for example, about 1000 to 1050° C.

The silicon nitride film 18$b$ can be formed by the CVD method or the like. The silicon oxide film 18$c$ can be formed by the CVD method or the like.

Subsequently, the conductive film (for example, polysilicon film) for the memory gate electrode MG is formed over the trap insulating film ONO. The thickness of the polysilicon film is, for example, about 30 to 100 nm. As the conductive film, preferably, a conductive film containing silicon, for example, a film whose resistivity is lowered by introducing an n-type impurity such as phosphor (P) or arsenic (As) is used. Such a conductive film can be formed by using the CVD method or the like. The impurity can be introduced at the time of or after formation of the conductive film. In the case of introducing impurity at the time of forming the conductive film, doping gas is included in gas for forming the conductive film. On the other hand, in the case of introducing impurity after formation of the conductive film, the impurity is introduced into the conductive film by the ion injection method or the like.

After that, the conductive film for the memory gate electrode MG is etched back by anisotropic etching. By etching back the conductive film only by the amount of the thickness of the conductive film, the conductive film is made remain in a sidewall spacer shape via the trap insulating film on side walls of both sides. At this time, the conductive film in the peripheral circuit region 2A is removed. Subsequently, while leaving one of the sides of the conductive film in the sidewall spacer shape on both sides of the control gate electrode CG, the other side is removed by using the photolithography technique and the etching technique. The remaining conductive film in the sidewall shape becomes the memory gate electrode. Using the memory gate electrode MG as a mask, the trap insulating film ONO is removed by wet etching or the like. At this time, the trap insulating film ONO remaining in the peripheral circuit region 2A is also removed.

Figure 24:
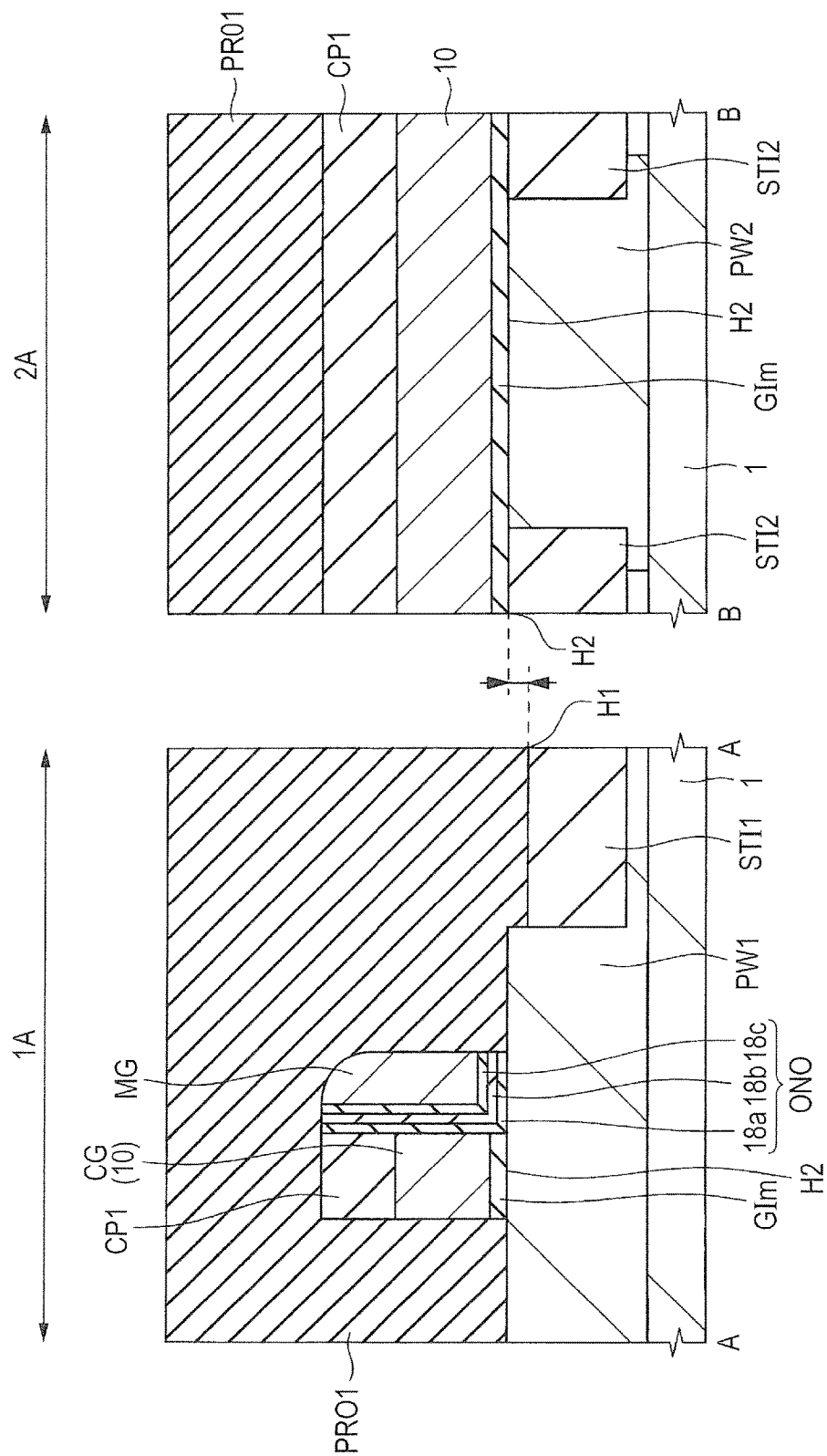
FIG. 24 is a cross section of the main part illustrating a process of manufacturing the semiconductor device of the first embodiment.
Figure 25:
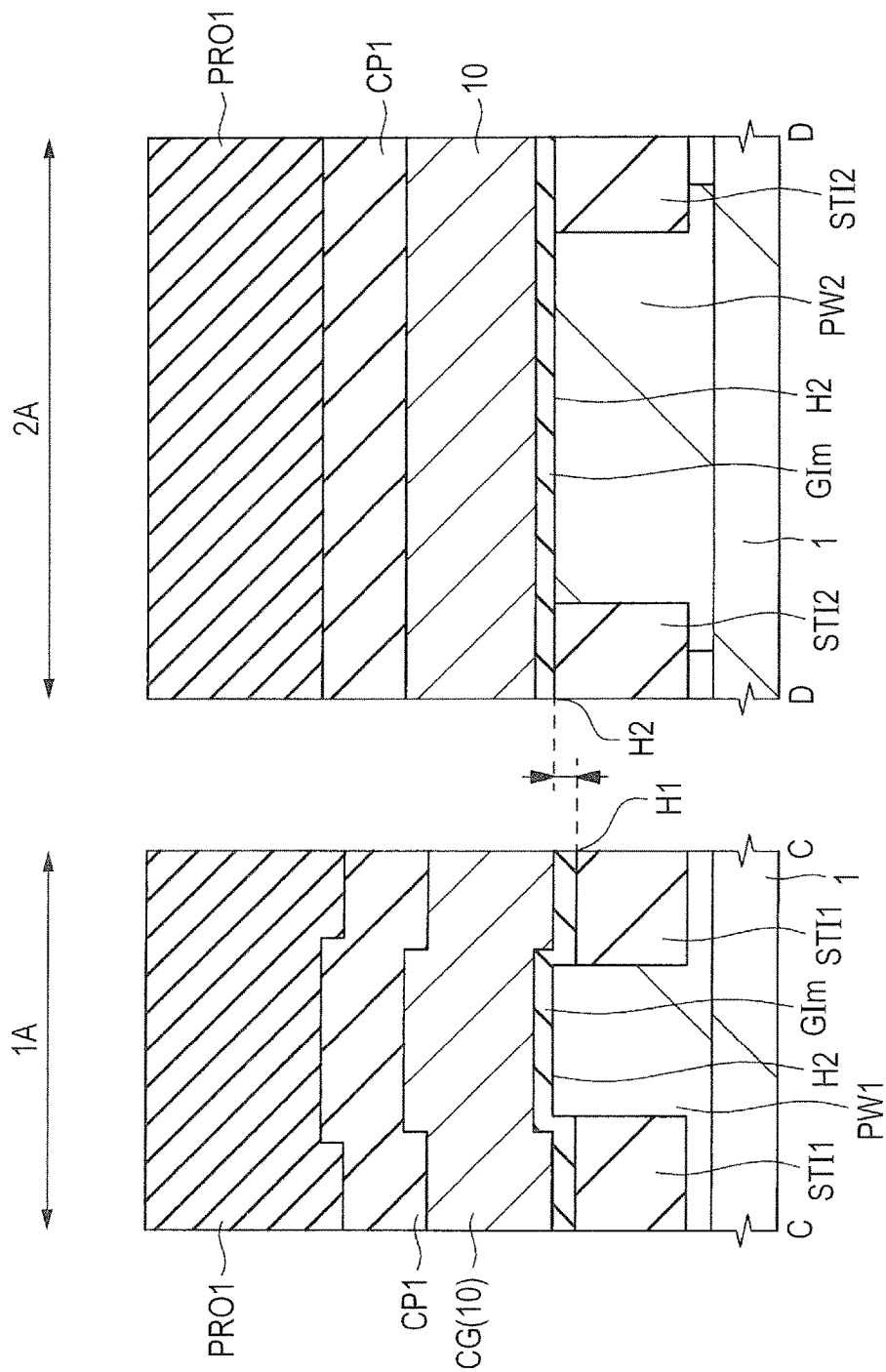
FIG. 25 is a cross section of the main part illustrating a process of manufacturing the semiconductor device of the first embodiment.

Next, as illustrated in FIGS. 24 and 25, a protection film PRO1 is formed in the memory cell region 1A and the peripheral circuit region 2A. The protection film PRO1 is, for example, a silicon oxide film or the like and can be formed by using the CVD method or the like. The thickness of the protection film PRO1 is larger than the sum of the thickness of the control gate electrode CG and the cap insulating film CP1. Therefore, the top face of the protection film PRO1 is higher than that of the cap insulating film CP1.

Figure 26:
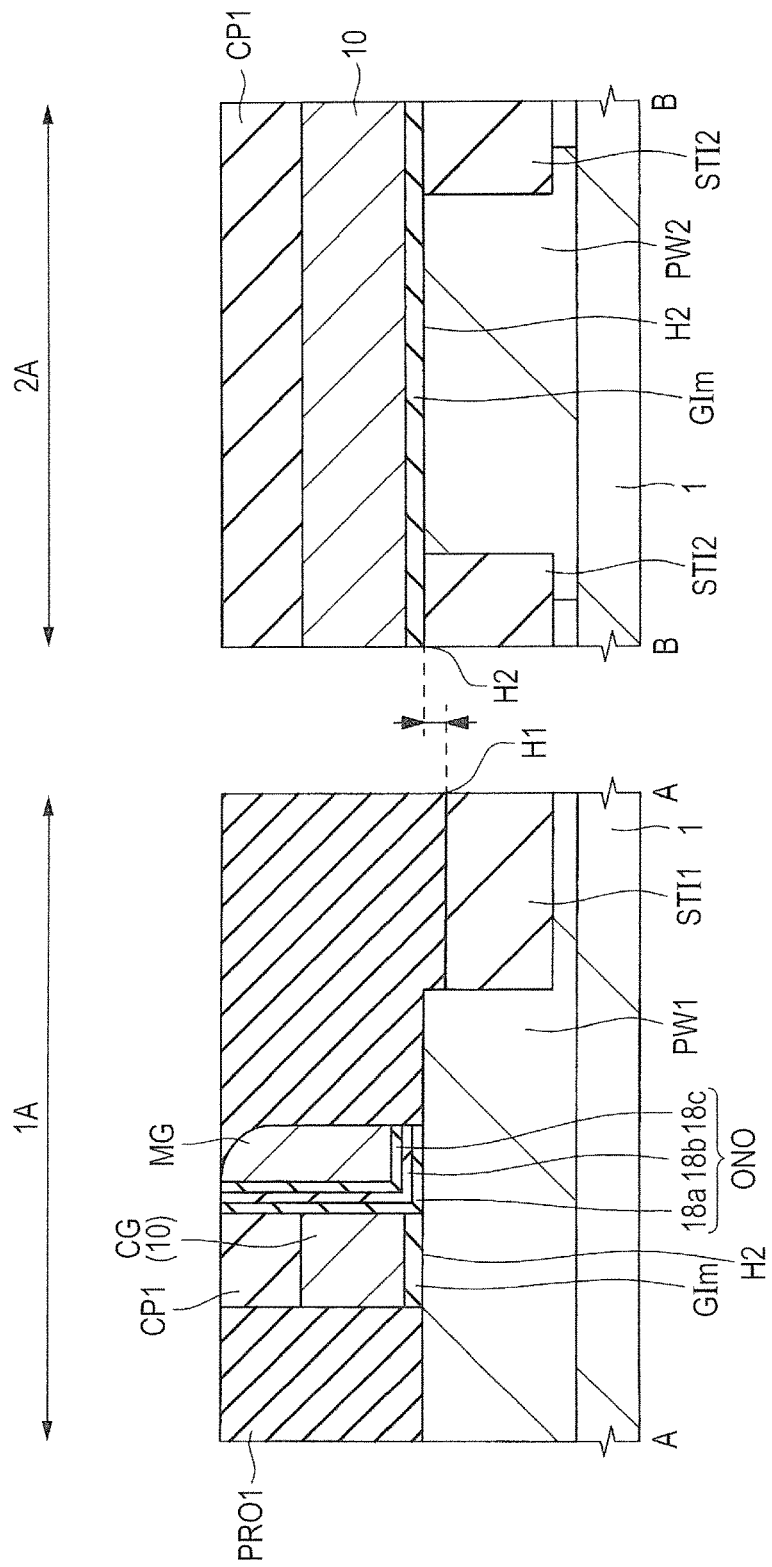
FIG. 26 is a cross section of the main part illustrating a process of manufacturing the semiconductor device of the first embodiment.
Figure 27:
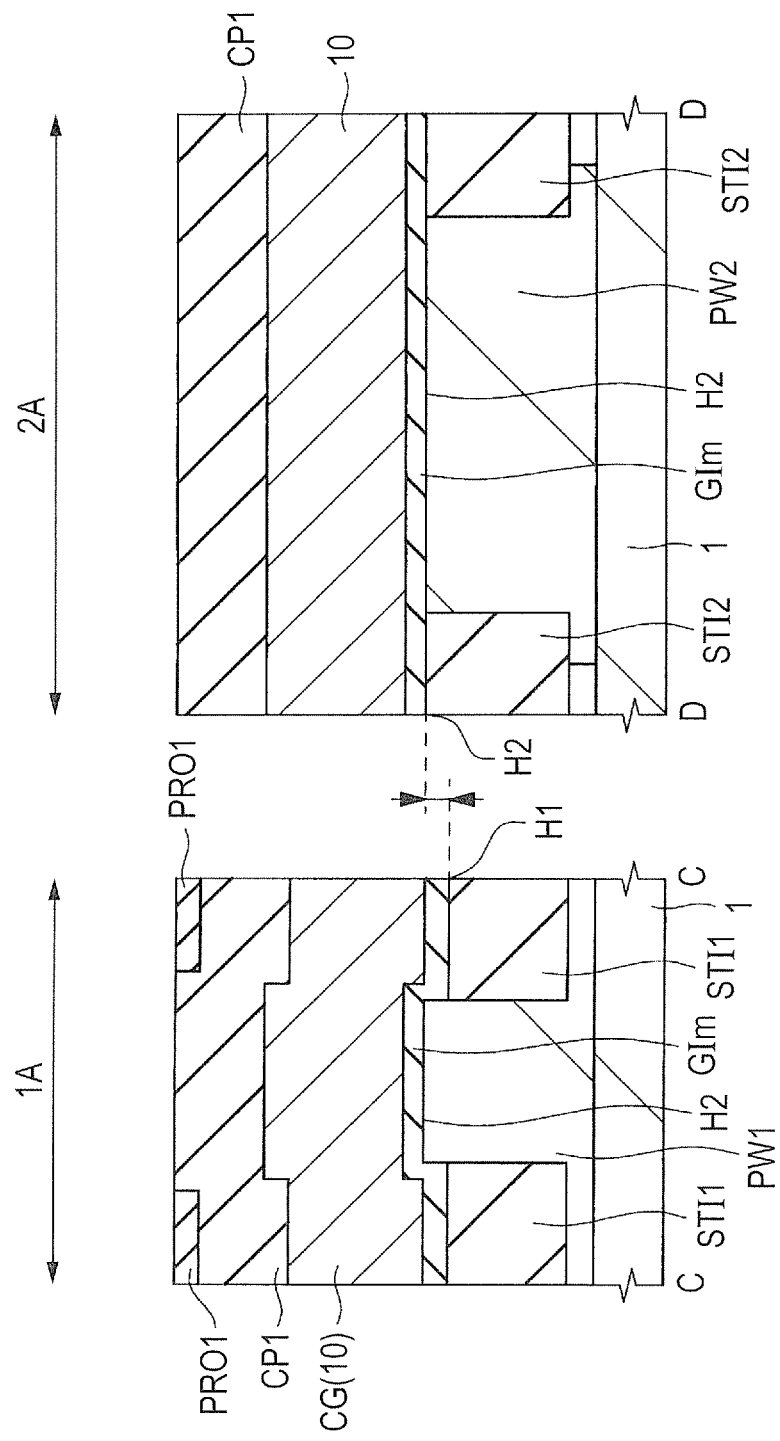
FIG. 27 is a cross section of the main part illustrating a process of manufacturing the semiconductor device of the first embodiment.
Figure 28:
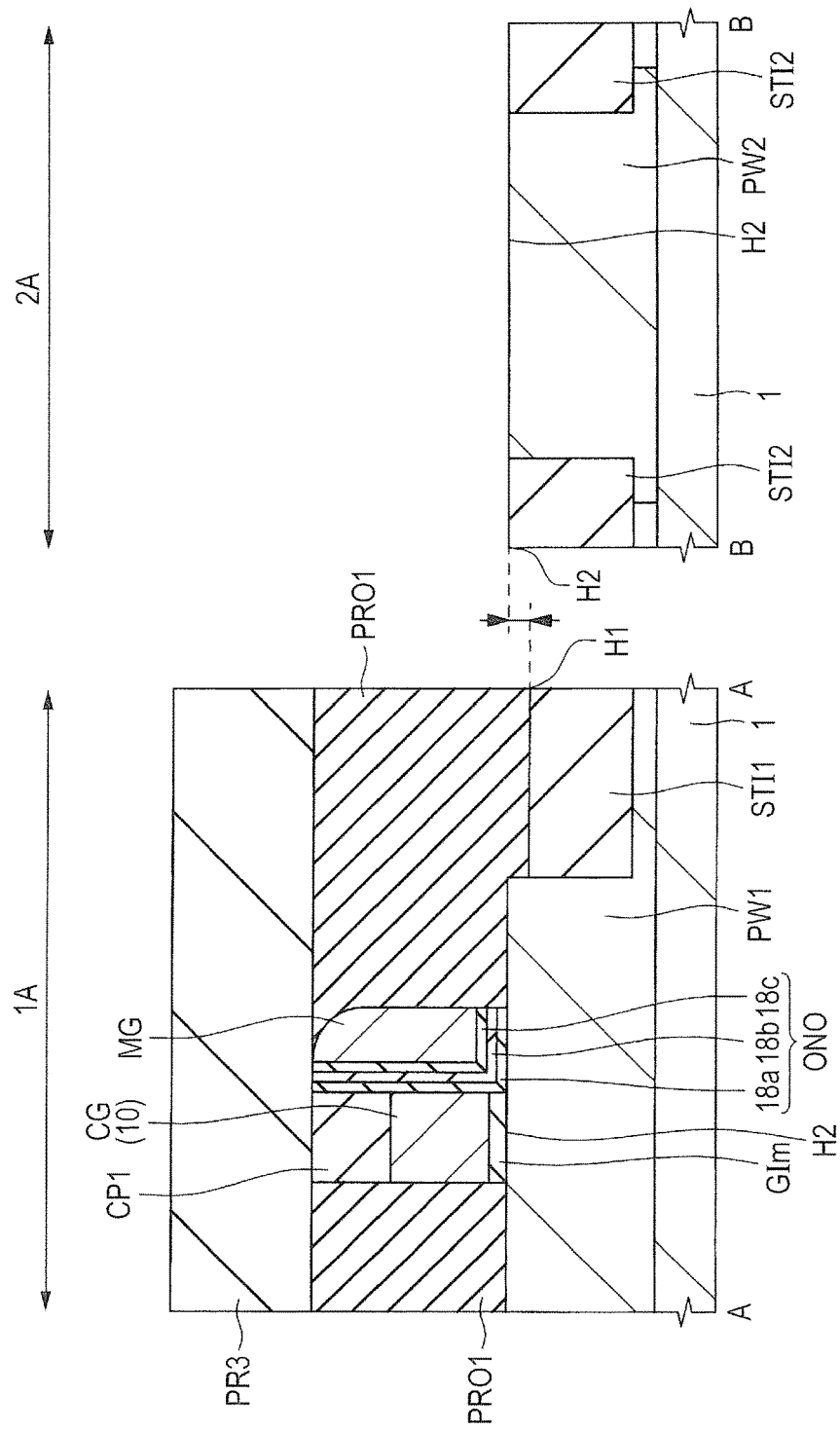
FIG. 28 is a cross section of the main part illustrating a process of manufacturing the semiconductor device of the first embodiment.
Figure 29:
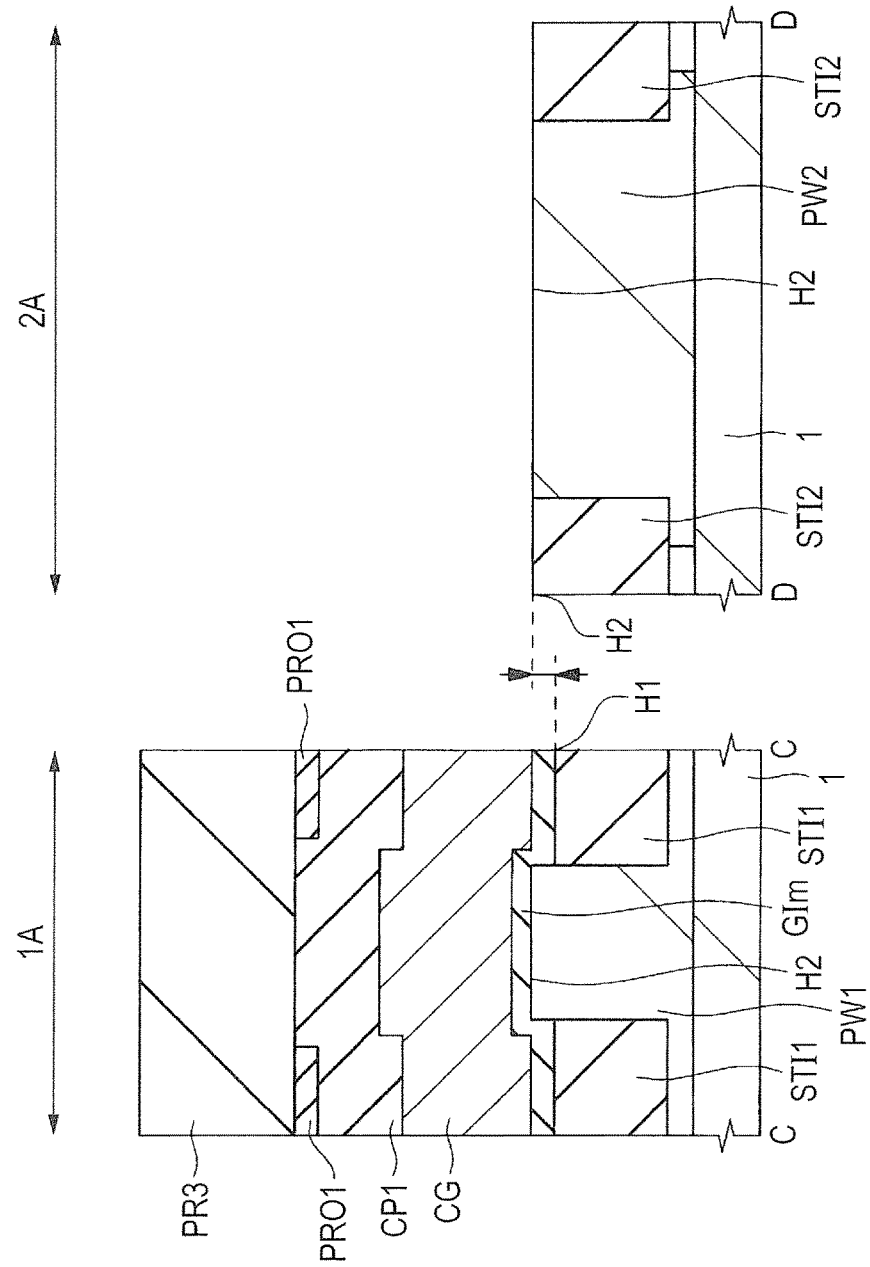
FIG. 29 is a cross section of the main part illustrating a process of manufacturing the semiconductor device of the first embodiment.

As illustrated in FIGS. 26 and 27, the top part of the protection film PRO1 is removed. For example, the top part of the protection film PRO1 is polished until the cap insulating film CP1 is exposed by using the CMP method or the like. By the operation, the surface of the cap insulating film CP1 and the protection film PRO1 is planarized. As illustrated in FIGS. 28 and 29, the memory cell region 1A is covered with a photoresist film PR3, and the conductive film (for example, the polysilicon film 10) for the control gate electrode CG, the cap insulating film CP1, and the CG gate insulating film GIm remaining in the peripheral circuit region 2A are removed. After that, the photoresist film PR3 in the memory cell region 1A is removed.

Figure 30:
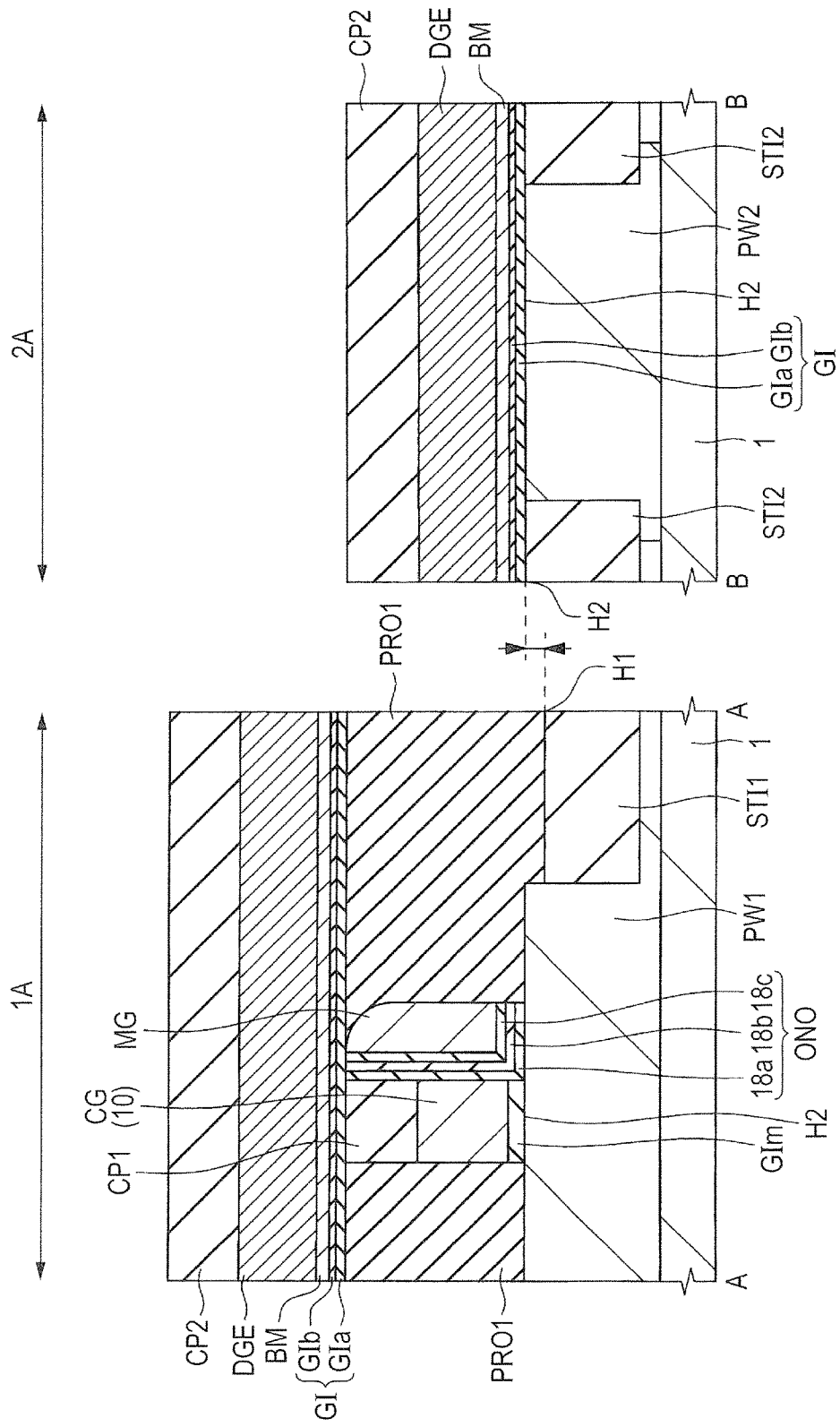
FIG. 30 is a cross section of the main part illustrating a process of manufacturing the semiconductor device of the first embodiment.
Figure 31:
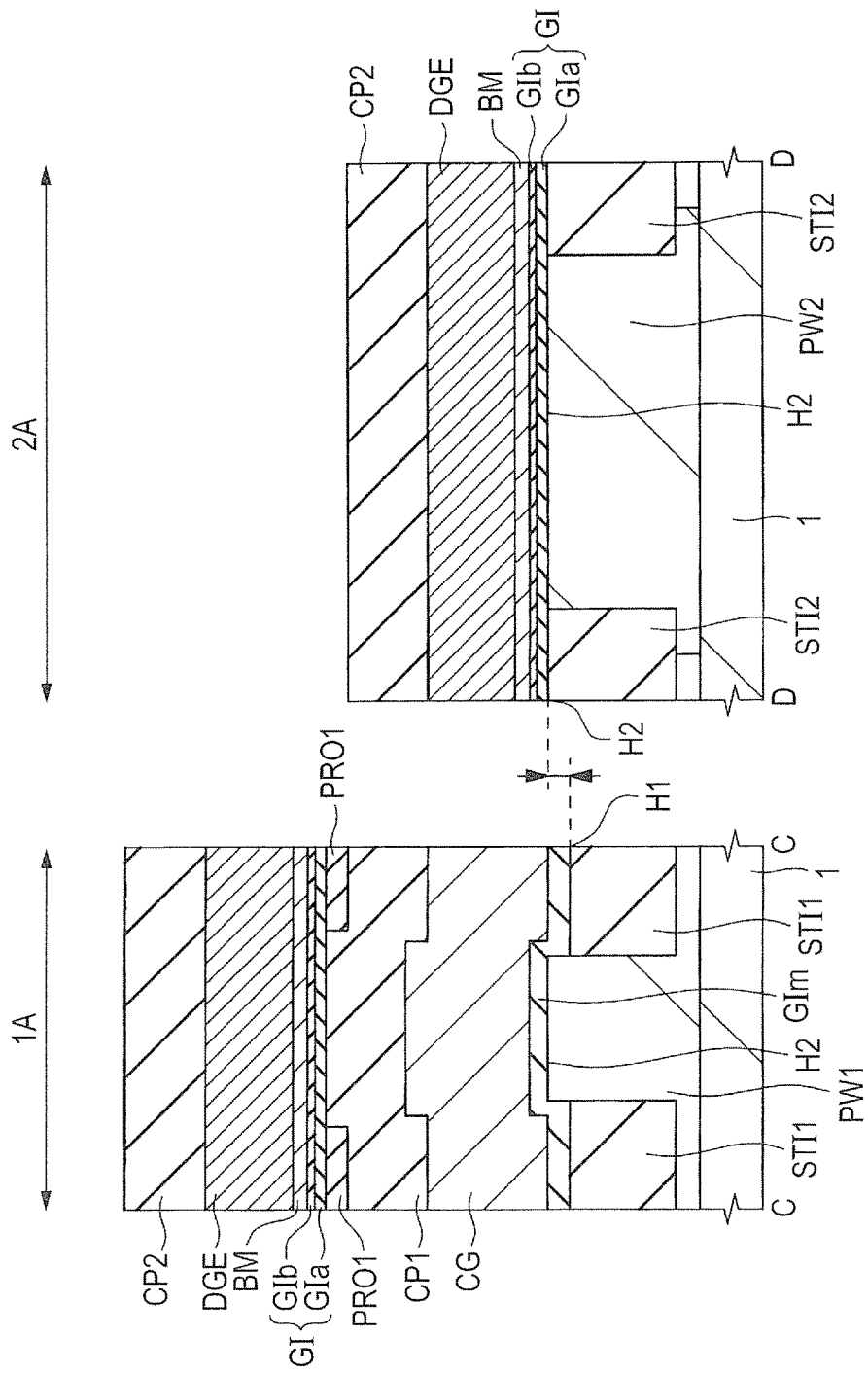
FIG. 31 is a cross section of a main part illustrating a process of manufacturing the semiconductor device of the first embodiment.

After that, as illustrated in FIGS. 30 and 31, in the memory cell region 1A and the peripheral circuit region 2A, the gate insulating film GI, the metal film BM, the dummy gate electrode DGE for replacing the gate electrode GE, and the cap insulating film CP2 are sequentially formed.

As the insulating film GIa as a lower layer in the gate insulating film GI, an insulating film such as a silicon oxide film or a silicon oxynitride film is formed with a thickness of, for example, about 1 nm by the thermal oxidation method or the like. Since the insulating film GIa is formed between the semiconductor substrate 1 and the insulating film GIb which will be described later, it can be regarded as an interface layer. The insulating film GIa may be formed by the CVD method or the like. Over the insulating film GIa of the lower layer, as the insulating film GIb of the upper layer, a high-dielectric-constant film (high-k film) is formed. The relative permittivity of the insulating film GIb is higher than that of silicon nitride. As such a film, a metal oxide film such as a hafnium oxide film, a zirconium oxide film, an aluminum oxide film, a tantalum oxide film, or a lanthanum oxide film can be used. The thickness of the insulating film GIb is, for example, about 1 to 3 nm. The insulating film GIb can be formed by using the sputtering method, the ALD method, the CVD method, or the like.

Over the gate insulating film GI (GIa, GIb), the metal film BM is formed. The thickness of the metal film BM is, for example, about 2 to 3 nm. For the metal film BM, a metal nitride such as titanium nitride (TiN), tantalum nitride (TaN), or tungsten nitride (WN), a metal carbide such as titanium carbide (TiC), tantalum carbide (TaC), or tungsten carbide (WC), tantalum carbonitride (TaCN), tungsten (W), or the like can be used. From the viewpoint of increasing electric conductivity, it is preferable to use a titanium nitride film as the metal film BM. The metal film can be formed by, for example, the PVD method such as the sputtering method. Depending on the material of the metal film BM, the metal film BM can be formed by the CVD method.

Over the metal film BM, the dummy gate electrode DGE for replacing the gate electrode GE is formed. The thickness of the dummy gate electrode DGE is, for example, about 50 to 100 nm. As the dummy gate electrode DGE, a conductive film (for example, polysilicon film) is formed. Such a conductive film can be formed by using the CVD method or the like. At the time of forming the film, the conductive film may be formed as an amorphous silicon film and the amorphous silicon film can be made to a polysilicon film by a following heat treatment.

Over the dummy gate electrode (conductive film) DGE, the cap insulating film (hard mask) CP2 is formed. The thickness of the cap insulating film CP2 is, for example, about 20 to 50 nm. The cap insulating film CP2 is, for example, a silicon nitride film and can be formed by using the CVD method or the like.

Figure 32:
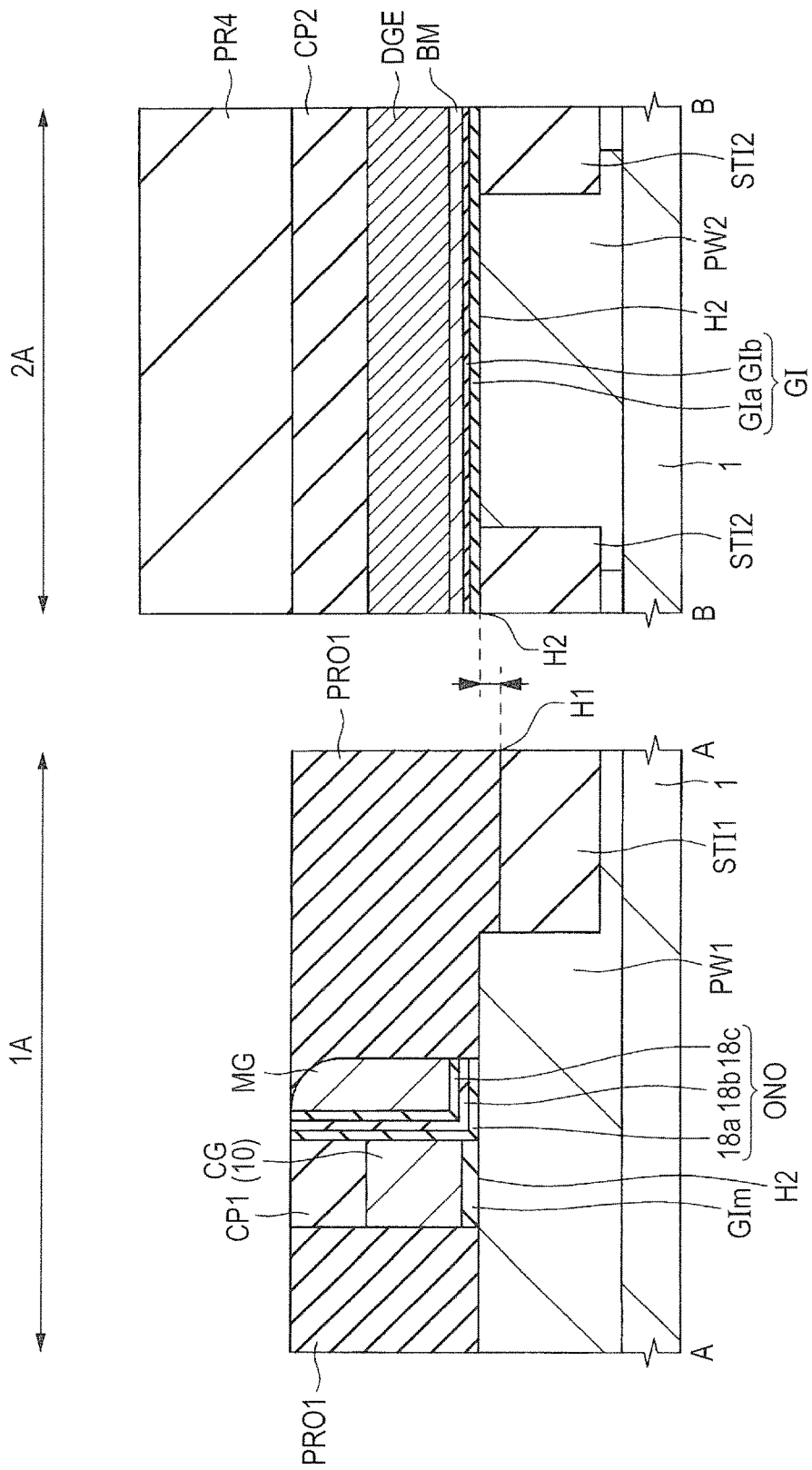
FIG. 32 is a cross section of the main part illustrating a process of manufacturing the semiconductor device of the first embodiment.
Figure 33:
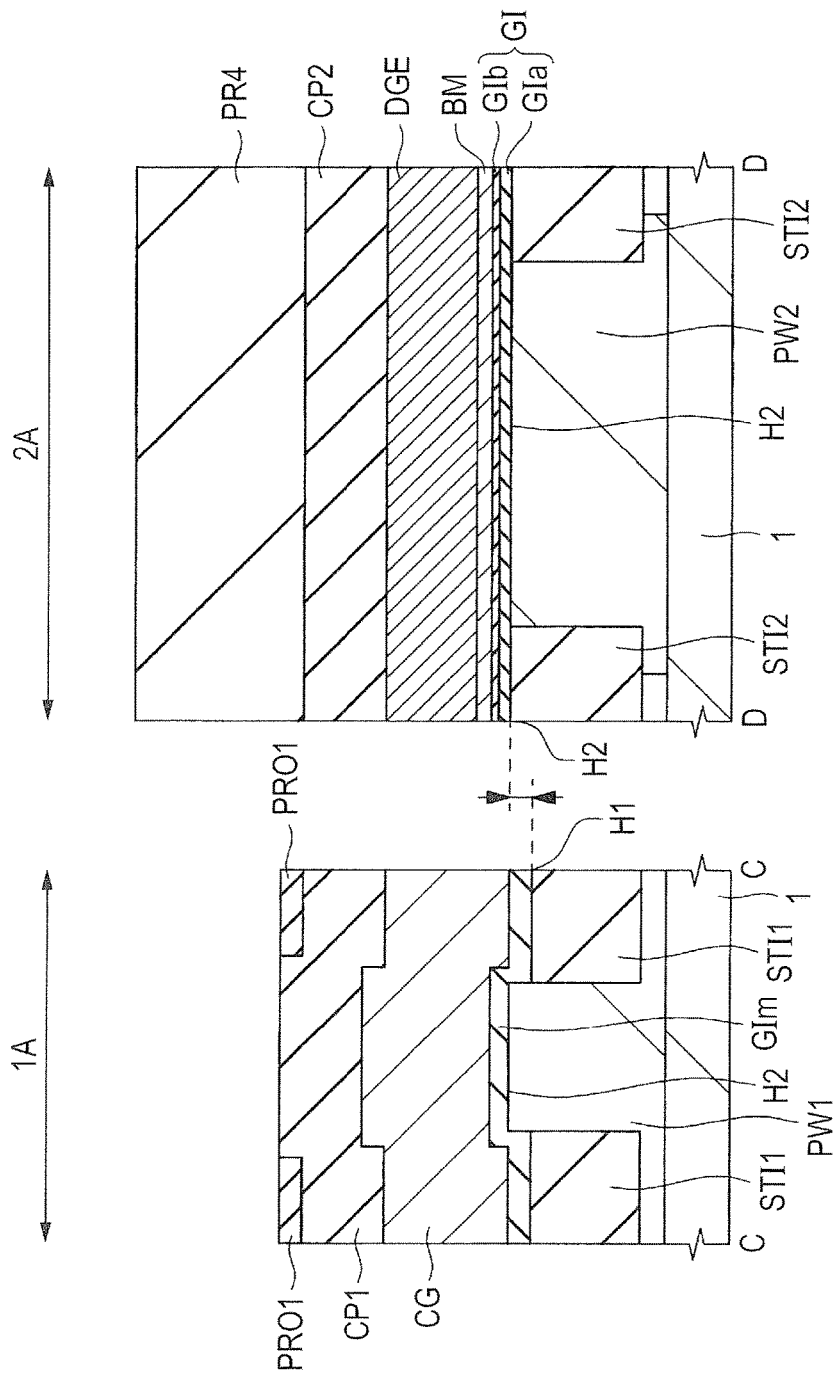
FIG. 33 is a cross section of the main part illustrating a process of manufacturing the semiconductor device of the first embodiment.

As illustrated in FIGS. 32 and 33, the peripheral circuit region 2A is covered with a photoresist film PR4, and the gate insulating film GI, the metal film BM, the dummy gate electrode DGE for replacing the gate electrode GE, and the cap insulating film CP2 in the memory cell region 1A are removed. After that, the photoresist film PR4 in the memory cell region 1A is removed.

Figure 34:
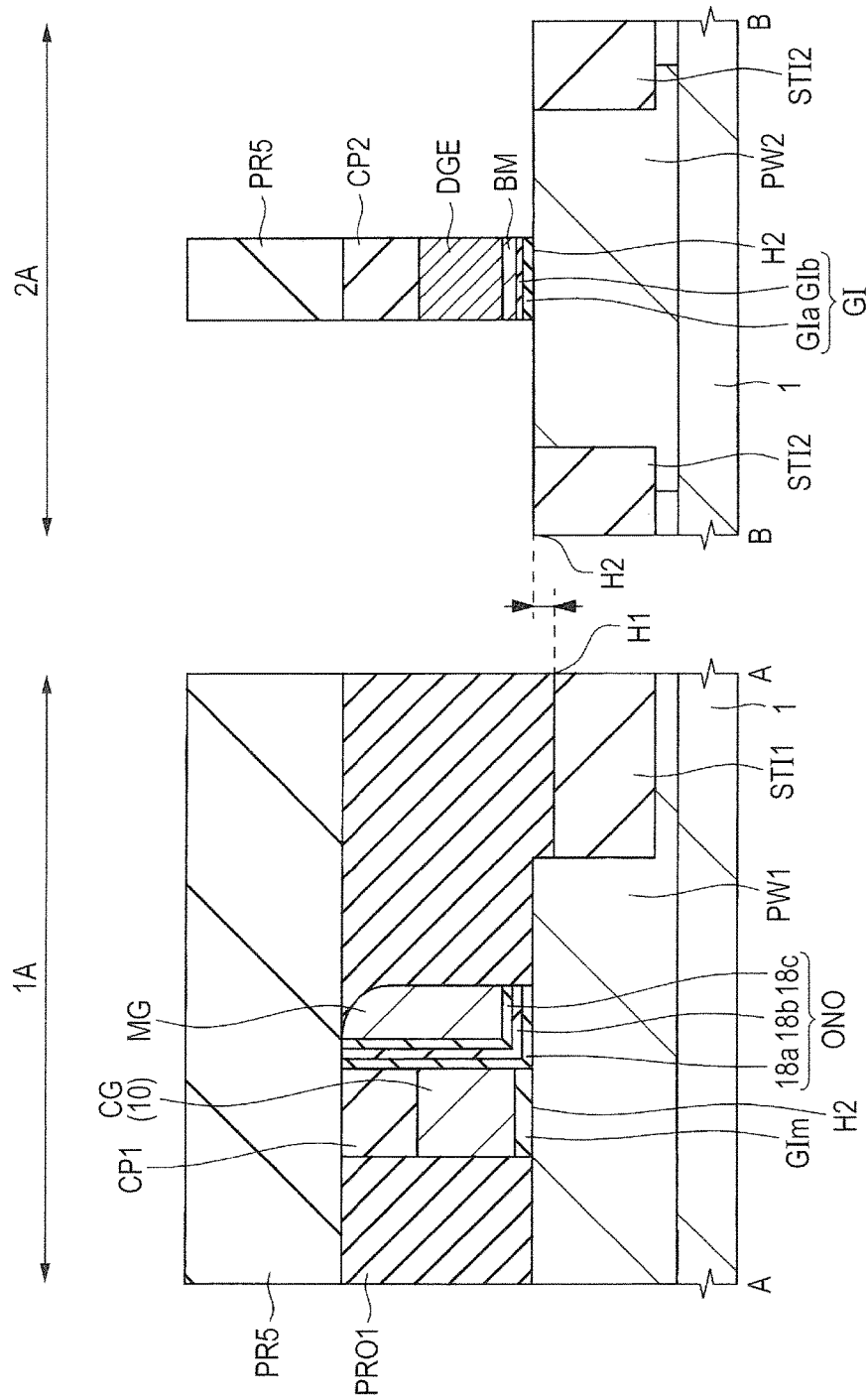
FIG. 34 is a cross section of the main part illustrating a process of manufacturing the semiconductor device of the first embodiment.
Figure 35:
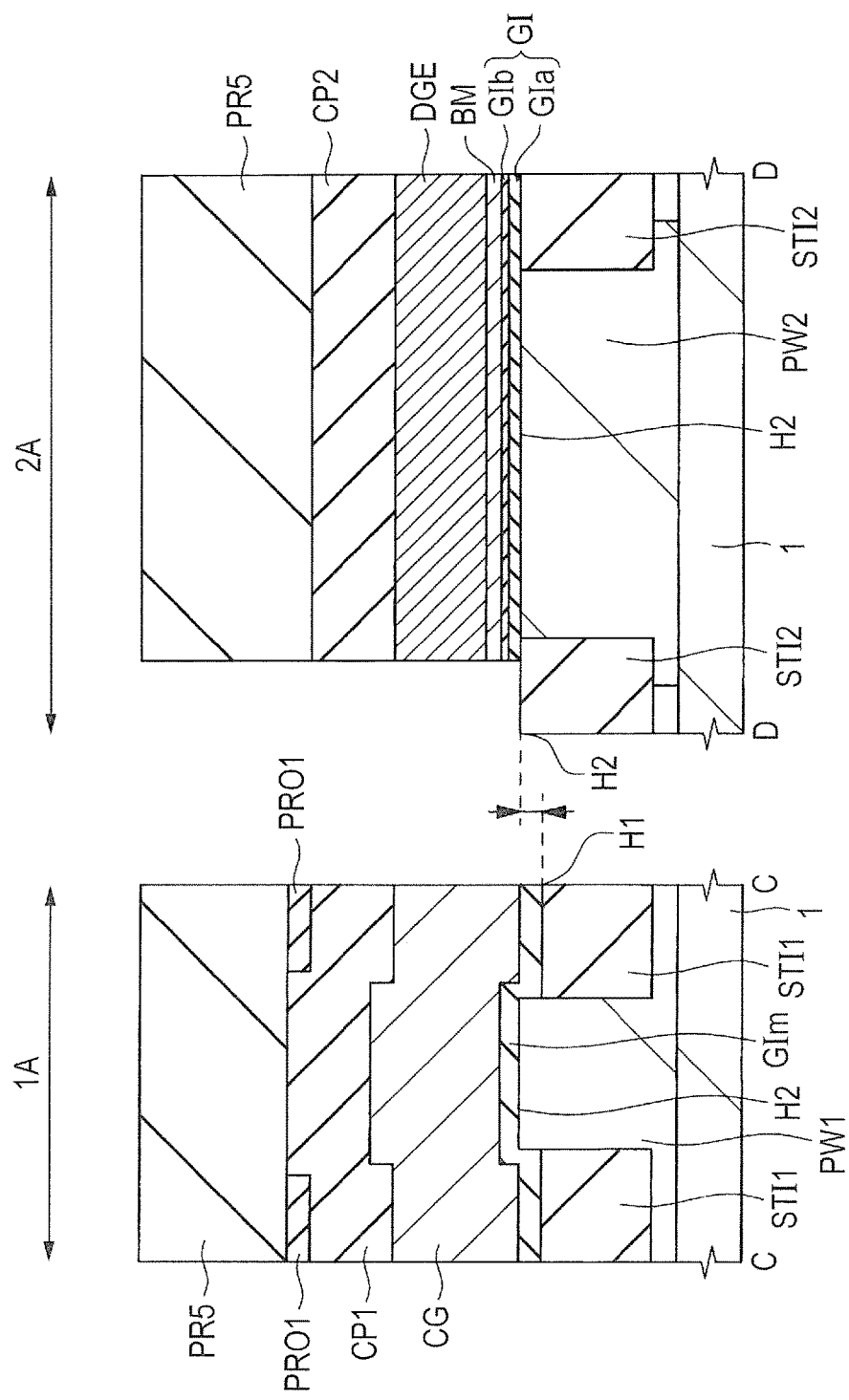
FIG. 35 is a cross section of the main part illustrating a process of manufacturing the semiconductor device of the first embodiment.

As illustrated in FIGS. 34 and 35, a photoresist film PR5 is formed in the formation region of the gate electrode GE in the peripheral circuit region 2A and the memory cell region 1A. By etching the dummy gate electrode DGE and the like using the photoresist film PR5 as a mask, the dummy gate electrode DGE is formed in the formation region of the gate electrode GE in the peripheral circuit region 2A. Over the dummy gate electrode DGE, the cap insulating film CP2 remains. Below the dummy gate electrode DGE, the metal film BM and the gate insulating film GI are formed. After that, the photoresist film PR5 is removed.

Figure 36:
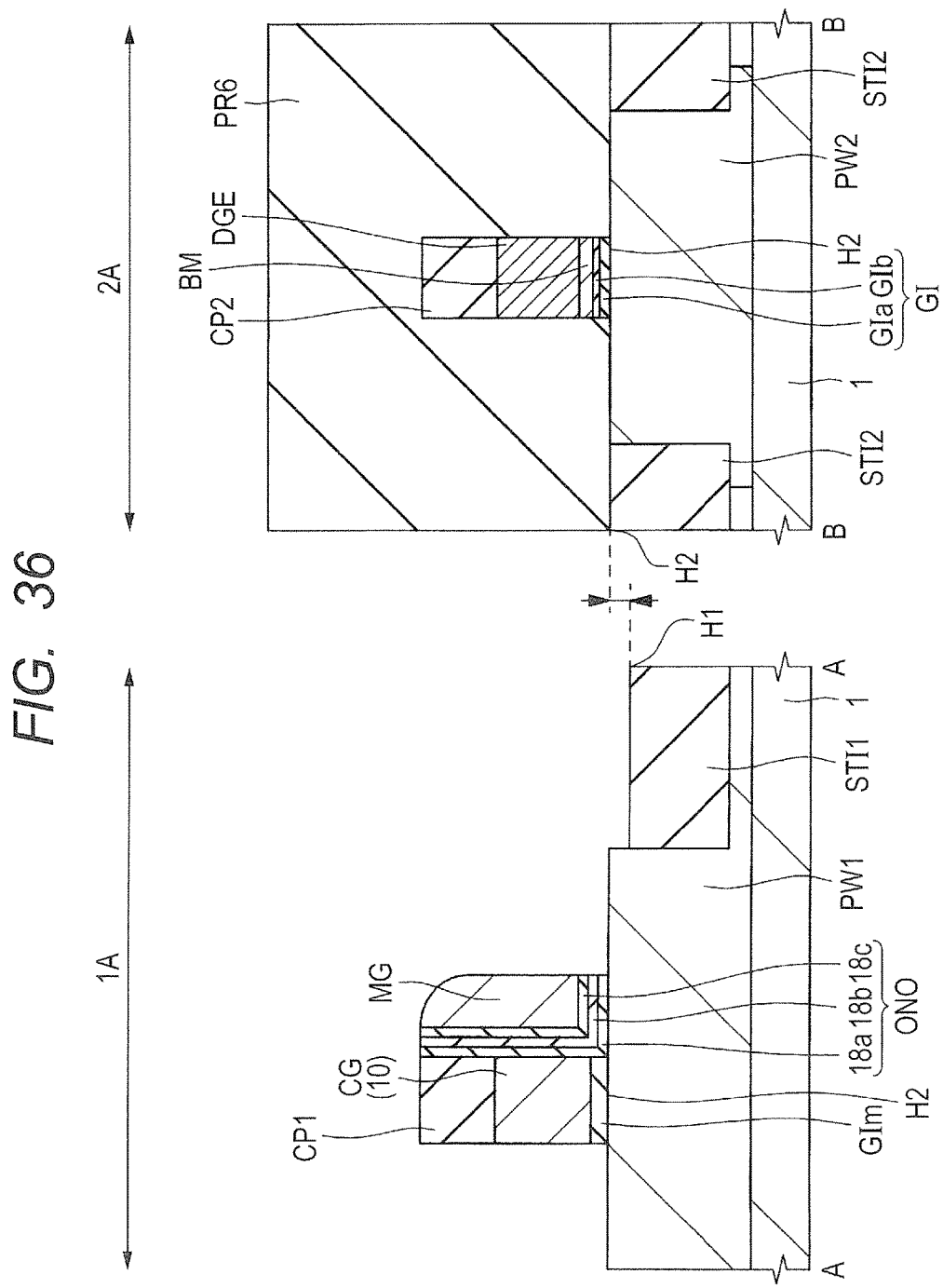
FIG. 36 is a cross section of the main part illustrating a process of manufacturing the semiconductor device of the first embodiment.
Figure 37:
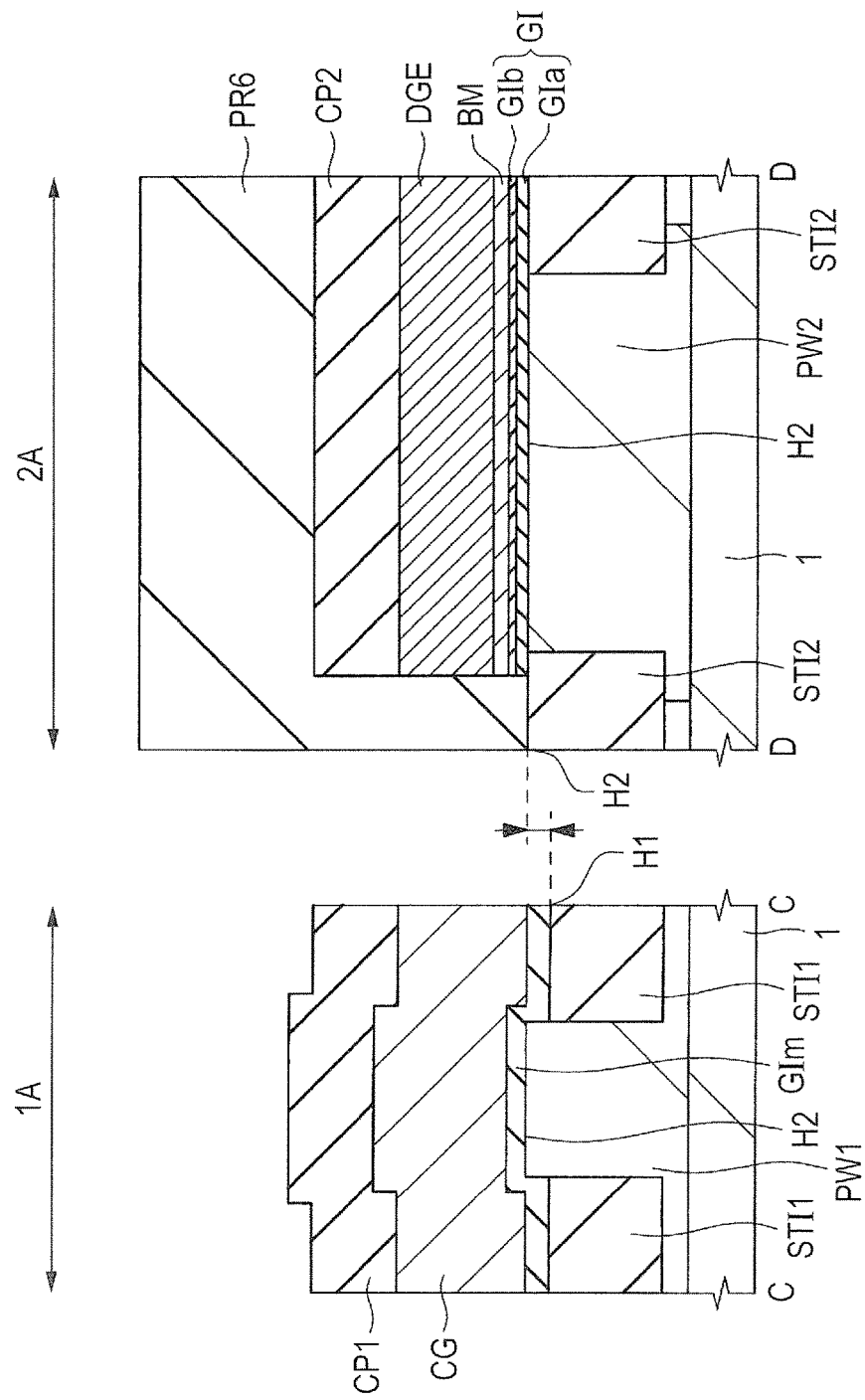
FIG. 37 is a cross section of the main part illustrating a process of manufacturing the semiconductor device of the first embodiment.

As illustrated in FIGS. 36 and 37, the peripheral circuit region 2A is covered with a photoresist film PR6 and the protection film PRO1 in the memory cell region 1A is removed by etching. As the etching, wet etching is performed. By the wet etching, the surface of the semiconductor substrate 1 (p-type well PW1) and the element isolation region STI1 in the memory cell region 1A are exposed. After that, the photoresist film PR6 is removed. By the operation, the surface of the semiconductor substrate 1 (p-type well PW2) in the peripheral circuit region 2A and the surface of the element isolation region STI2 are exposed (FIGS. 38 and 39).

Figure 38:
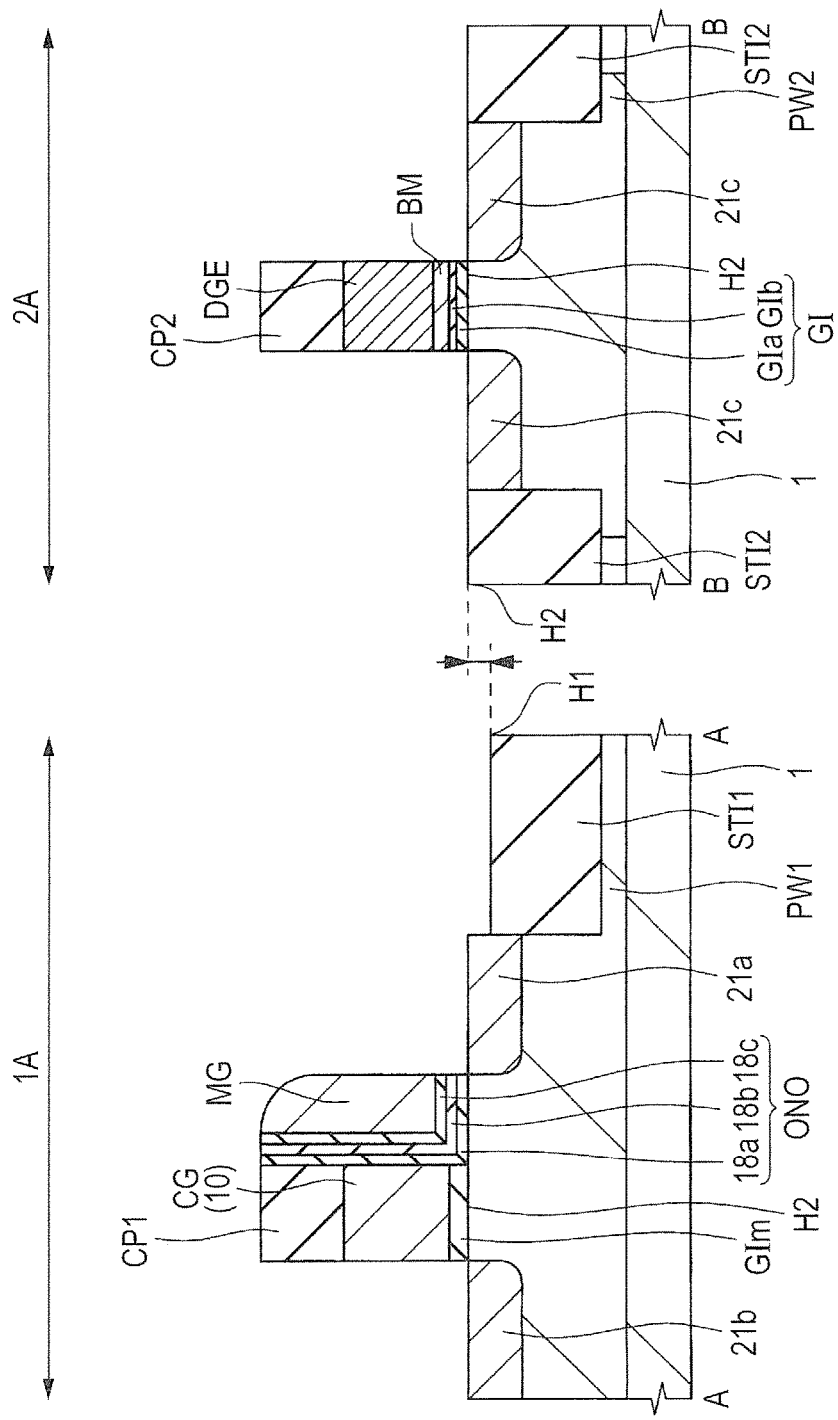
FIG. 38 is a cross section of the main part illustrating a process of manufacturing the semiconductor device of the first embodiment.
Figure 39:
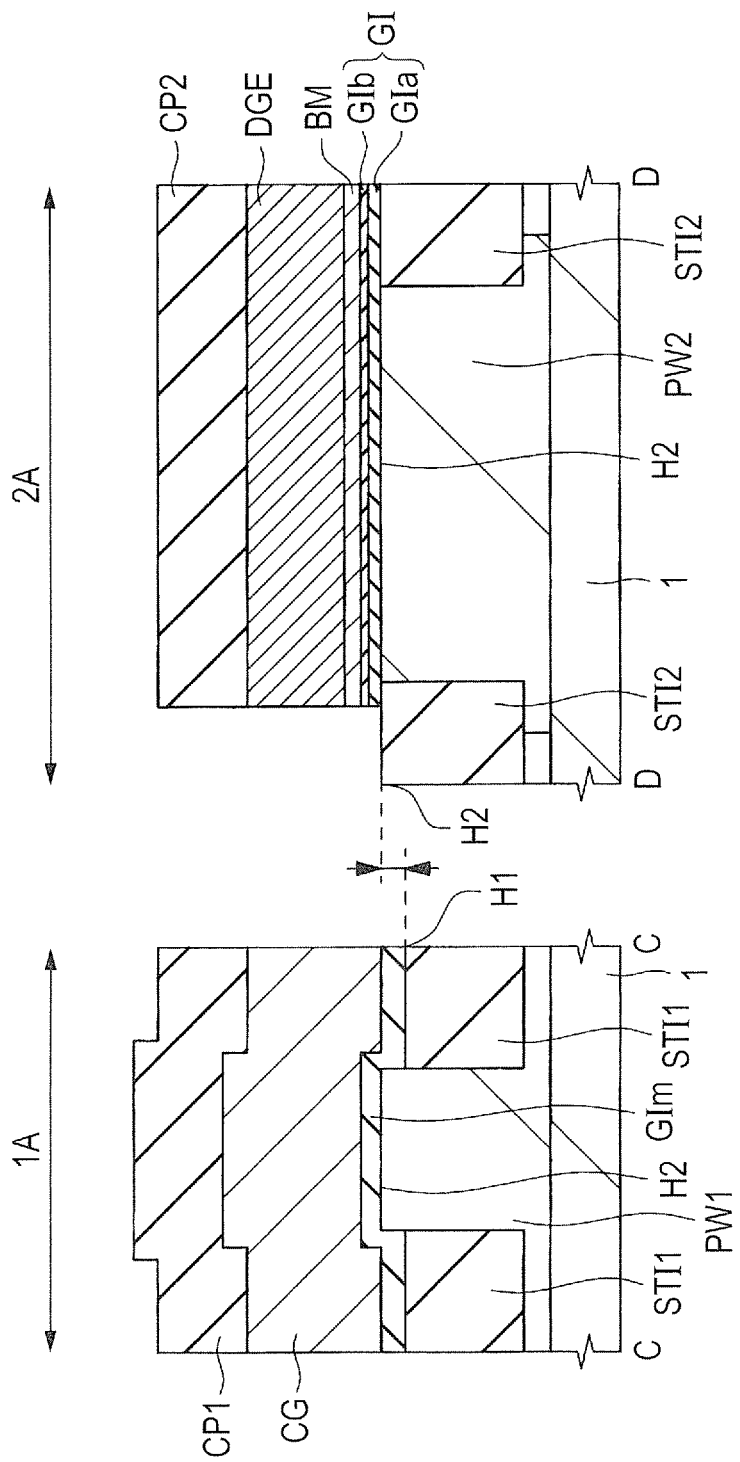
FIG. 39 is a cross section of the main part illustrating a process of manufacturing the semiconductor device of the first embodiment.

As illustrated in FIGS. 38 and 39, the n⁻ type semiconductor regions 21a, 21b, and 21c are formed. In this case, an n-type impurity such as arsenic (As) or phosphor (P) is introduced into the p-type wells PW1 and PW2 using the control gate electrode CG, the memory gate electrode MG, and the dummy gate electrode DGE as a mask. The impurity is introduced by using the ion implantation method or the like. By the above, the n⁻ type semiconductor regions 21a, 21b, and 21c are formed. In the ion implantation process, the ion implantation condition may be changed for each of the n⁻ type semiconductor regions 21a, 21b, and 21c are formed. Although not illustrated, to prevent or suppress the short channel effect, a pocket region or a halo region may be formed by the memory cell region 1A and the peripheral circuit region 2A so as to surround the n⁻ type semiconductor regions 21a, 21b, and 21c.

Although not illustrated, prior to the ion implantation process, an offset spacer may be formed on both sides of each of a composite of the control gate electrode CG and the memory gate electrode MG and the dummy gate electrode DGE. For example, over the semiconductor substrate 1 including the control gate electrode CG, the memory gate electrode MG, and the dummy gate electrode DGE, an insulating film which is a silicon nitride film or the like is formed. The thickness of the insulating film is, for example, about 5 to 10 nm. The insulating film can be formed by the CVD method or the like. The insulating film is etched back by the anisotropic etching. In such a manner, in the memory cell region 1A, the offset spacer can be formed on the sidewalls on both sides of the composite of the control gate electrode CG and the memory gate electrode MG. In the peripheral circuit region 2A, the offset spacer can be formed on the sidewalls on both sides of the dummy gate electrode DGE.

Figure 40:
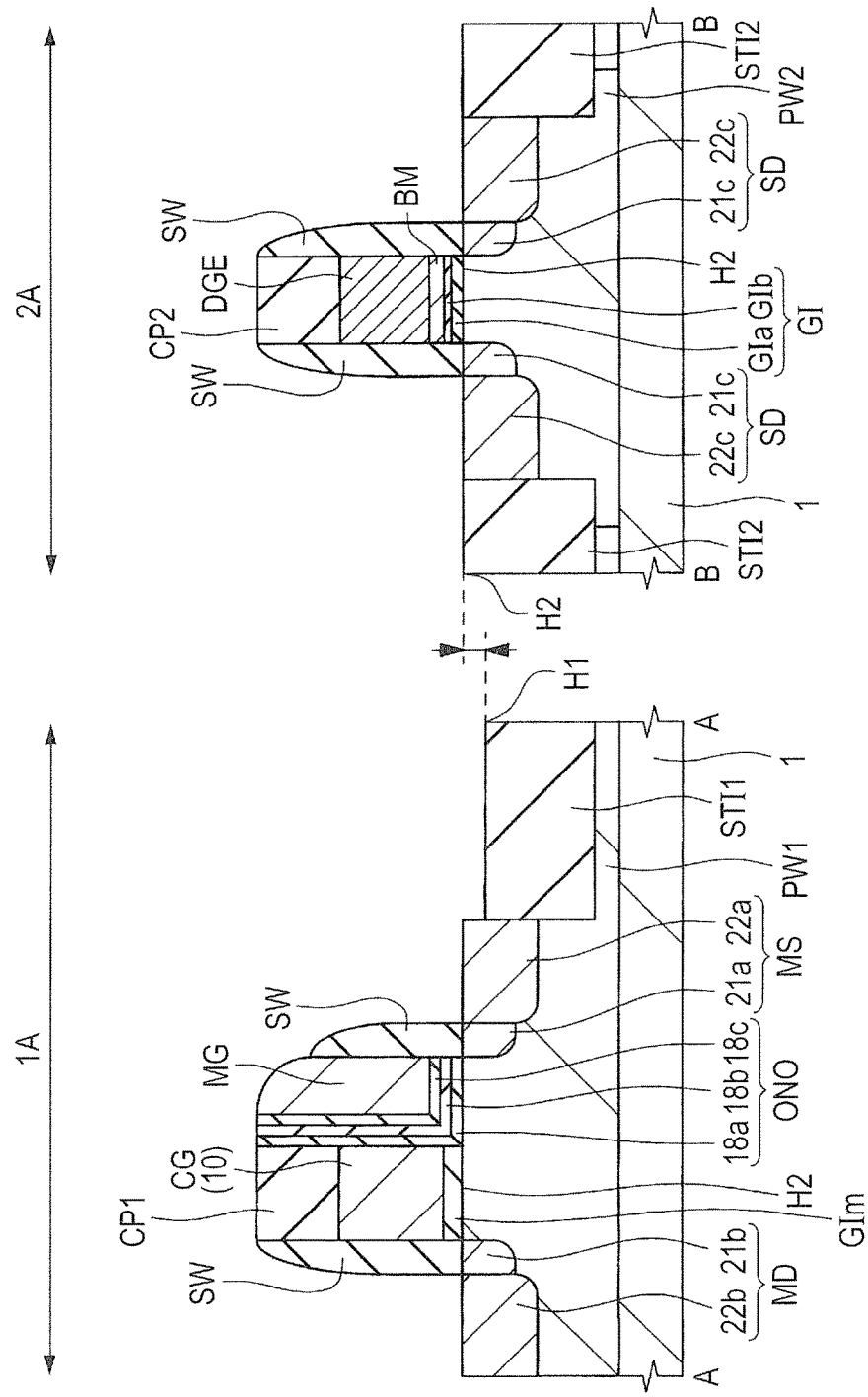
FIG. 40 is a cross section of the main part illustrating a process of manufacturing the semiconductor device of the first embodiment.
Figure 41:
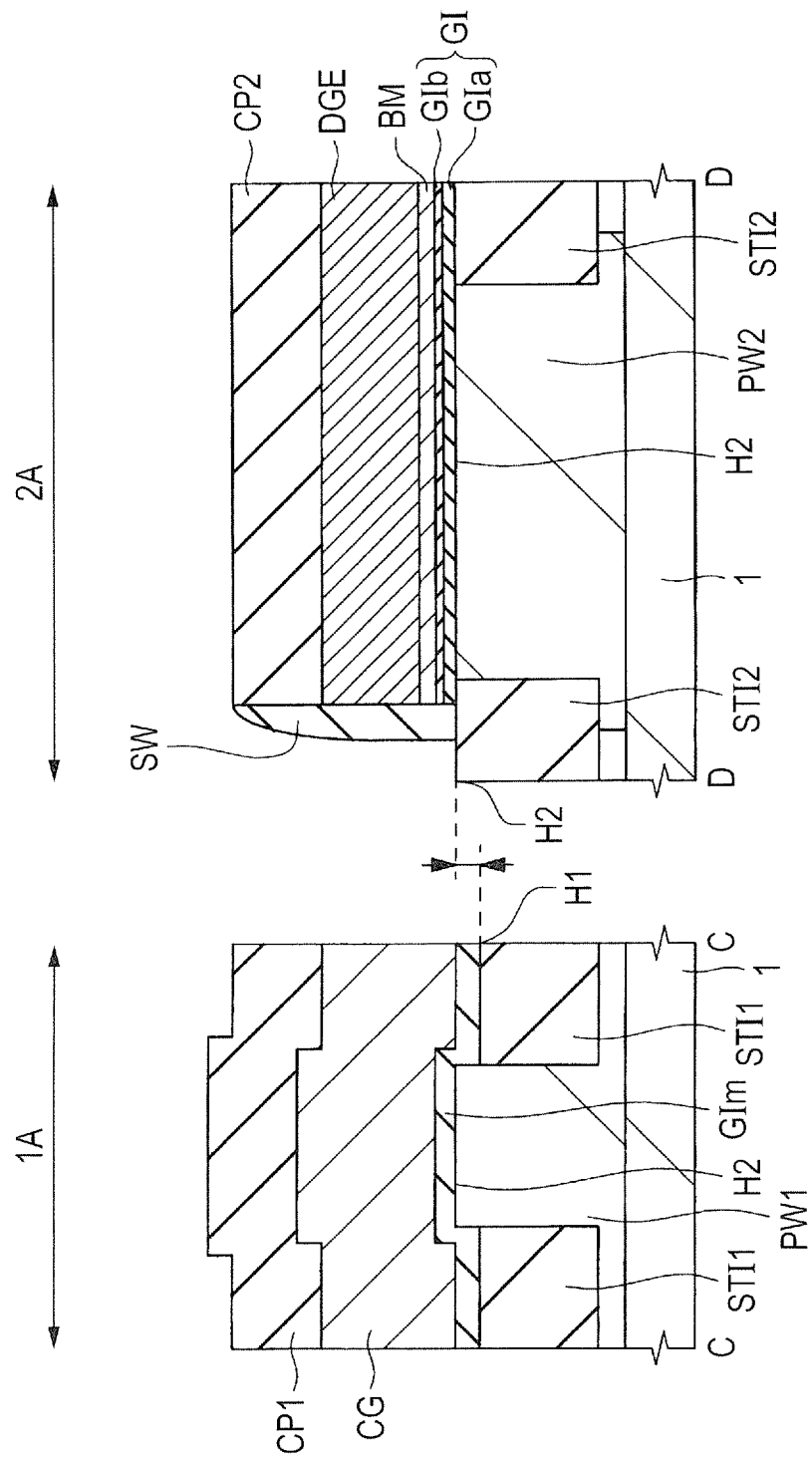
FIG. 41 is a cross section of the main part illustrating a process of manufacturing the semiconductor device of the first embodiment.

As illustrated in FIGS. 40 and 41, the sidewall spacers SW are formed on the sidewalls on both sides of the composite of the control gate electrode CG and the memory gate electrode MG and the sidewalls on both sides of the dummy gate electrode DGE. For example, over the semiconductor substrate 1 including the control gate electrode CG, the memory gate electrode MG, and the dummy gate electrode DGE, an insulating film which is a silicon nitride film or the like is formed. The insulating film is etched back by anisotropic etching. In such a manner, in the memory cell region 1A, the sidewall spacer SW can be formed on the sidewalls on both sides of the composite of the control gate electrode CG and the memory gate electrode MG. In the peripheral circuit 2A, the sidewall spacer SW can be formed on the sidewalls on both sides of the dummy gate electrode DGE.

Subsequently, the n+ type semiconductor regions 22a, 22b, and 22c are formed. In this case, an n-type impurity such as arsenic (As) or phosphor (P) is introduced into the p-type wells PW1 and PW2 using the control gate electrode CG, the memory gate electrode MG, the dummy gate electrode DGE, and the sidewall spacer SW as a mask. The impurity is introduced by using the ion implantation method or the like. By the above, the n$^+$ type semiconductor regions 22a, 22b, and 22c are formed. In the ion implantation process, the ion implantation condition may be changed for each of the n$^+$ type semiconductor regions 22a, 22b, and 22c. Subsequently, heat treatment (activation annealing) is performed to activate the impurity in the n$^-$ type semiconductor regions 21a, 21b, and 21c and the n+ type semiconductor regions 22a, 22b, and 22c.

Figure 42:
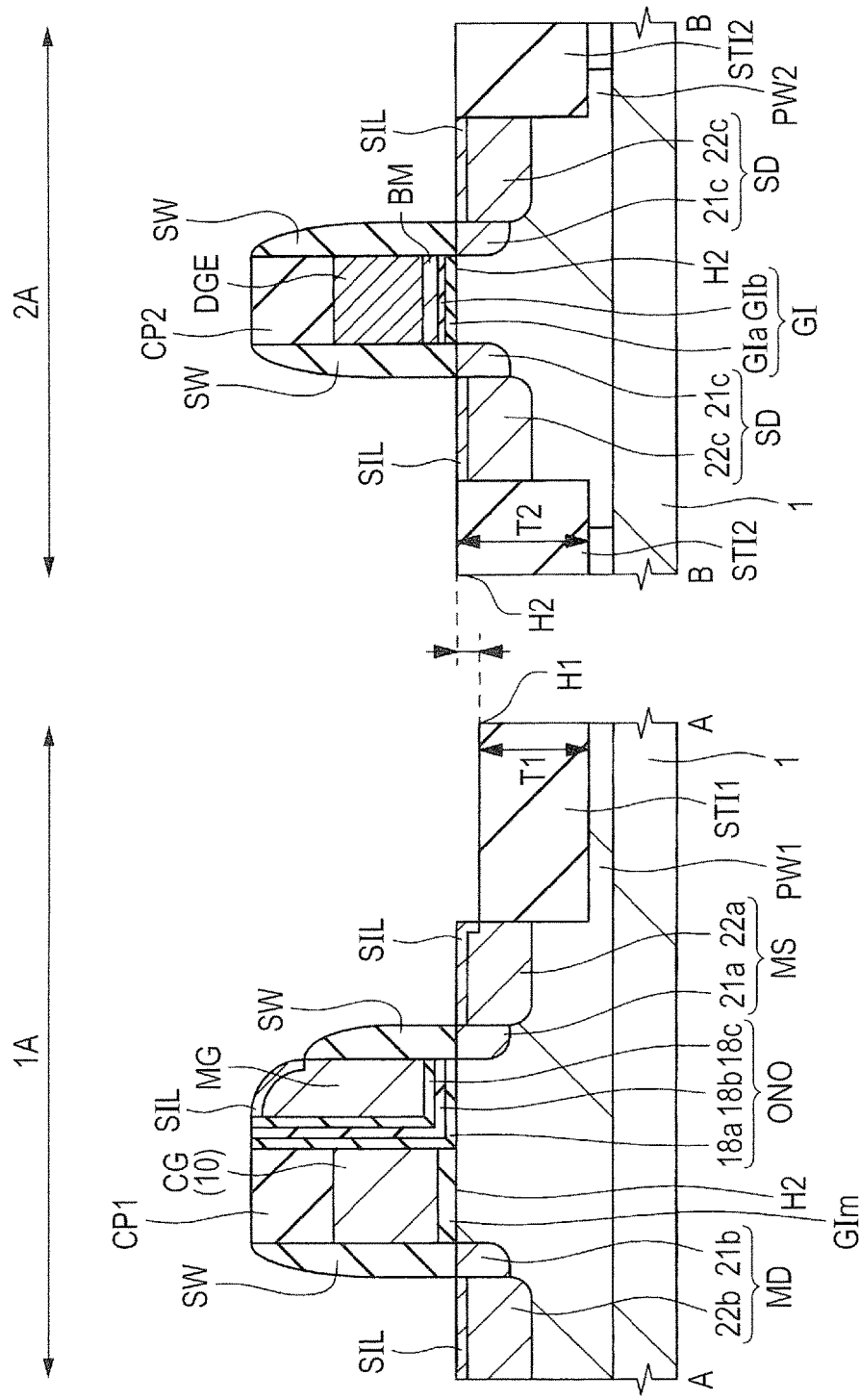
FIG. 42 is a cross section of the main part illustrating a process of manufacturing the semiconductor device of the first embodiment.
Figure 43:
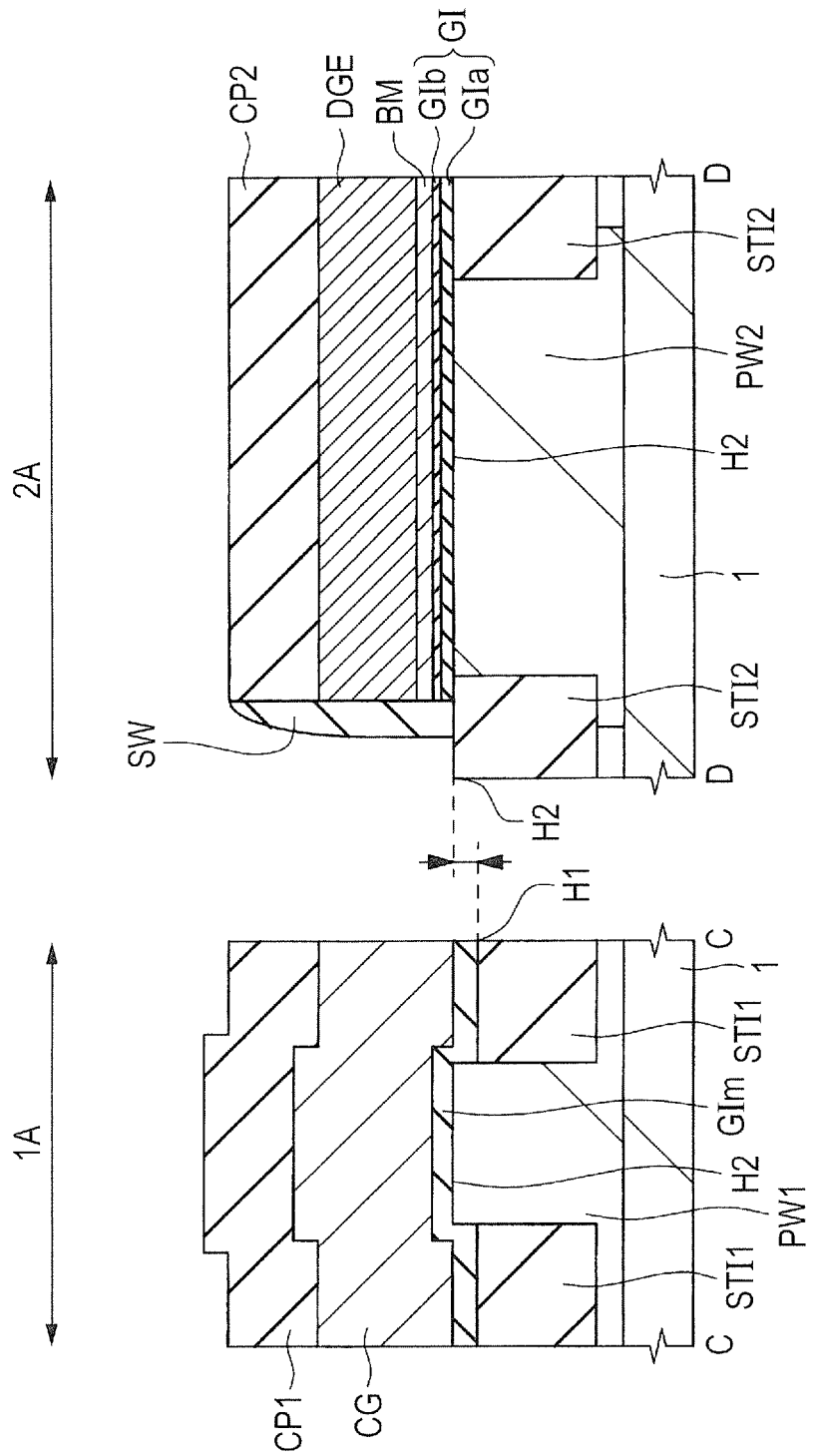
FIG. 43 is a cross section of the main part illustrating a process of manufacturing the semiconductor device of the first embodiment.

As illustrated in FIGS. 42 and 43, the metal silicide film SIL is formed. Over the semiconductor substrate 1 including the memory gate electrode MG, a metal film (not illustrated) is formed. As the metal film, for example, a cobalt (Co) film, a nickel (Ni) film, or a nickel platinum alloy film can be used. The metal film can be formed by using the sputtering method or the like. Subsequently, by performing heat treatment, a silicidation reaction is caused in a coupling part of the metal film and the n$^+$ type semiconductor region and a coupling part of the metal film and the memory gate electrode MG. By the operation, the metal silicide layer SIL is formed over the n$^+$ type semiconductor regions 22a, 22b, and 22c. The metal silicide layer SIL is formed also over the memory gate electrode MG. As the metal silicide layer SIL, a cobalt silicide layer, a nickel silicide layer, a platinum-added nickel silicide layer, or the like can be used. After that, the unreacted metal film is removed. By performing such a so-called salicide process, the metal silicide layer SIL can be formed over the n$^+$ type semiconductor regions 22a, 22b, and 22c. The metal silicide layer SIL can be formed also over the memory gate electrode MG.

Figure 44:
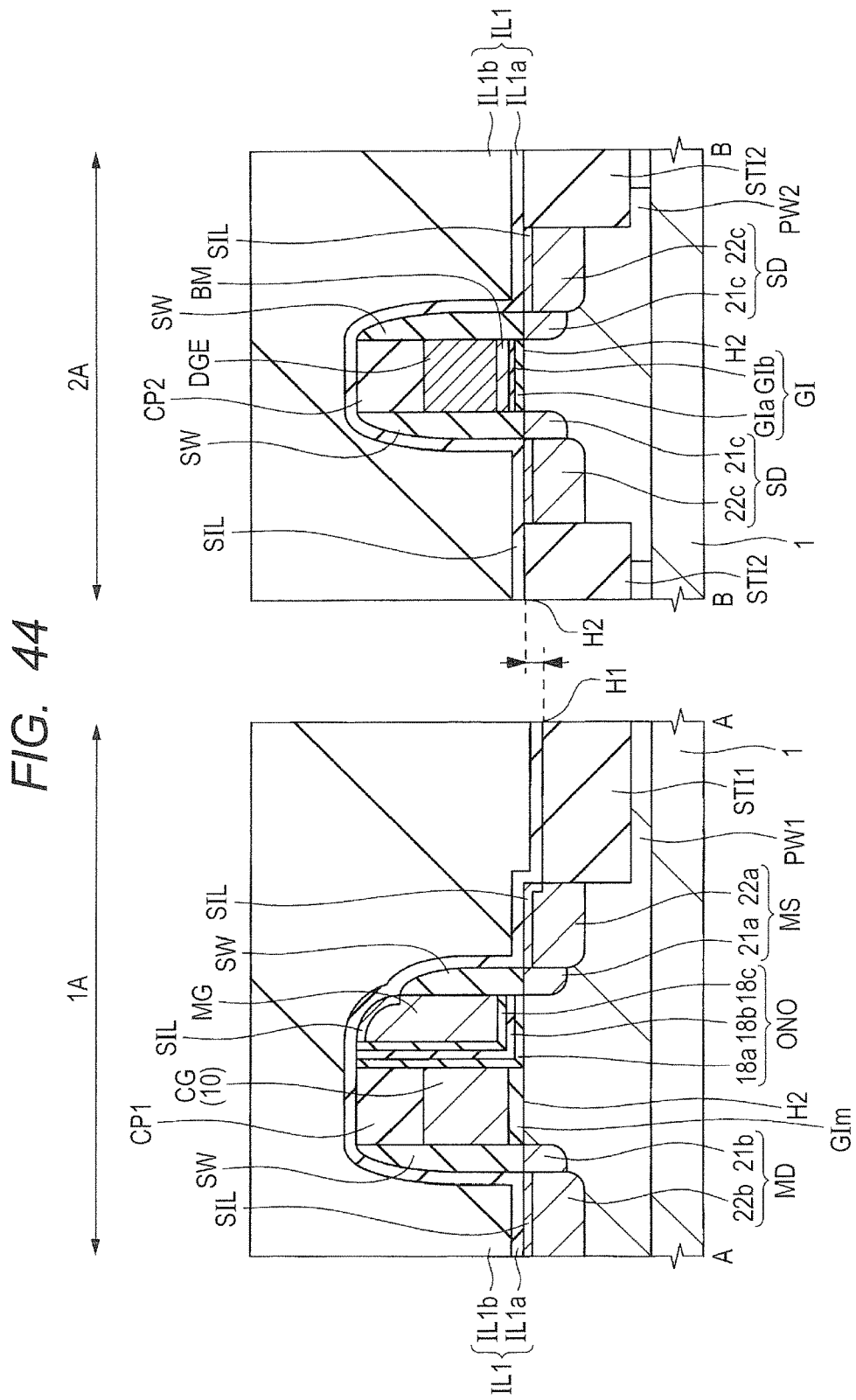
FIG. 44 is a cross section of the main part illustrating a process of manufacturing the semiconductor device of the first embodiment.
Figure 45:
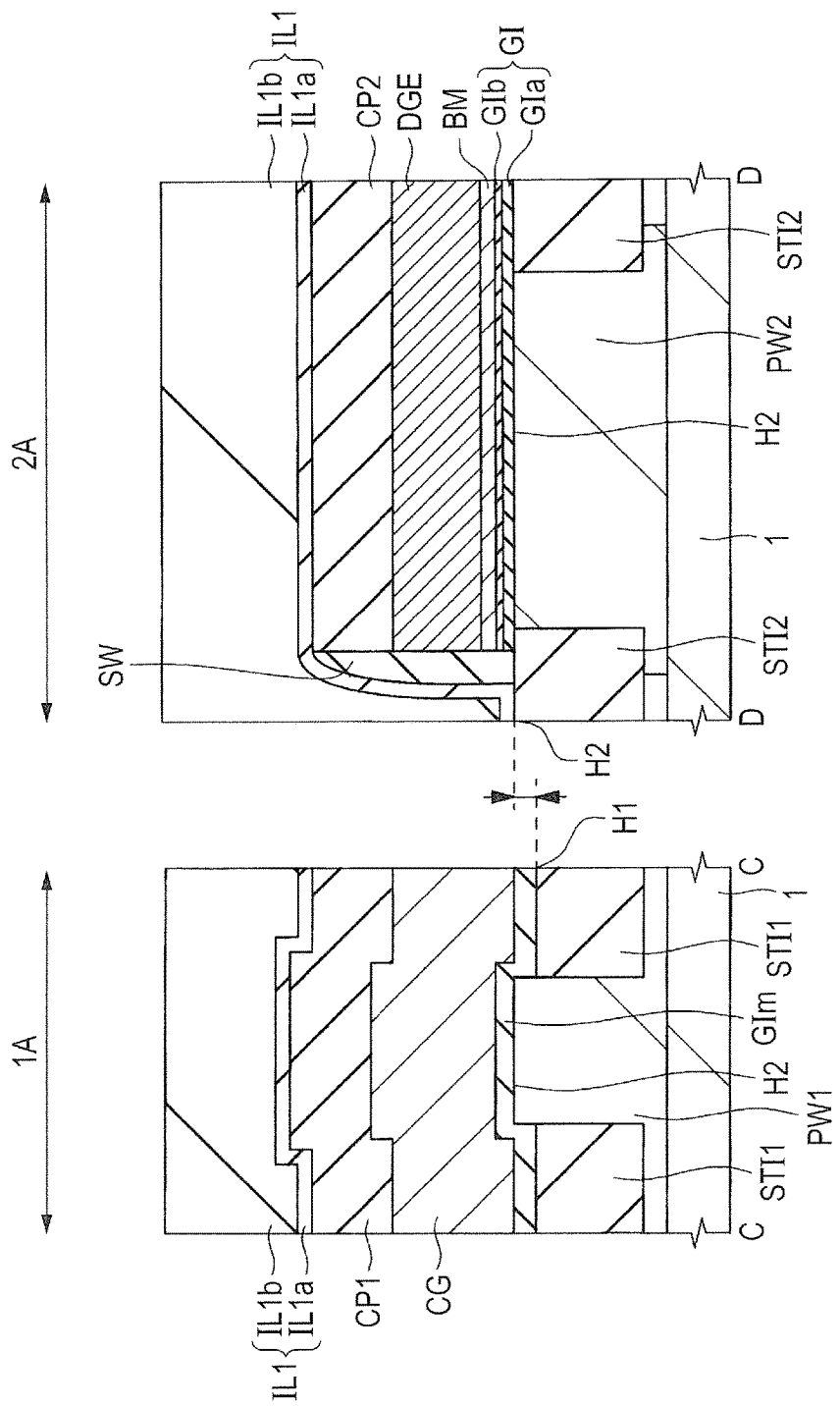
FIG. 45 is a cross section of the main part illustrating a process of manufacturing the semiconductor device of the first embodiment.

As illustrated in FIGS. 44 and 45, the interlayer insulating film IL1 is formed. The interlayer insulating film IL1 is, for example, a stack film of the thin silicon nitride film IL1a and the thick silicon oxide film IL1b. The thin silicon nitride film IL1a has the function of an etching stopper. For example, over the semiconductor substrate 1, the stack film is formed with a thickness to the degree of burying the control gate electrode CG, the memory gate electrode MG, the dummy gate electrode DGE, and the sidewall spacer SW. The interlayer insulating film IL1 (the silicon nitride film IL1a and the silicon oxide film IL1b) can be formed by using the CVD method or the like.

Figure 46:
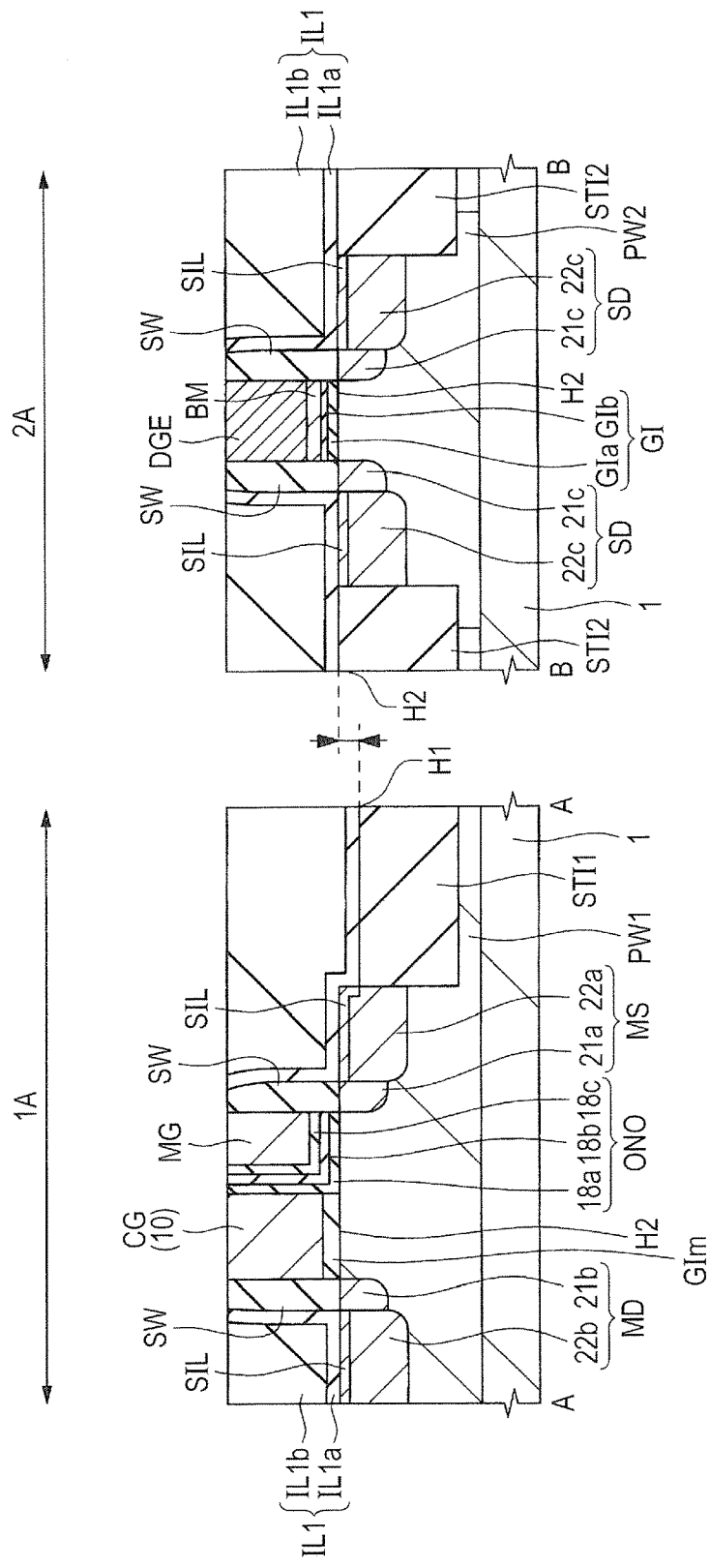
FIG. 46 is a cross section of the main part illustrating a process of manufacturing the semiconductor device of the first embodiment.
Figure 47:
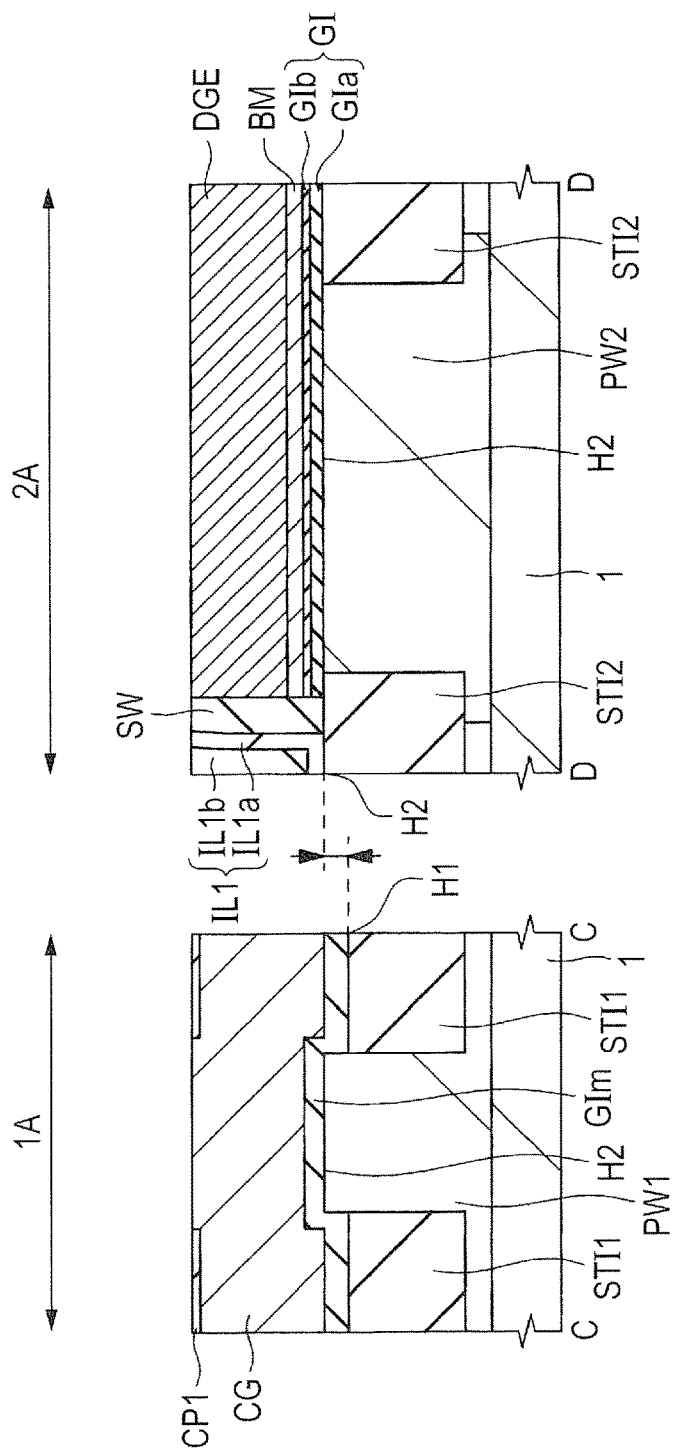
FIG. 47 is a cross section of the main part illustrating a process of manufacturing the semiconductor device of the first embodiment.

As illustrated in FIGS. 46 and 47, the upper part of the interlayer insulating film IL1 is removed. For example, the upper part of the interlayer insulating film IL1 is polished by using the CMP method or the like until the control gate electrode CG and the dummy gate electrode DGE are exposed. By the operation, planarization is made so that the height of the memory cell region 1A and the peripheral circuit region 2A becomes the height of the control gate electrode CG and the dummy gate electrode DGE. In the example illustrated in FIG. 46, the metal silicide layer SIL formed over the surface of the memory gate electrode MG is removed.

Figure 48:
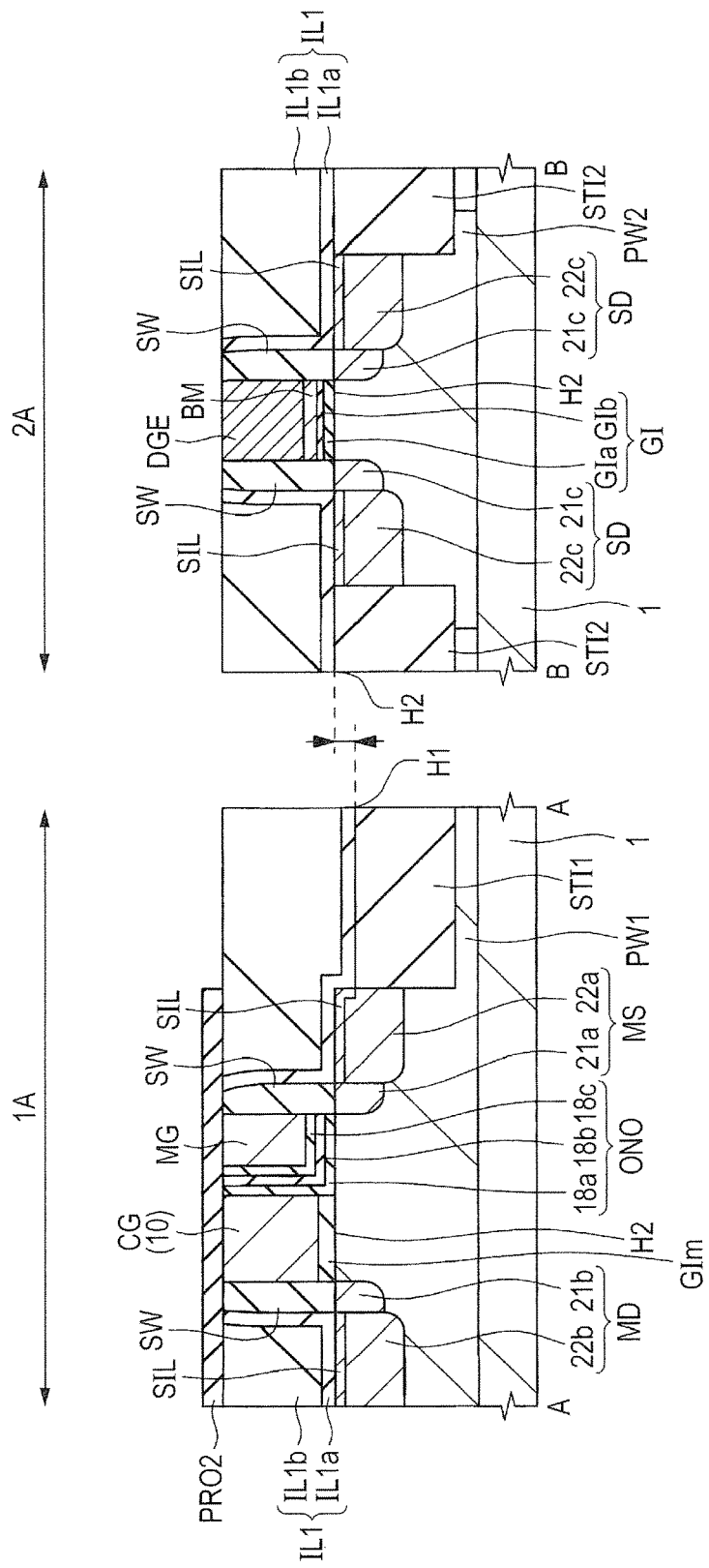
FIG. 48 is a cross section of the main part illustrating a process of manufacturing the semiconductor device of the first embodiment.
Figure 49:
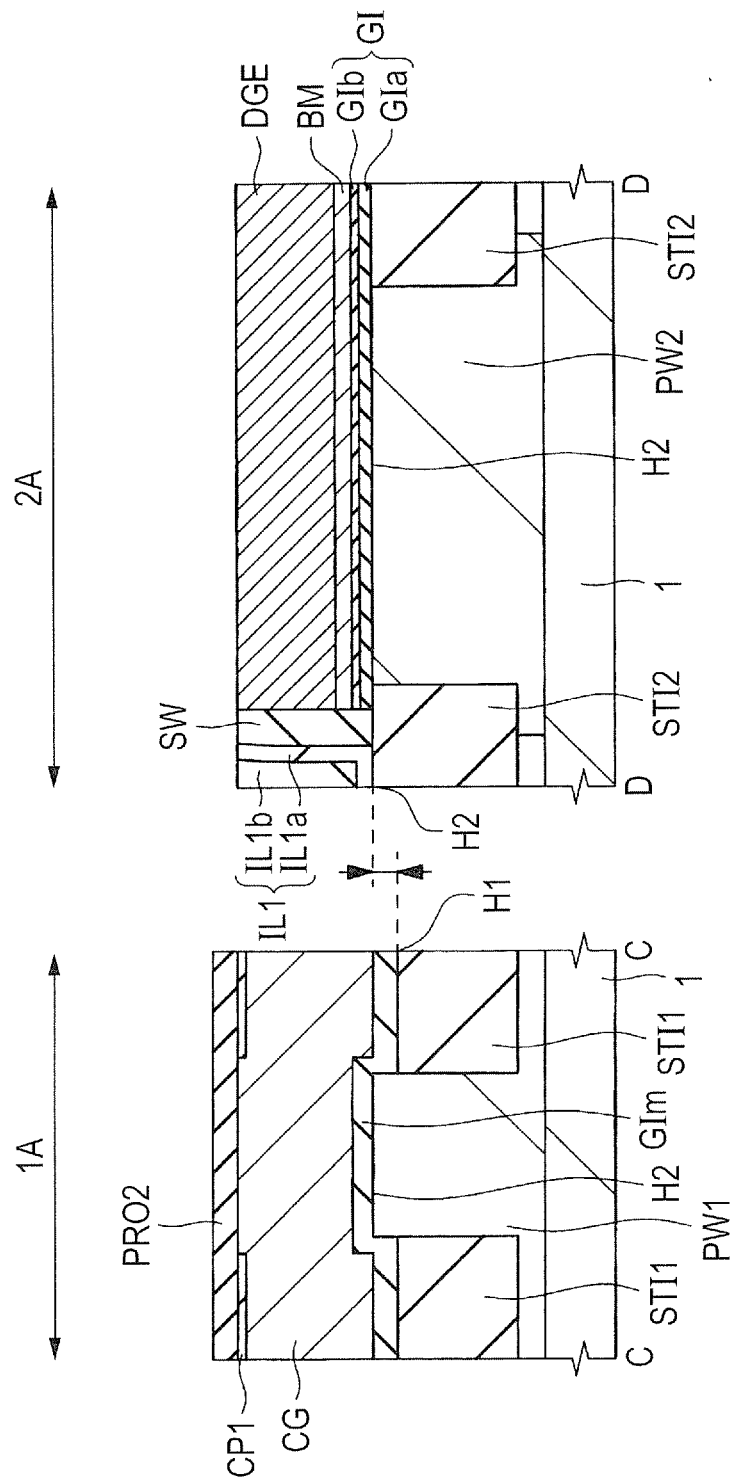
FIG. 49 is a cross section of the main part illustrating a process of manufacturing the semiconductor device of the first embodiment.

As illustrated in FIGS. 48 and 49, a protection film PRO2 covering the surface of the control gate electrode CG and the memory gate electrode MG in the memory cell region 1A is formed. For example, an insulating film which is a silicon oxide film or the like is formed over the semiconductor substrate 1 and patterned by using the photolithography technique and the etching technique. As a result, the surface of the control gate electrode CG and the memory gate electrode MG in the memory cell region 1A is covered with the protection film PRO2, and the surface of the dummy gate electrode DGE in the peripheral circuit region 2A is exposed.

Figure 50:
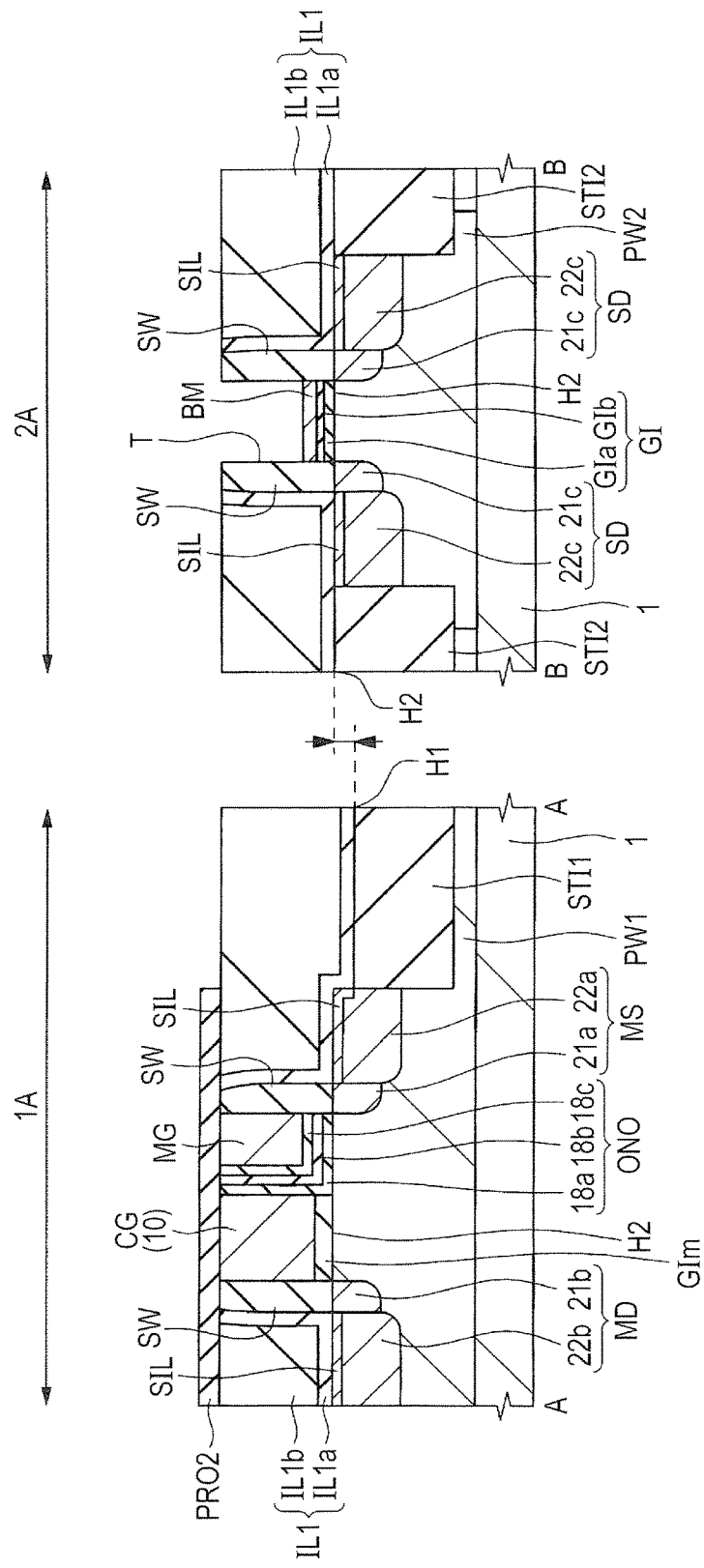
FIG. 50 is a cross section of the main part illustrating a process of manufacturing the semiconductor device of the first embodiment.
Figure 51:
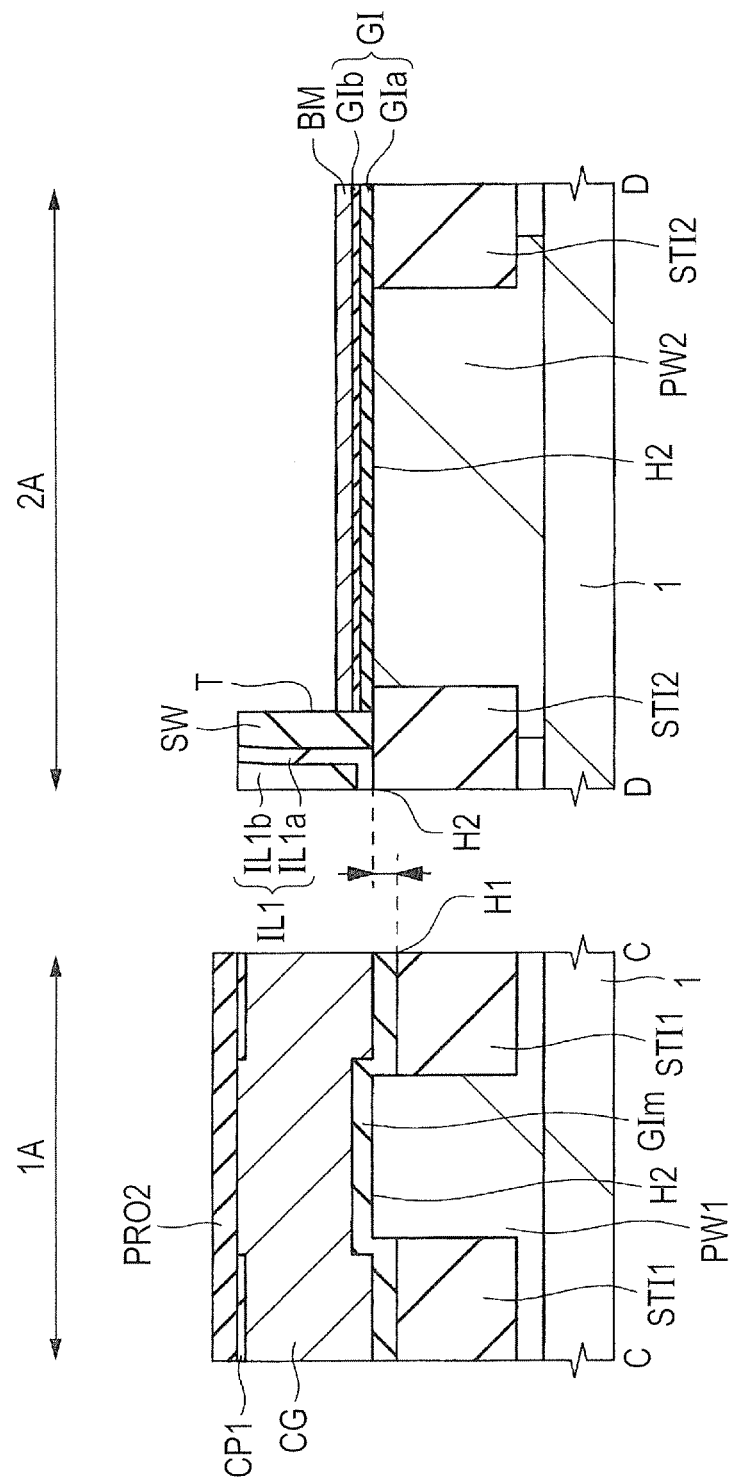
FIG. 51 is a cross section of the main part illustrating a process of manufacturing the semiconductor device of the first embodiment.

As illustrated in FIGS. 50 and 51, the exposed dummy gate electrode DGE is removed by etching. By the operation, the trench T is formed in the part from which the dummy gate electrode DGE is removed. In the bottom of the trench T, the metal film BM is exposed. In the side faces of the trench T, the sidewall spacers SW are exposed. In such a manner, the metal film BM functions as the etching stopper.

Figure 52:
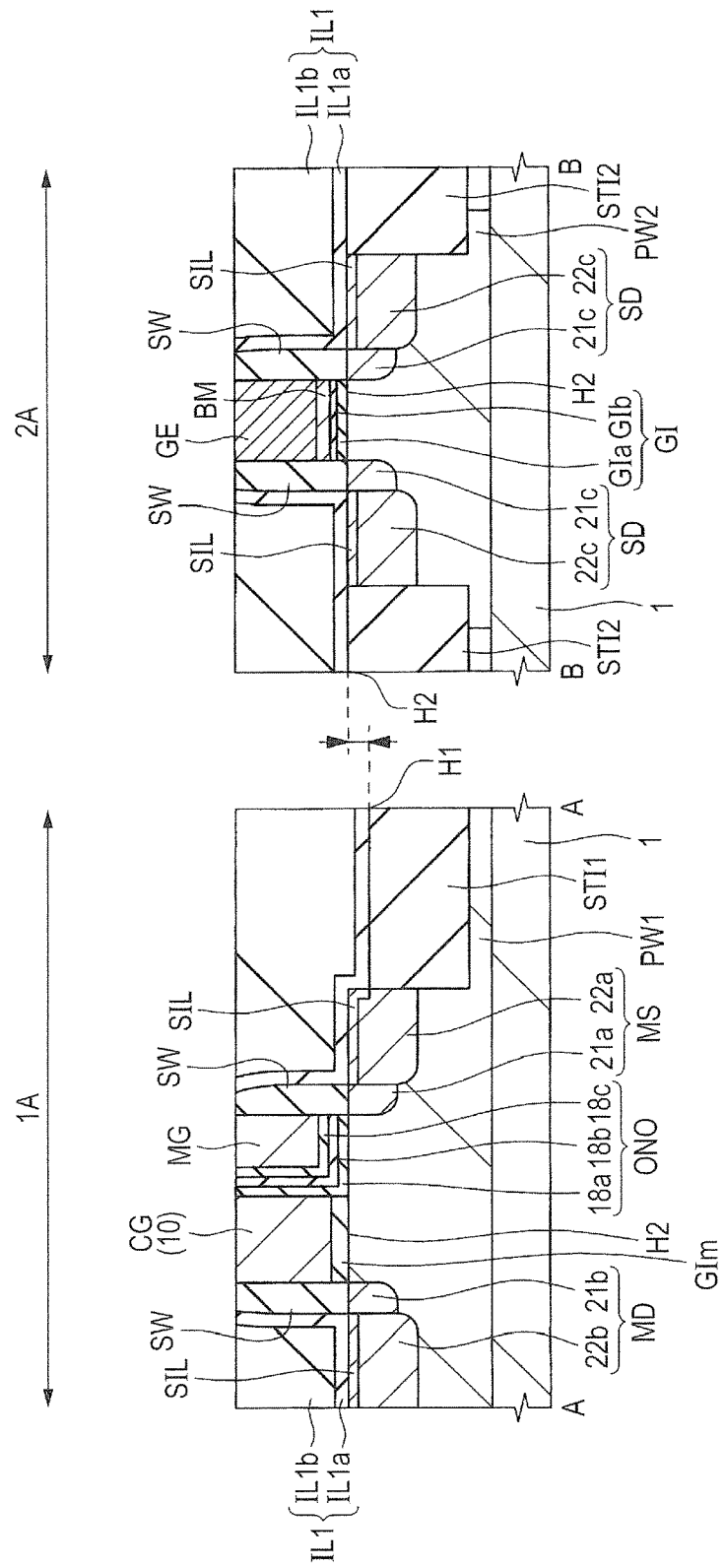
FIG. 52 is a cross section of the main part illustrating a process of manufacturing the semiconductor device of the first embodiment.
Figure 53:
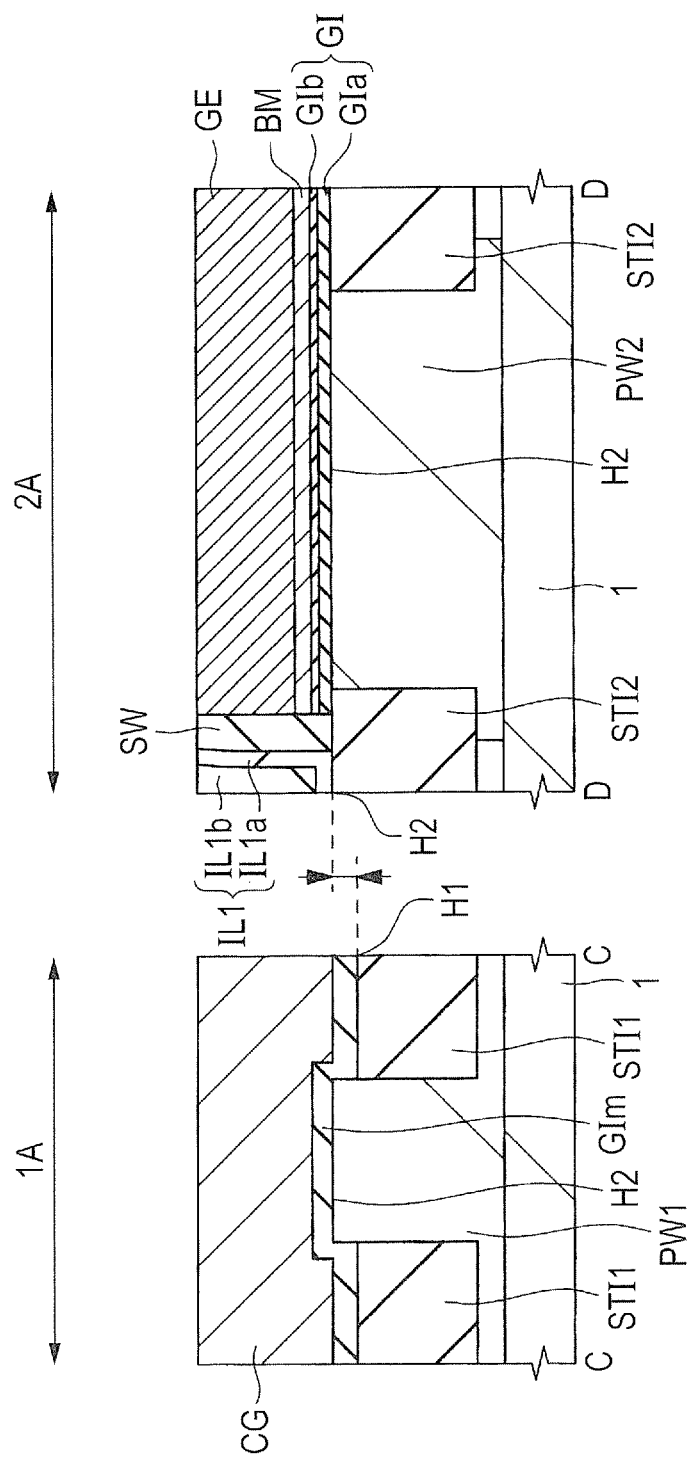
FIG. 53 is a cross section of the main part illustrating a process of manufacturing the semiconductor device of the first embodiment.

As illustrated in FIGS. 52 and 53, by burying the inside of the trench T with a conductive film, the gate electrode GE is formed. As the conductive film, a metal film other than a silicon oxide film such as a polycrystal silicon film can be used. Preferably, a metal film made by an aluminum (Al) film, a tantalum nitride (TaN) film, a titanium nitride (TiN) film or the like can be used. For example, a conductive film is formed over the semiconductor substrate 1 by the sputtering method or the like and, after that, the upper part of the conductive film is polished by using the CMP method or the like, thereby burying the conductive film in the trench T. As a result, the gate electrode GE can be formed. A metal film for adjusting a work function of the gate electrode of the MISFET may be formed between the metal film BM and the conductive film. A stack body of the metal film BM and the conductive film may be regarded as the gate electrode GE.

At the time of eliminating the conductive film by polishing, the protection film PRO2 in the memory region 1A and the cap insulating film CP1 which can remain below the protection film PRO2 are removed. As described above, in a process of polishing the film in the upper layer of the dummy gate electrode DGE by the CMP method or the like (first polishing process), even when the cap insulating film CP1 remains over the control gate electrode CG (refer to FIG. 47), it is removed in a polishing process (second polishing process) performed at the time of burying the inside of the trench T with the conductive film. Particularly, when the recession amount of the surface of the element isolation region STI1 in the memory cell region 1A is in the range of 10 nm to 20 nm, the cap insulating film CP1 remaining over the control gate electrode CG is removed by the polishing process (second polishing process) performed at the time of buying the inside of the trench T with the conductive film.

Figure 54:
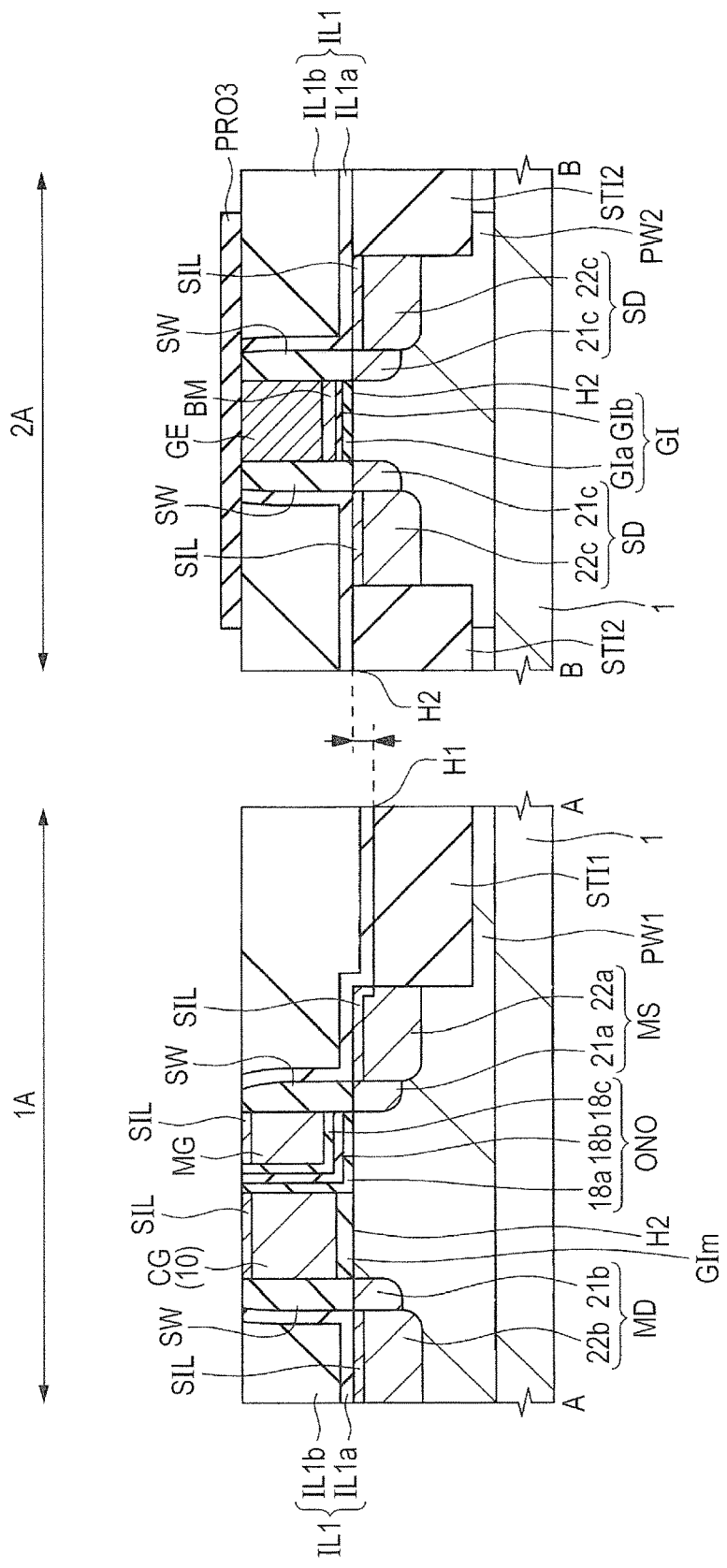
FIG. 54 is a cross section of the main part illustrating a process of manufacturing the semiconductor device of the first embodiment.
Figure 55:
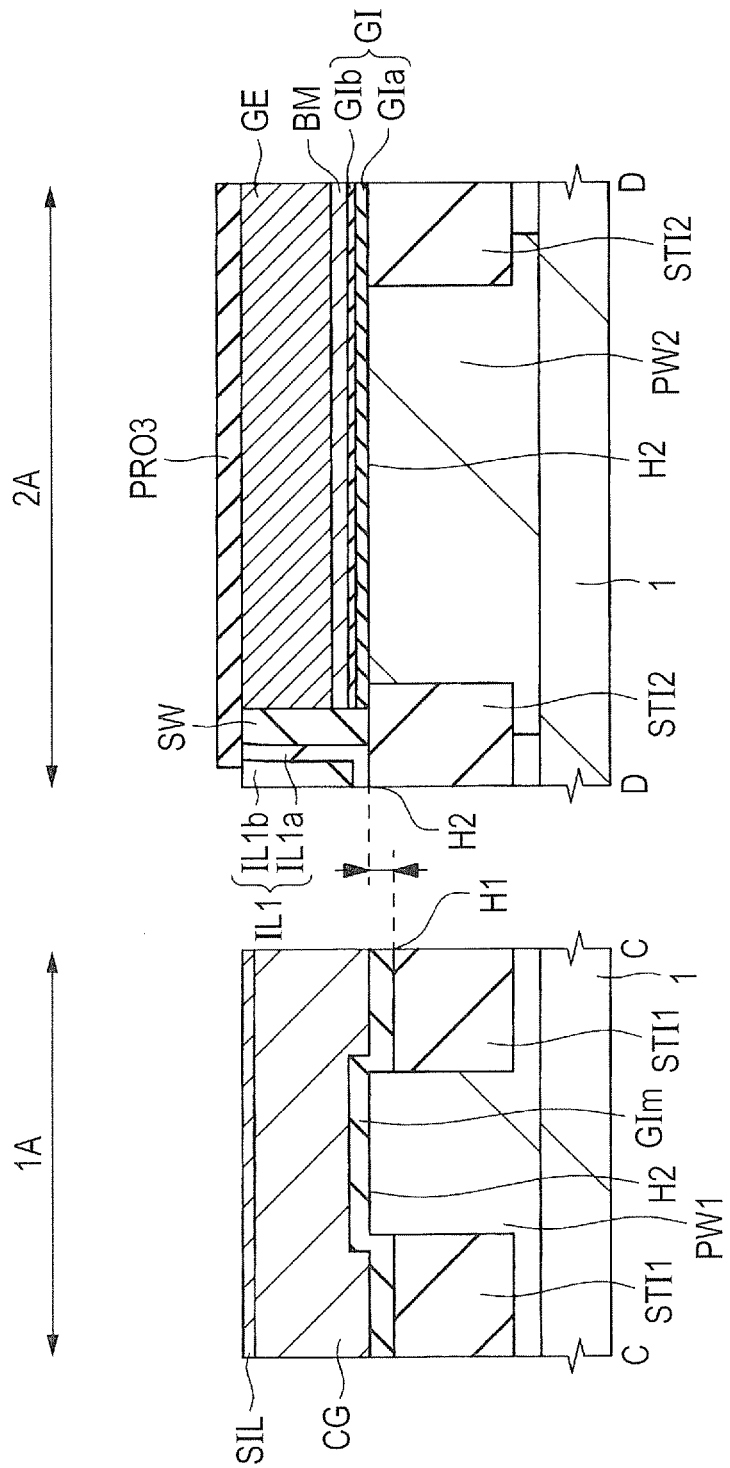
FIG. 55 is a cross section of the main part illustrating a process of manufacturing the semiconductor device of the first embodiment.

As illustrated in FIGS. 54 and 55, the protection film PROS covering the surface of the gate electrode GE in the peripheral circuit region 2A is formed, and the metal silicide layer SIL is formed over the control gate electrode CG and the memory gate electrode MG in the memory cell region 1A. First, a metal film (not illustrated) is formed over the semiconductor substrate 1 including the control gate electrode CG and the memory gate electrode MG. As the metal film, for example, a cobalt (Co) film, a nickel (Ni) film, a nickel platinum alloy film, or the like can be used. The metal film can be formed by using the sputtering method or the like. Subsequently, by performing heat treatment, a silicidation reaction is caused in a coupling part of the control gate electrode CG and the memory gate electrode MG, and the metal film. By the operation, the metal silicide layer SIL is formed over the control gate electrode CG and the memory gate electrode MG. The metal silicide layer SIL may be a cobalt silicide layer, a nickel silicide layer, a platinum-added nickel silicide layer, or the like. After that, the unreacted metal film is removed. Since the residual film (for example, the cap insulting film CP1) over the control gate electrode CG is removed as described above in the process of forming the metal silicide layer SIL, the metal silicide layer SIL can be formed with high precision over the control gate electrode CG.

Figure 56:
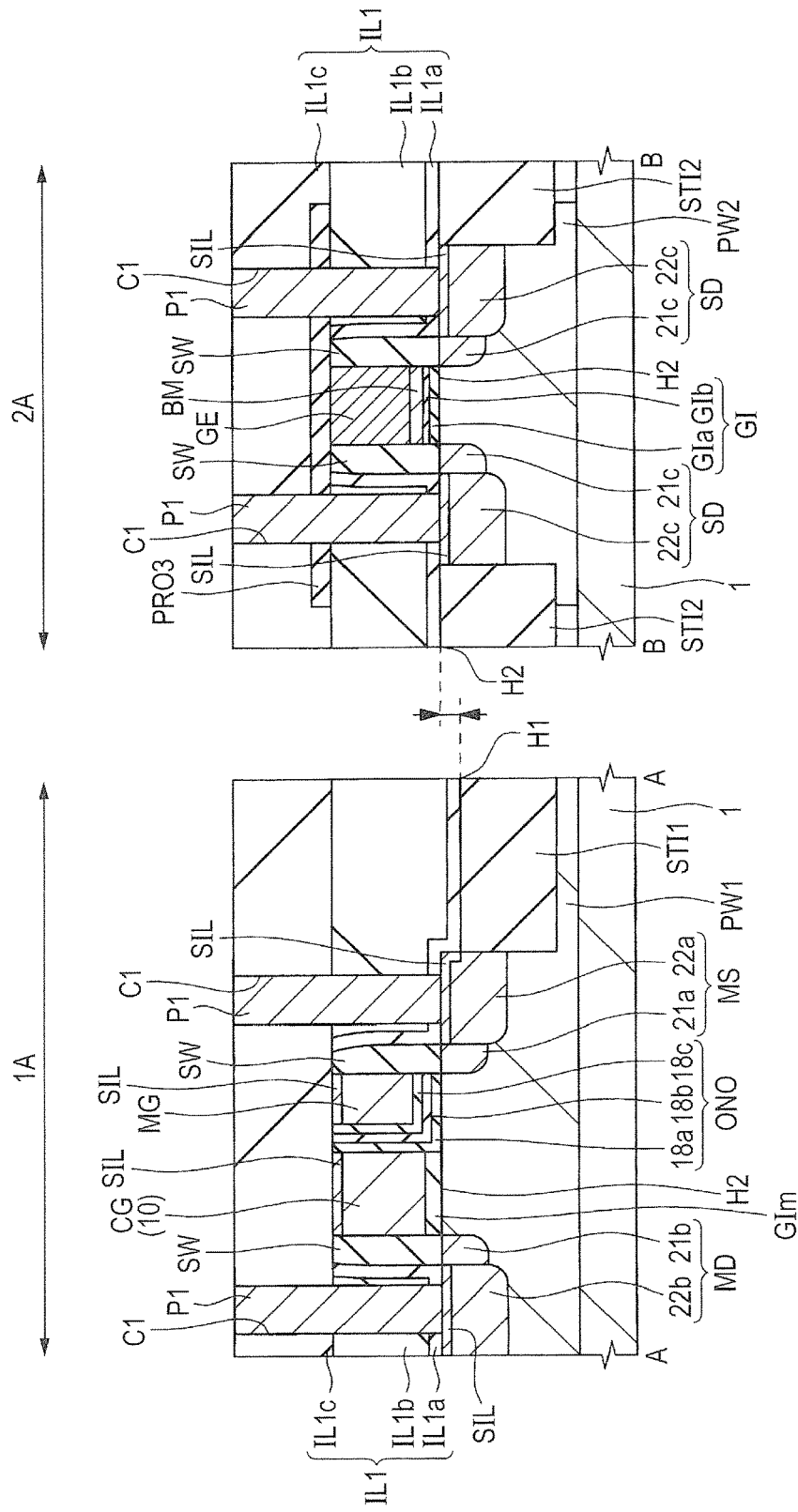
FIG. 56 is a cross section of the main part illustrating a process of manufacturing the semiconductor device of the first embodiment.
Figure 57:
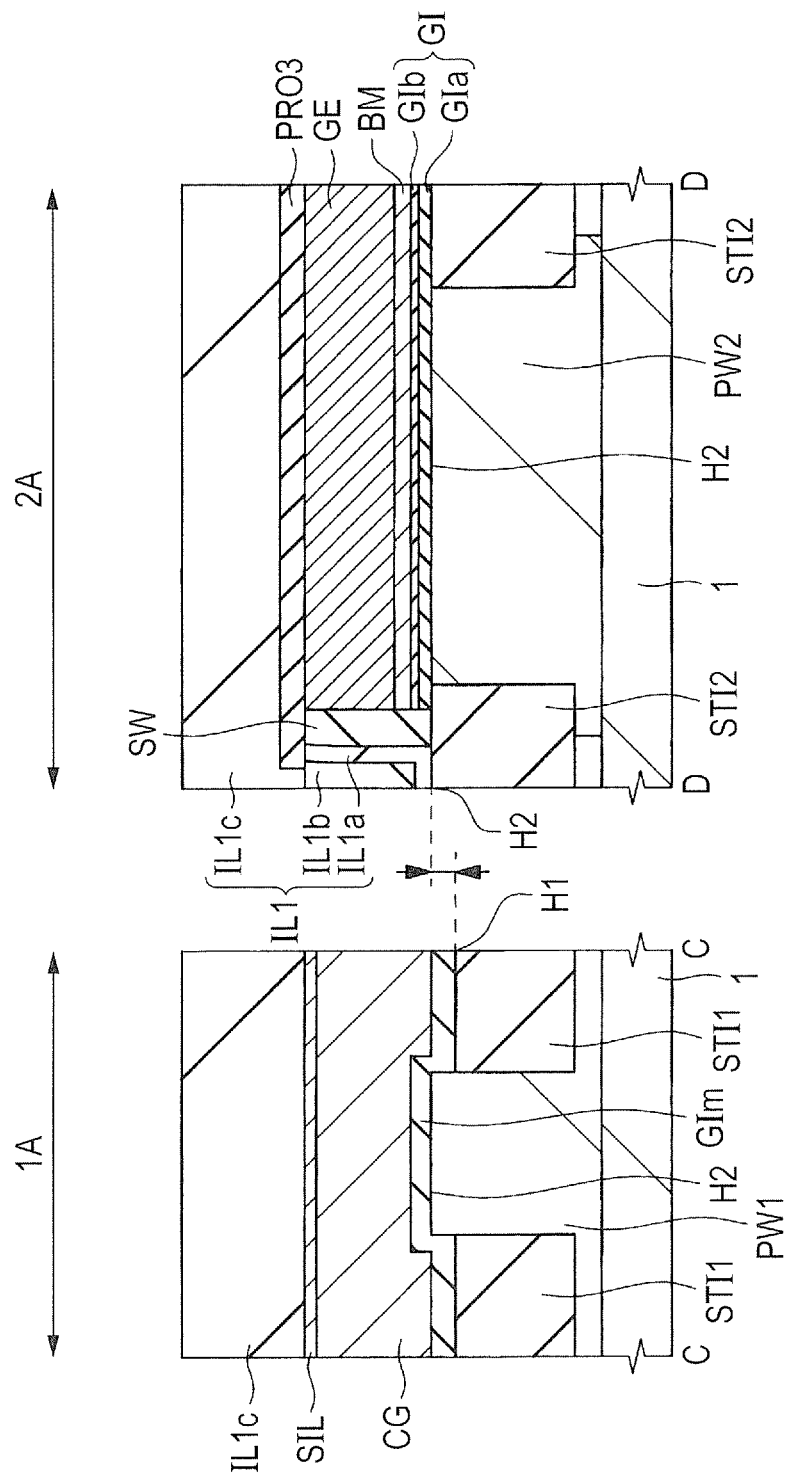
FIG. 57 is a cross section of the main part illustrating a process of manufacturing the semiconductor device of the first embodiment.

As illustrated in FIGS. 56 and 57, an insulating film (for example, the silicon oxide film IL1c or the like) is formed over the stack film of the thin silicon nitride film IL1a and the thick silicon oxide film IL1b. For example, the silicon oxide film IL1c is formed over the semiconductor substrate 1 by the CVD method or the like. In this case, the stack film of the thin silicon nitride film IL1a, the thick silicon oxide film IL1b, and the silicon oxide film IL1c over the silicon oxide film IL1b is called the interlayer insulating film IL1. The insulating film may be, for example, a single-layer film of the silicon oxide film IL1c or a stack film of a silicon nitride film and a silicon oxide film.

Next, the plug P1 is formed. By dry-etching the interlayer insulating film IL1, the contact hole C1 is formed. After that, a barrier conductive film made by a titanium (Ti) film, a titanium nitride (TiN) film, or a stack film of them is formed over the interlayer insulating film IL1 including the inside of the contact hole C1 and, further, a main conductive film made by a tungsten (W) film is formed so as to bury the contact hole C1. The main conductive film and the barrier conductive film which are unnecessary over the interlayer insulating film IL1 are removed by the CMP method, the etch back method, or the like. As a result, the plug P1 can be formed. The plug P1 is formed not only over the type semiconductor regions 22a, 22b, and 22c but also over the control gate electrode CG, the memory gate electrode MG, and the gate electrode GE of the MISFET.

Figure 58:
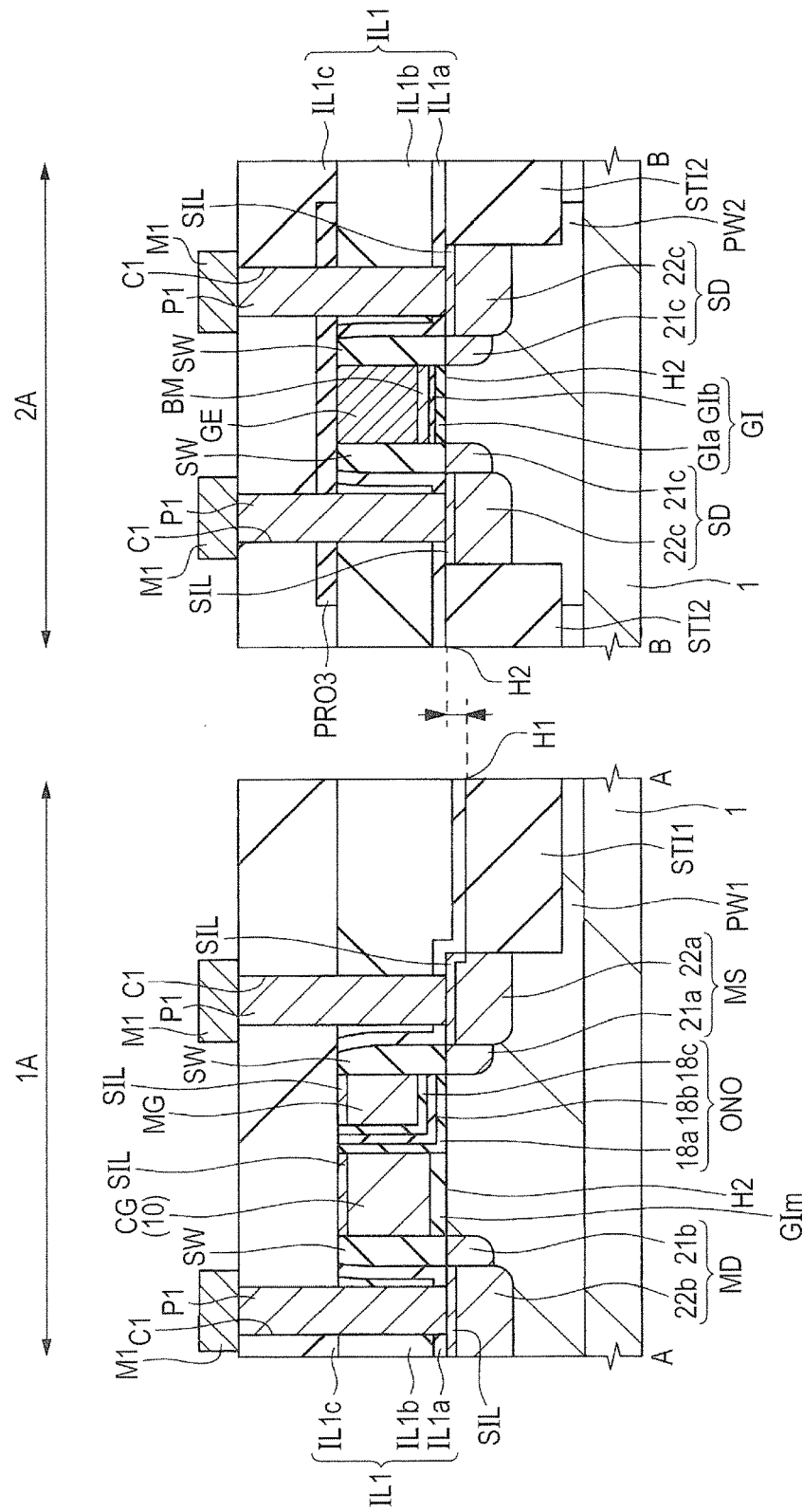
FIG. 58 is a cross section of the main part illustrating a process of manufacturing the semiconductor device of the first embodiment.
Figure 59:
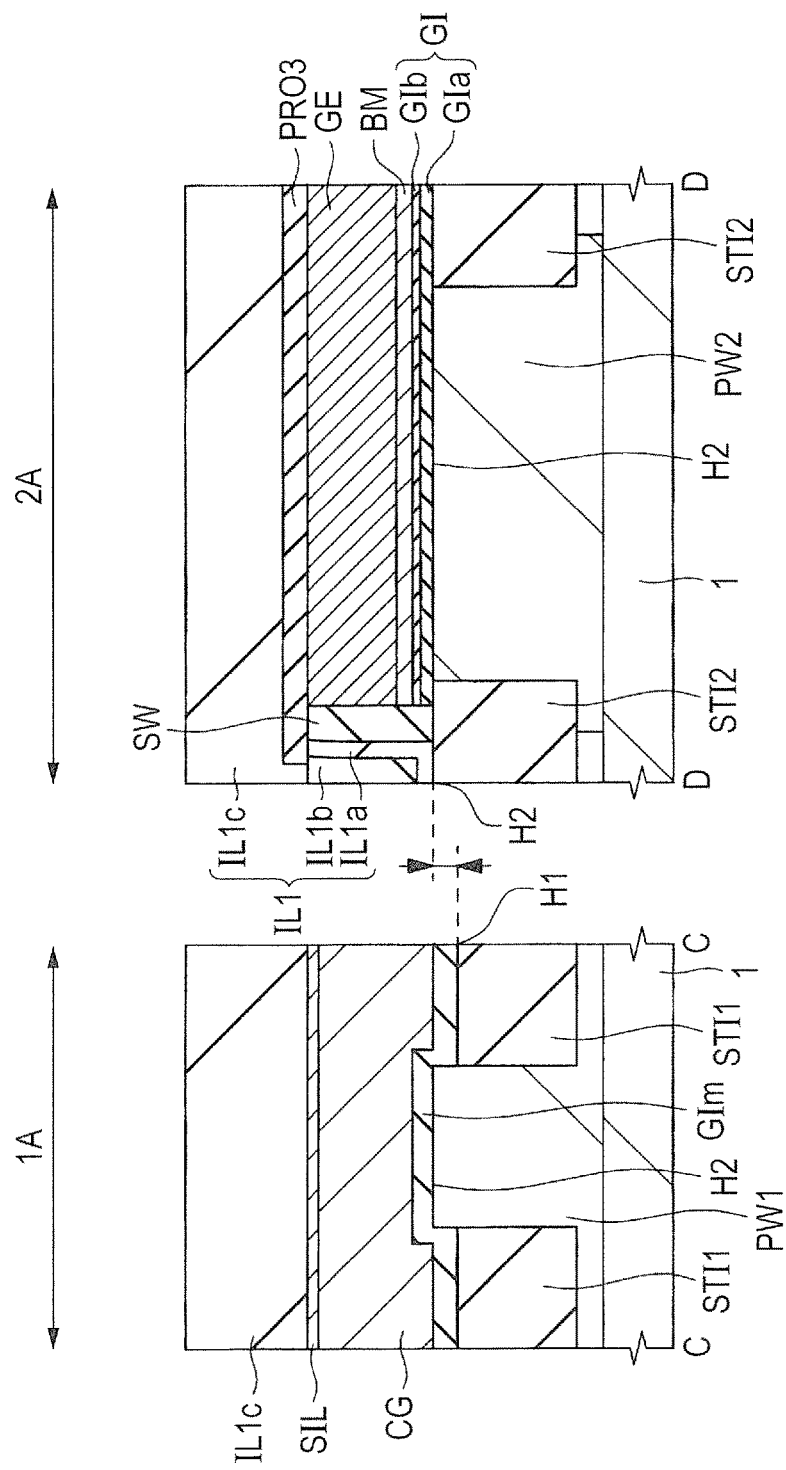
FIG. 59 is a cross section of the main part illustrating a process of manufacturing the semiconductor device of the first embodiment.

As illustrated in FIGS. 58 and 59, the wire M1 as a wire in the first layer is formed over the interlayer insulating film ILL The wire M1 can be formed by, for example, depositing a tungsten (W) film or an aluminum (Al) film over the interlayer insulating film IL1 and patterning it.

The wire M1 may be formed by using the damascene technique. First, an insulating film is formed over the interlayer insulating film IL1 in which the plug P1 is buried. The insulating film can be formed by a stack film of a plurality of insulating films. By etching the insulating film, a wire trench is formed in a desired region. Over the insulating film including the wire trench, for example, a barrier conductive film made by a titanium nitride (TiN) film, a tantalum (Ta) film, or a tantalum nitride (TaN) film is formed. After that, a seed layer of copper (Cu) is formed over the barrier conductive film by the CVD method or the sputtering method, and a copper (Cu) plating film is formed over the seed layer by using the electrolytic plating method or the like to bury the inside of the wire trench with the Cu plating film. By removing the main conductive film and the barrier conductive film in the regions other than the wire trench by the CMP method, the wire M1 in the first layer whose main conductive material is Cu buried in the wire trench is formed.

After that, a wire in an upper layer is formed but its description is not given here. Wires in the second and subsequent layers can be formed by the patterning method, the dual damascene method, or the like.

As described above, the semiconductor device of the first embodiment is manufactured.

Second Embodiment

In the first embodiment, the control gate electrode CG and the memory gate electrode MG are formed in the memory cell region 1A and, after that, a conductive film different from the conductive films constructing the control gate electrode CG and the memory gate electrode MG is formed and patterned, thereby forming the dummy gate electrode DGE in the peripheral circuit region 2A.

In a second embodiment, by using the conductive film constructing the control gate electrode CG, the dummy gate electrode DGE in the peripheral circuit region 2A is formed.
Description of Structure The configuration of the semiconductor device of the embodiment will be described with reference to FIGS. 78 and 79 as final process diagrams in FIGS. 60 to 79 illustrating the manufacture processes of the semiconductor device of the embodiment.

Figure 78:
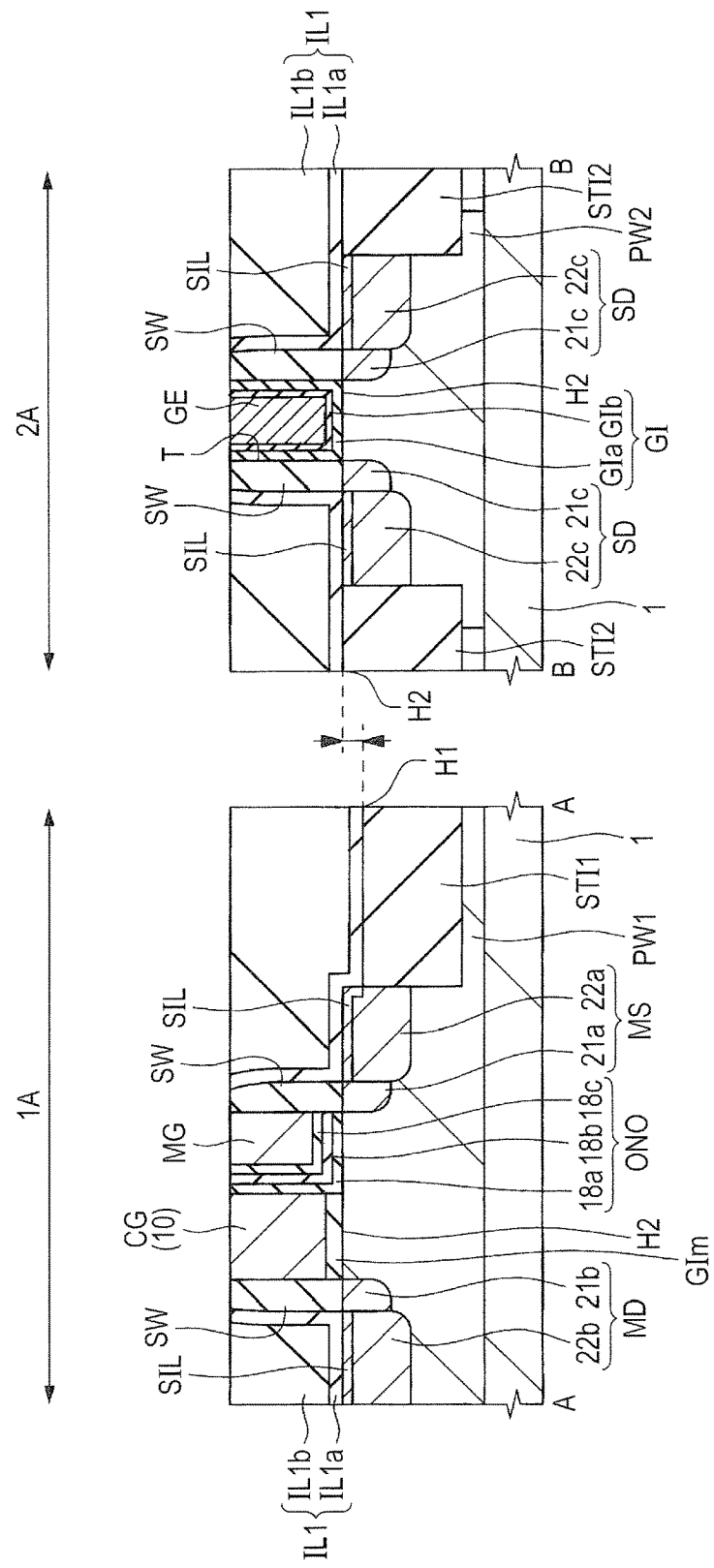
FIG. 78 is a cross section of the main part illustrating a process of manufacturing the semiconductor device of the second embodiment.
Figure 79:
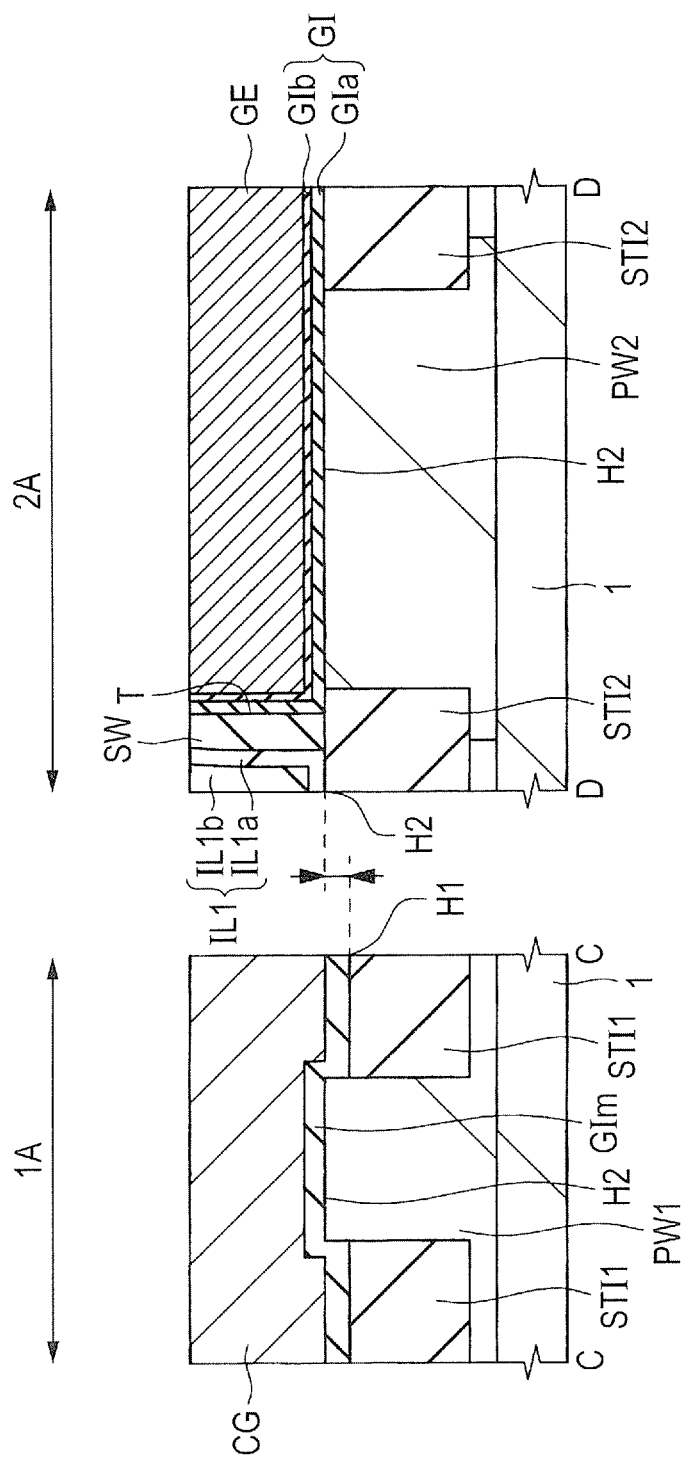
FIG. 79 is a cross section of the main part illustrating a process of manufacturing the semiconductor device of the second embodiment.

As illustrated in FIGS. 78 and 79, a memory cell as a nonvolatile memory is formed in the memory cell region 1A, and an MISFET is formed in the peripheral circuit region 2A. As illustrated, the configuration is similar to that of the first embodiment except for the shapes of the gate insulating film GI and the gate electrode GE in the trench T, the description of the configuration similar to that of the first embodiment will not be repeated. The second embodiment also produces effects similar to those of the first embodiment.

In the second embodiment, the gate insulating film GI and the gate electrode GE made by the conductive film over the gate insulating film GI are buried in the trench T.
Description of Manufacturing Method With reference to FIGS. 60 to 79, a method of manufacturing the semiconductor device of the second embodiment will be described and, in addition, the configuration of the semiconductor device of the embodiment will be made clear. FIGS. 60 to 79 are main-part cross sections illustrating manufacture processes of the semiconductor device of the embodiment.

Figure 60:
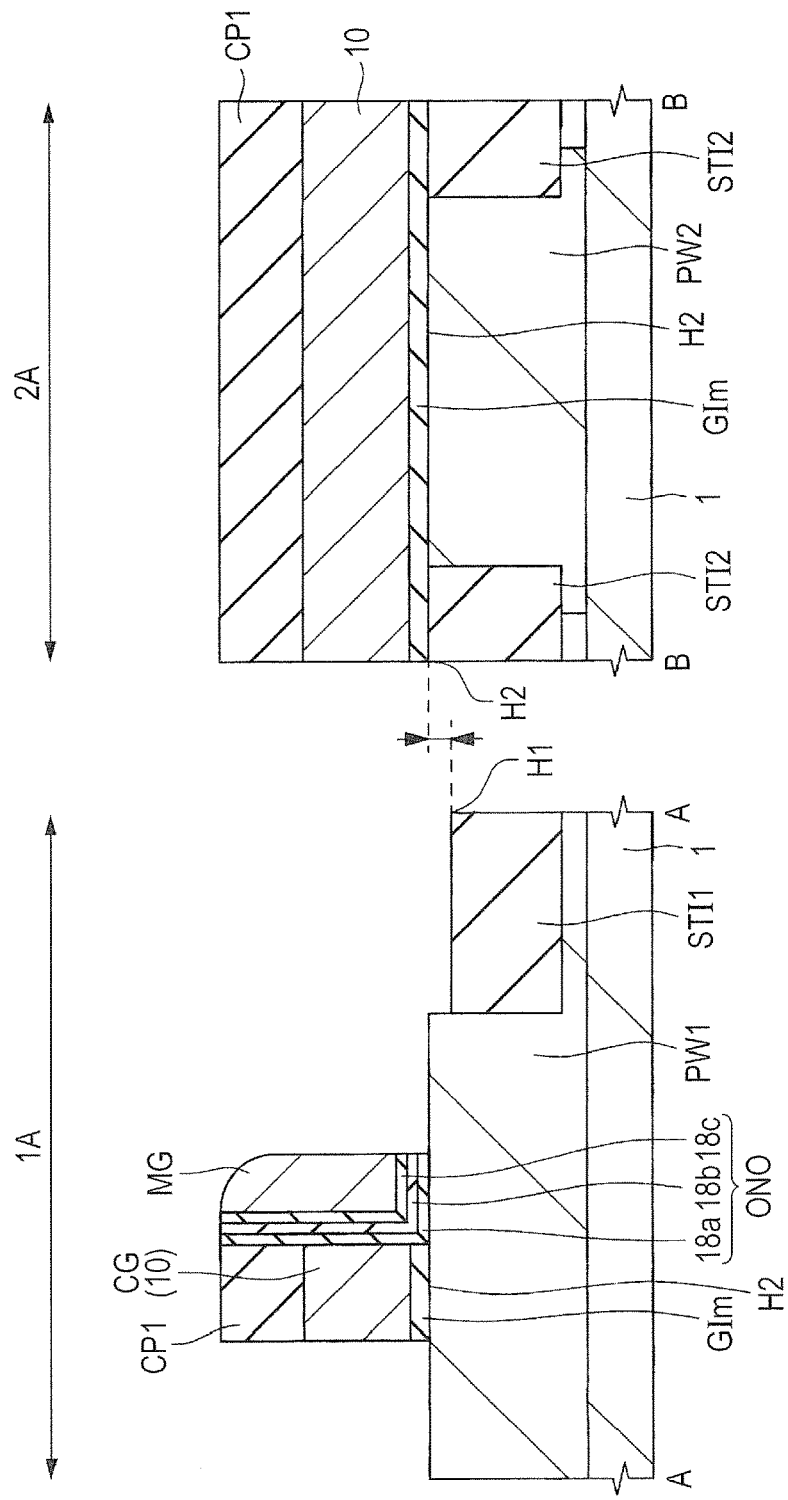
FIG. 60 is a cross section of the main part illustrating a process of manufacturing a semiconductor device of a second embodiment.
Figure 61:
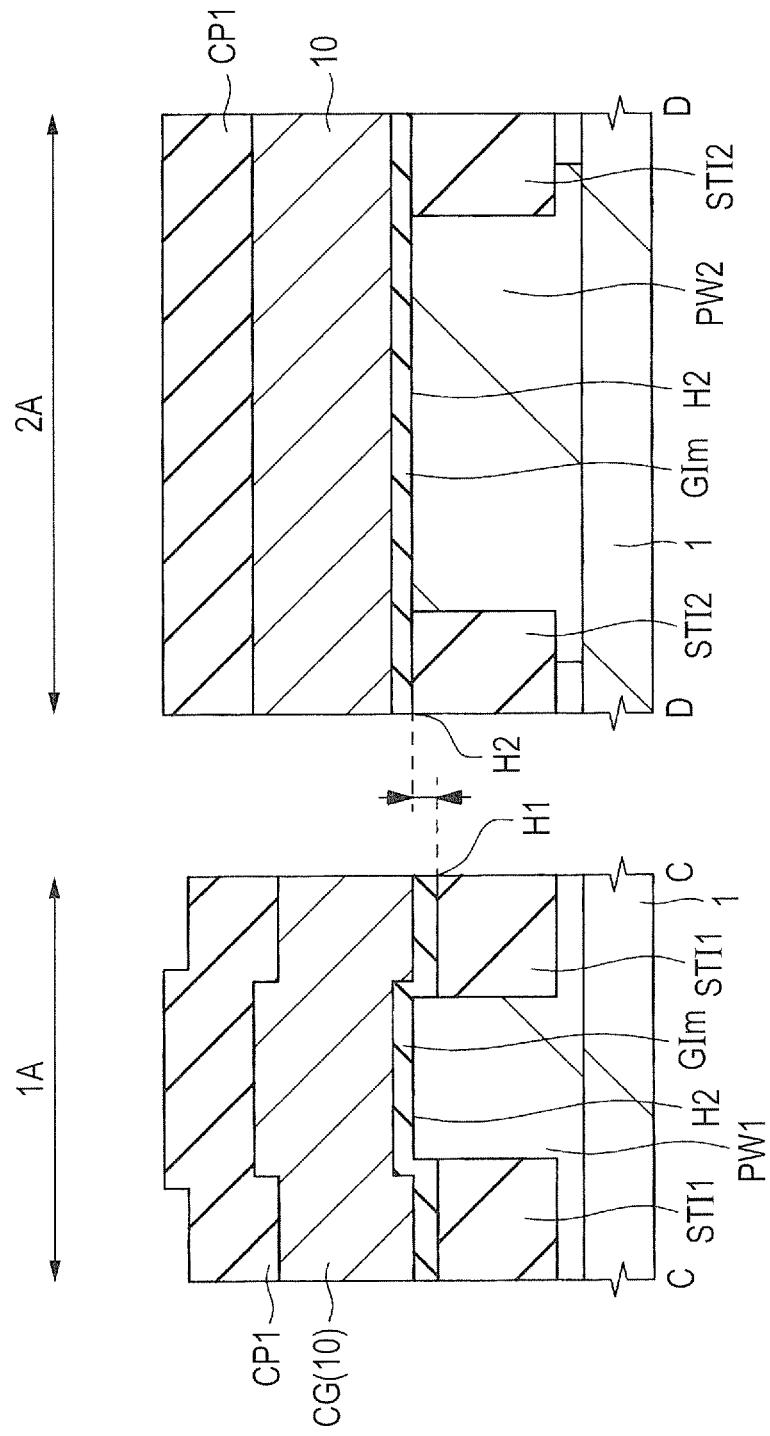
FIG. 61 is a cross section of the main part illustrating a process of manufacturing the semiconductor device of the second embodiment.

As illustrated in FIGS. 60 and 61, in the memory cell region 1A, the control gate electrode CG and the memory gate electrode MG are formed. At this time, in the peripheral circuit region 2A, the CG gate insulating film GIm, the polysilicon film 10 for the control gate electrode CG, and the cap insulating film CP1 are formed. The control gate electrode CG and the memory gate electrode MG in the memory cell region 1A can be formed in a manner similar to the case of the first embodiment (refer to FIGS. 14 to 23).

Figure 62:
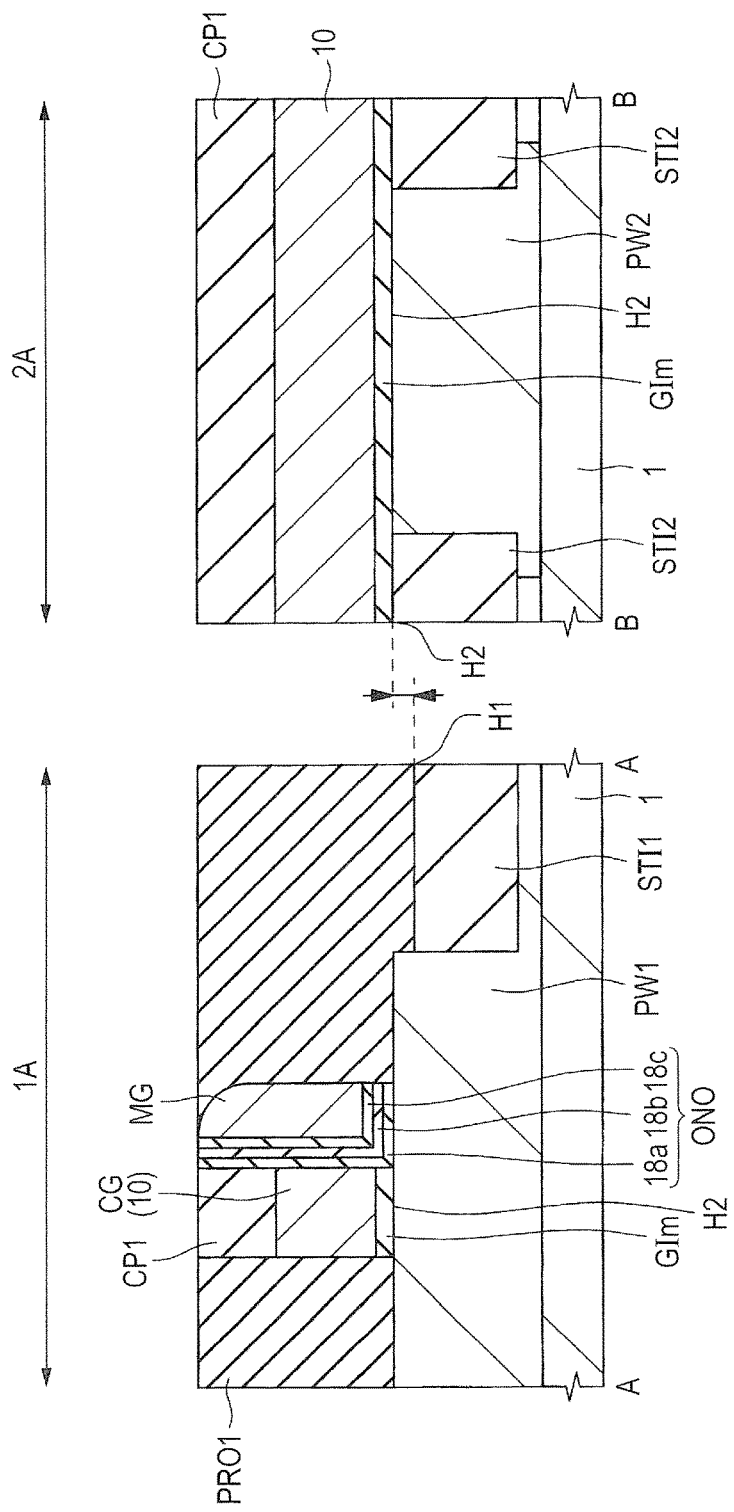
FIG. 62 is a cross section of the main part illustrating a process of manufacturing the semiconductor device of the second embodiment.
Figure 63:
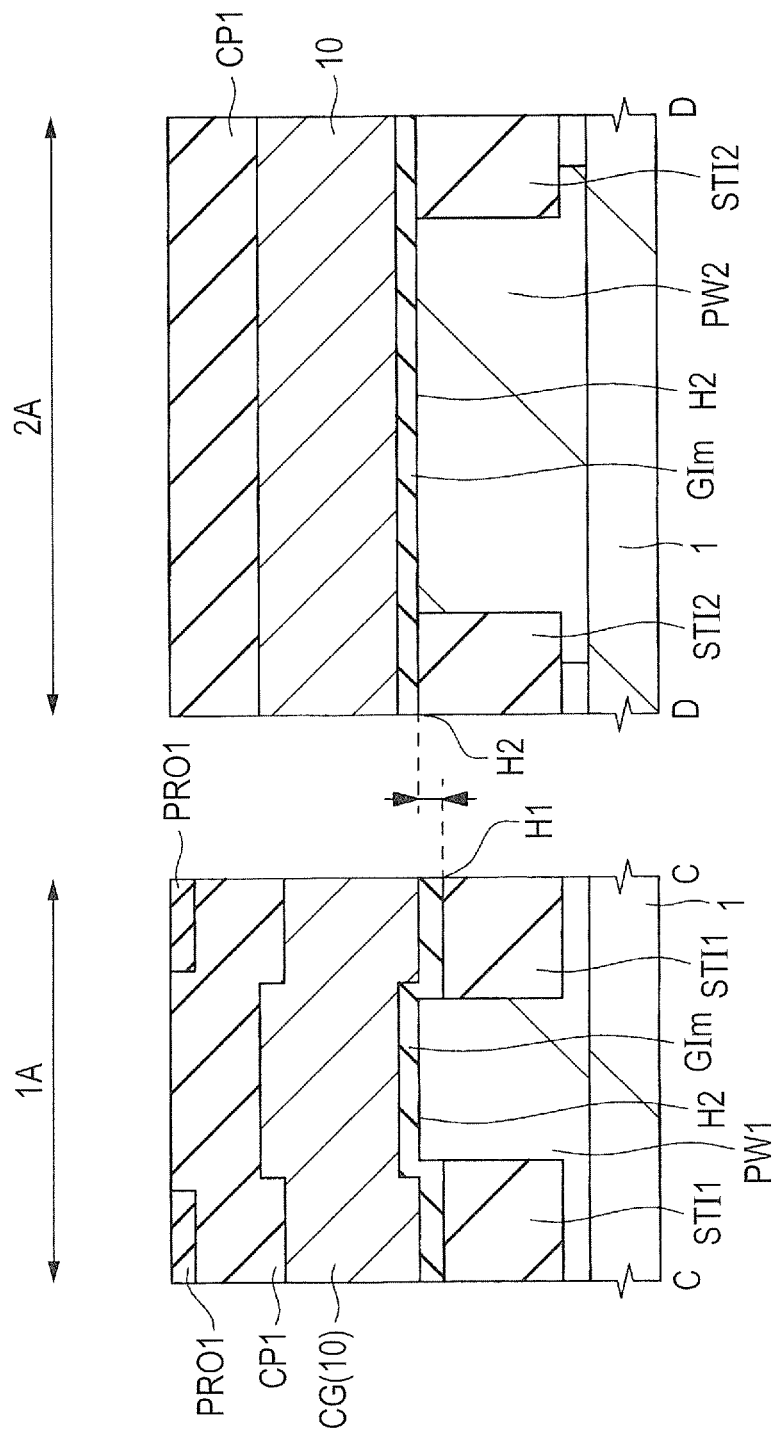
FIG. 63 is a cross section of the main part illustrating a process of manufacturing the semiconductor device of the second embodiment.

As illustrated in FIGS. 62 and 63, the protection film PRO1 is formed in the memory cell region 1A and the peripheral circuit region 2A. The protection film PRO1 is, for example, a silicon oxide film and can be formed by using the CVD method or the like. The thickness of the protection film PRO1 is larger than the sum of the thicknesses of the control gate electrode CG and the cap insulating film CP1. The upper part of the protection film PRO1 is polished by using the CMP method or the like until the cap insulating film CP1 is exposed. Consequently, the surfaces of the cap insulating film CP1 and the protection film PRO1 are planarized.

Figure 64:
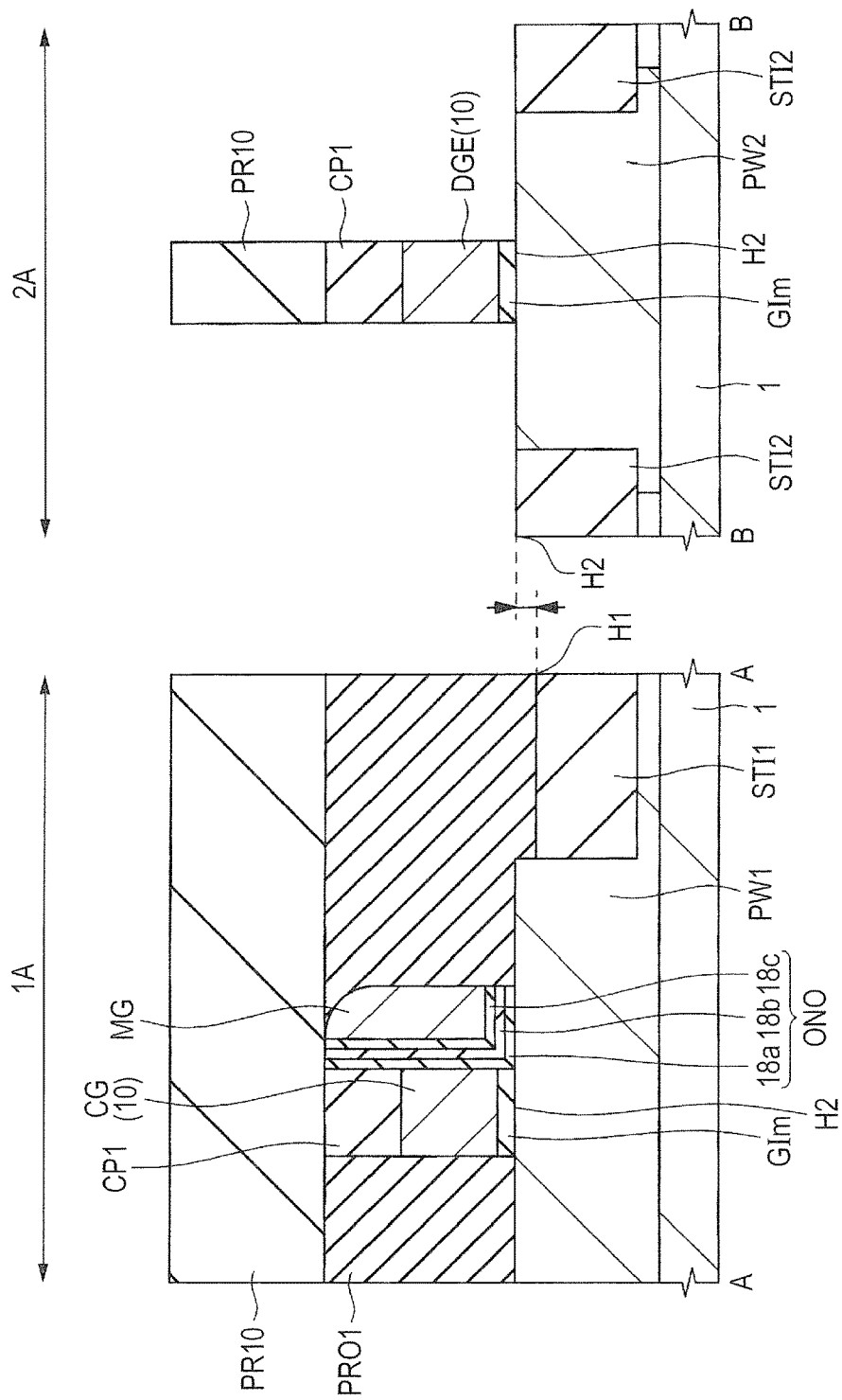
FIG. 64 is a cross section of the main part illustrating a process of manufacturing the semiconductor device of the second embodiment.
Figure 65:
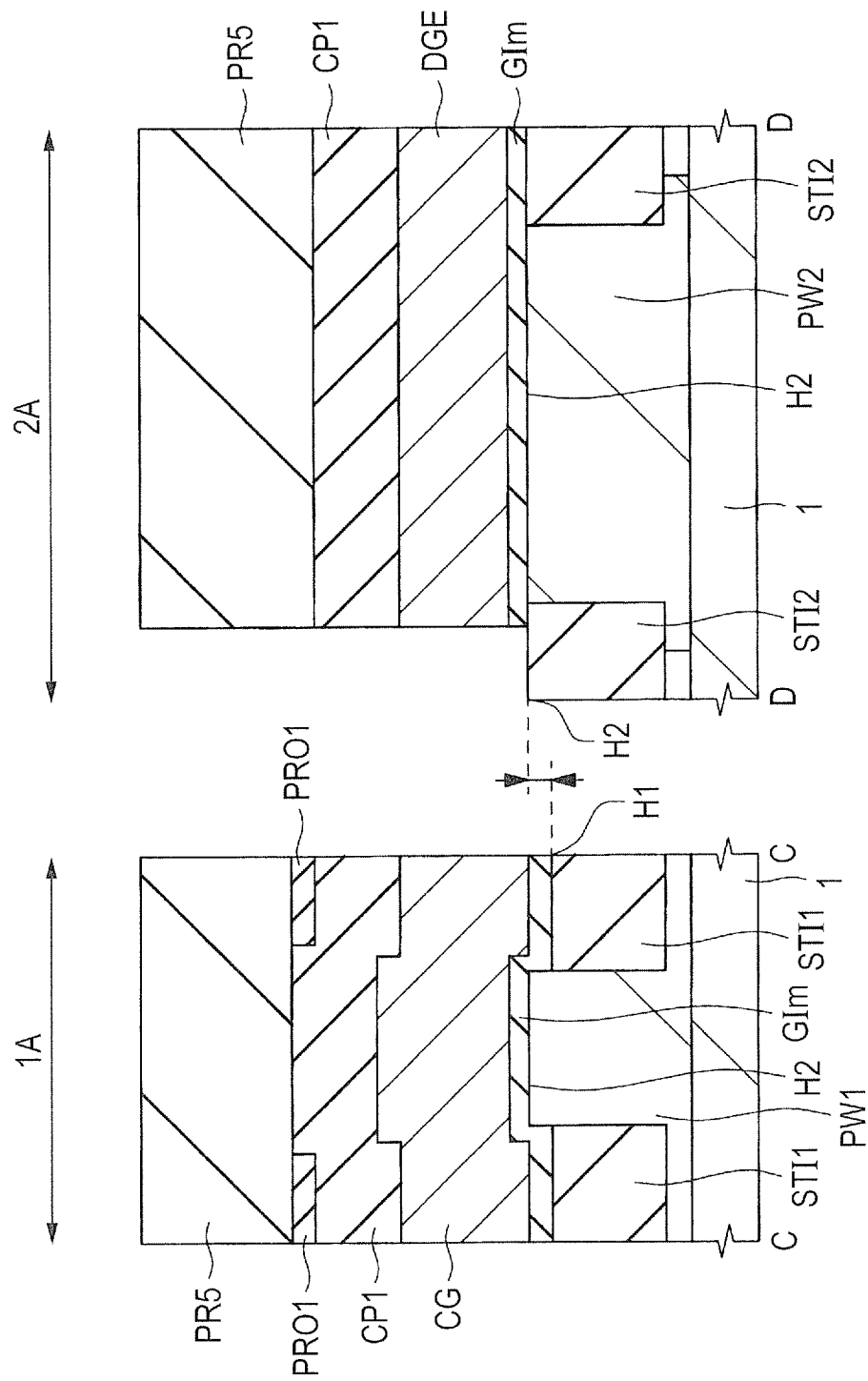
FIG. 65 is a cross section of the main part illustrating a process of manufacturing the semiconductor device of the second embodiment.

As illustrated in FIGS. 64 and 65, the photoresist film PR10 is formed in the formation region of the gate electrode GE in the peripheral circuit region 2A and the memory cell region 1A and, using the photoresist film PR10 as a mask, the conductive film (for example, the polysilicon film 10) for the control gate electrode CG remaining in the peripheral circuit region 2A, the cap insulating film CP1, and the CG gate insulating film GIm are etched. By the operation, the dummy gate electrode DGE made by the film in the same layer as the conductive film (for example, the polysilicon film 10) for the control gate electrode CG is formed in the formation region of the gate electrode GE in the peripheral circuit region 2A. Over the dummy gate electrode DGE, the cap insulating film CP1 remains. Below the dummy gate electrode DGE, the film in the same layer as the CG gate insulating film GIm remains.

Figure 66:
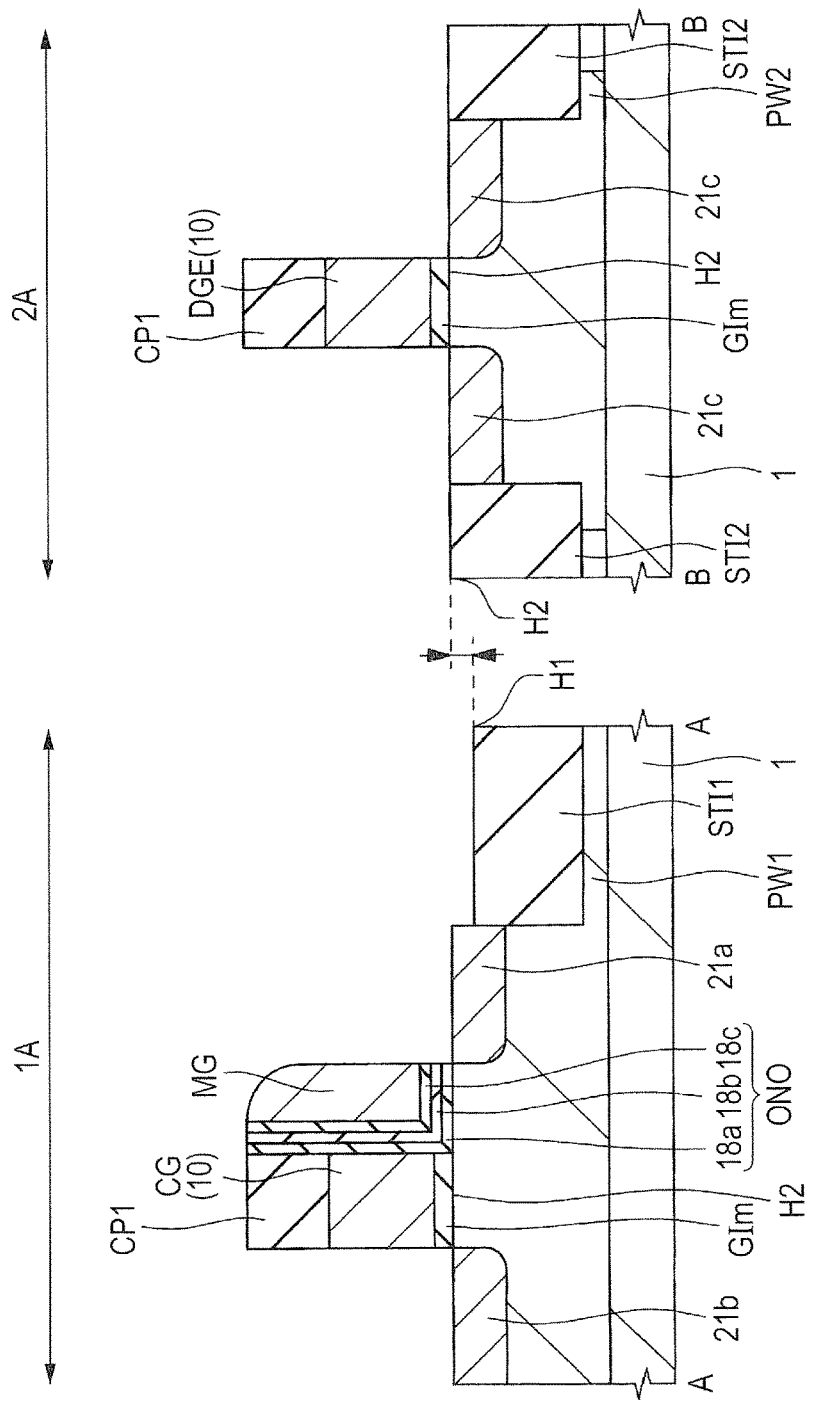
FIG. 66 is a cross section of the main part illustrating a process of manufacturing the semiconductor device of the second embodiment.
Figure 67:
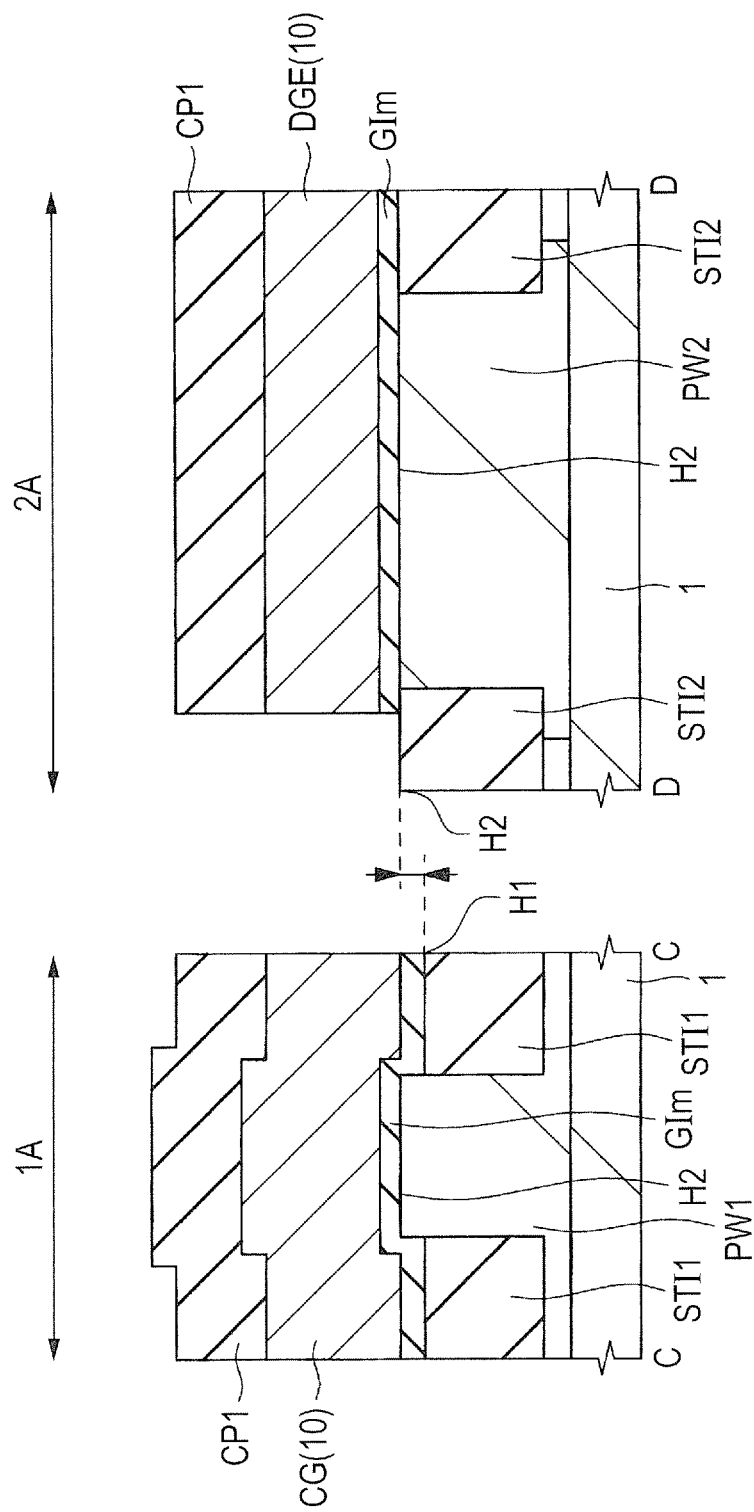
FIG. 67 is a cross section of the main part illustrating a process of manufacturing the semiconductor device of the second embodiment.

As illustrated in FIGS. 66 and 67, the n⁻ type semiconductor regions 21a, 21b, and 21c are formed. In a manner similar to the first embodiment, an n-type impurity such as arsenic (As) or phosphor (P) is introduced into the p-type wells PW1 and PW2 using the control gate electrode CG, the memory gate electrode MG, and the dummy gate electrode DGE as a mask.

Figure 68:
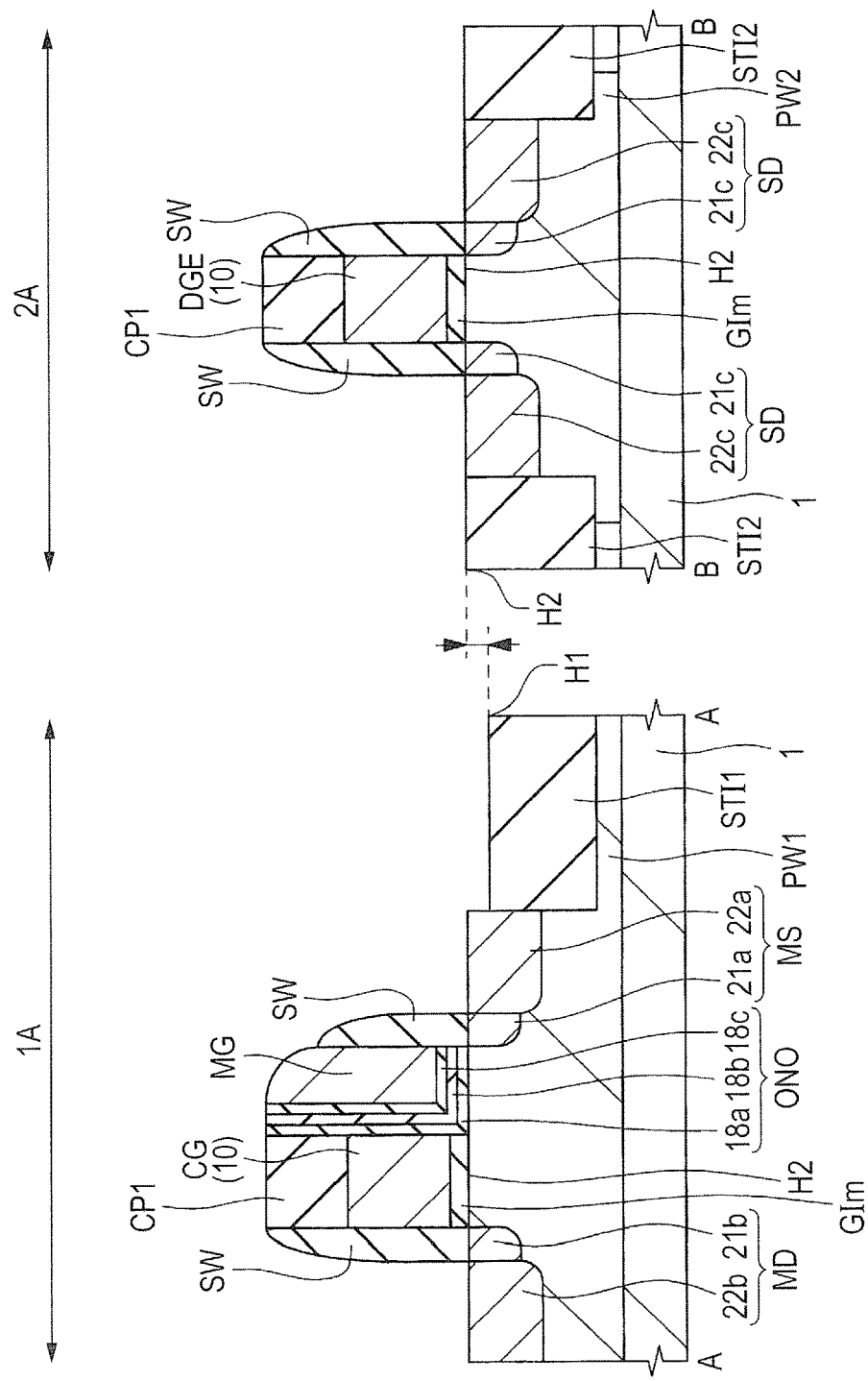
FIG. 68 is a cross section of the main part illustrating a process of manufacturing the semiconductor device of the second embodiment.
Figure 69:
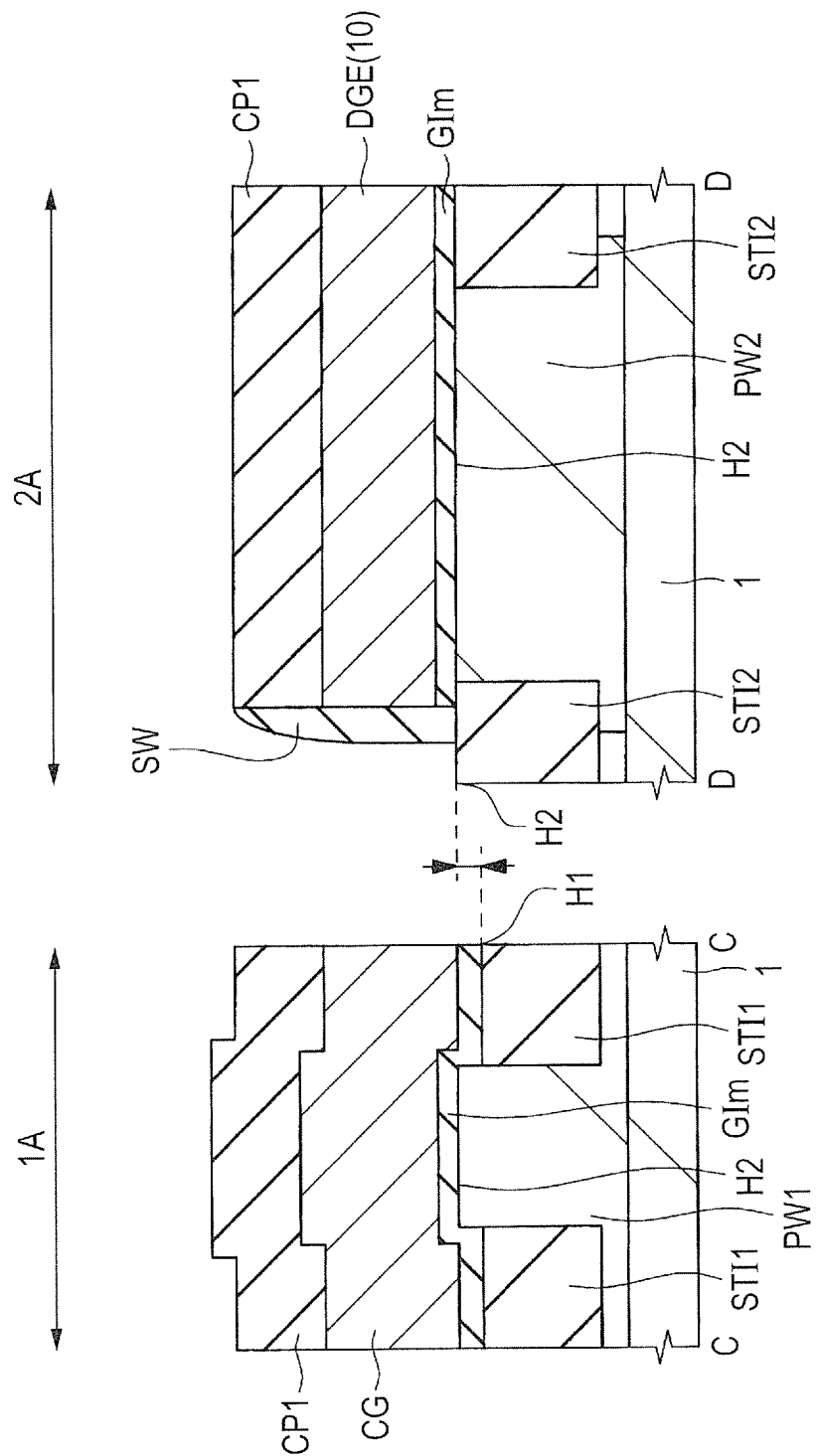
FIG. 69 is a cross section of the main part illustrating a process of manufacturing the semiconductor device of the second embodiment.

As illustrated in FIGS. 68 and 69, the sidewall spacers SW are formed on the sidewalls on both sides of the composite of the control gate electrode CG and the memory gate electrode MG and the sidewalls on both sides of the dummy gate electrode DGE. For example, in a manner similar to the first embodiment, over the semiconductor substrate 1 including the control gate electrode CG, the memory gate electrode MG, and the dummy gate electrode DGE, an insulating film which is a silicon nitride film or the like is formed. The insulating film is etched back by anisotropic etching.

Subsequently, the n+ type semiconductor regions 22a, 22b, and 22c are formed. In a manner similar to the first embodiment, an n-type impurity such as arsenic (As) or phosphor (P) is introduced into the p-type wells PW1 and PW2 using the control gate electrode CG, the memory gate electrode MG, the dummy gate electrode DGE, and the sidewall spacer SW as a mask.

Figure 70:
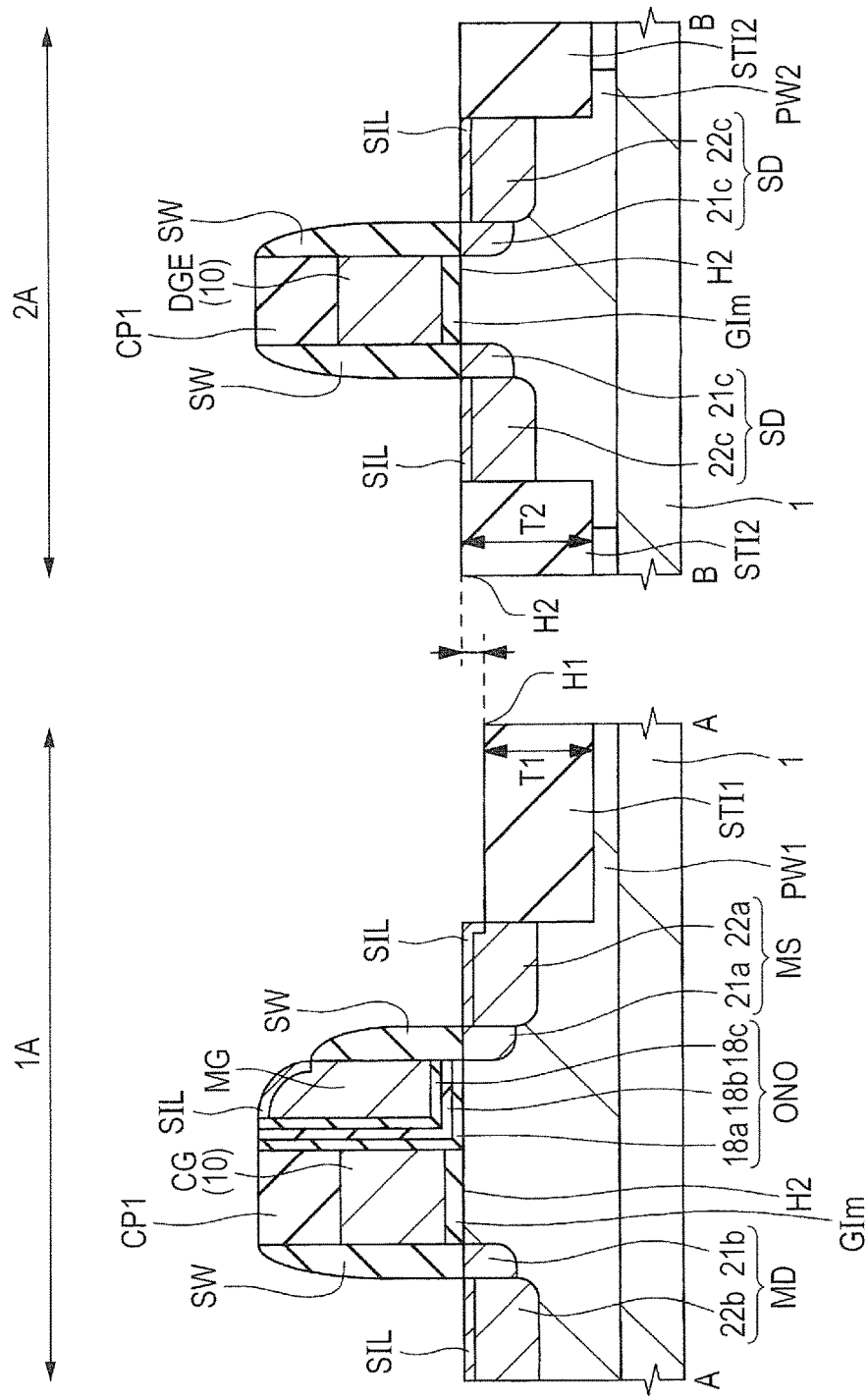
FIG. 70 is a cross section of the main part illustrating a process of manufacturing the semiconductor device of the second embodiment.
Figure 71:
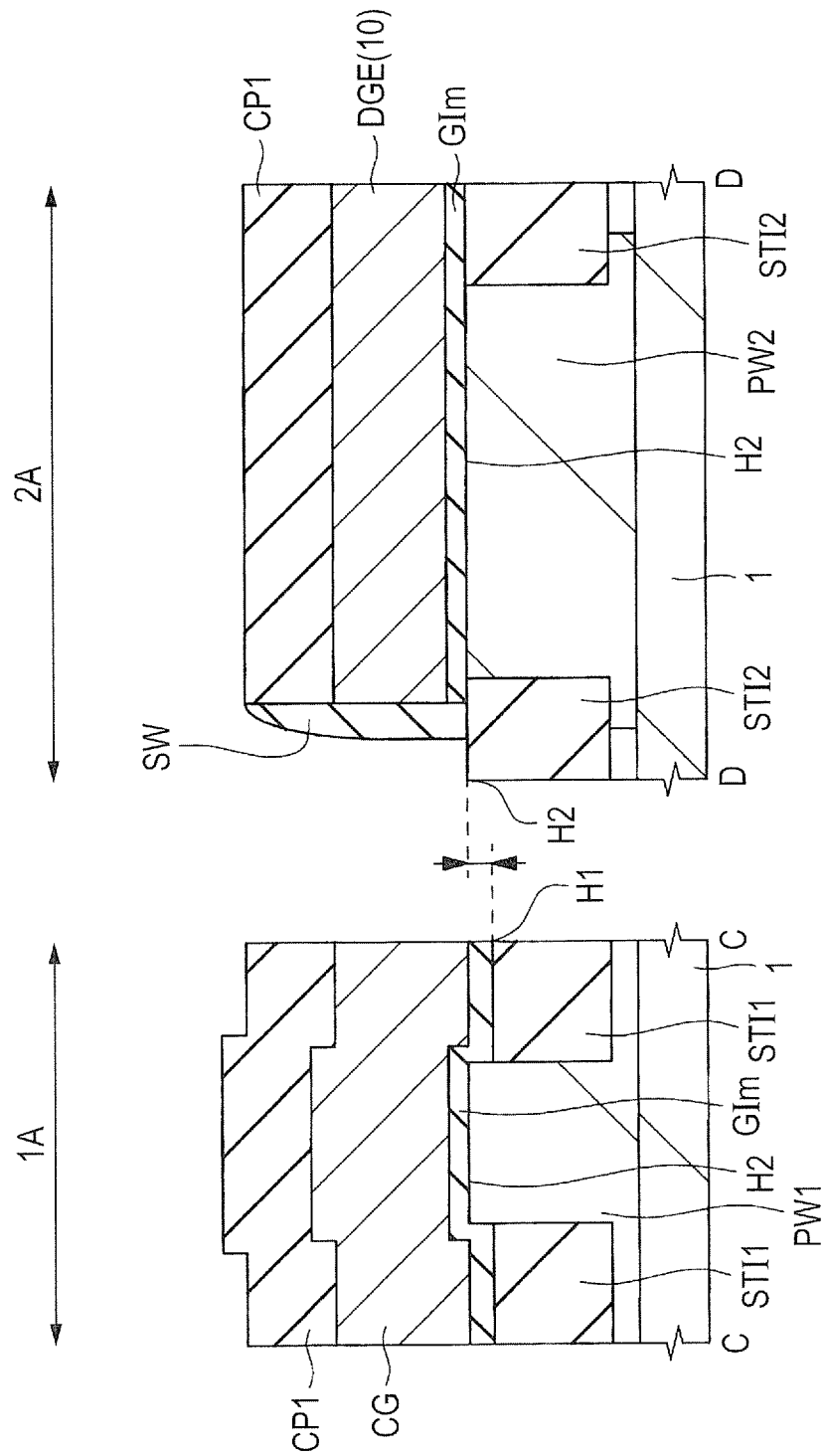
FIG. 71 is a cross section of the main part illustrating a process of manufacturing the semiconductor device of the second embodiment.

As illustrated in FIGS. 70 and 71, for example, in a manner similar to the first embodiment, the metal silicide film SIL is formed.

Figure 72:
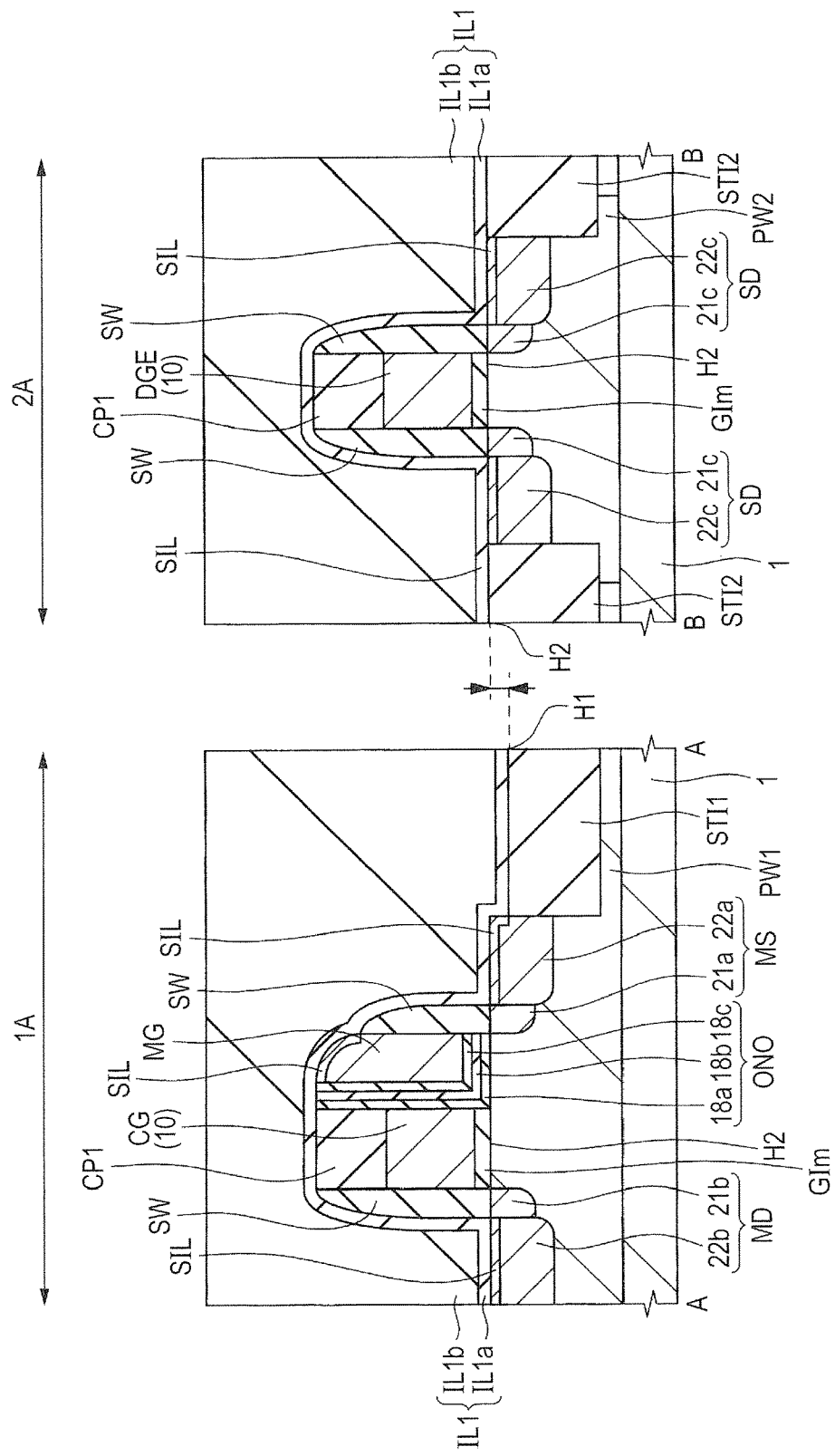
FIG. 72 is a cross section of the main part illustrating a process of manufacturing the semiconductor device of the second embodiment.
Figure 73:
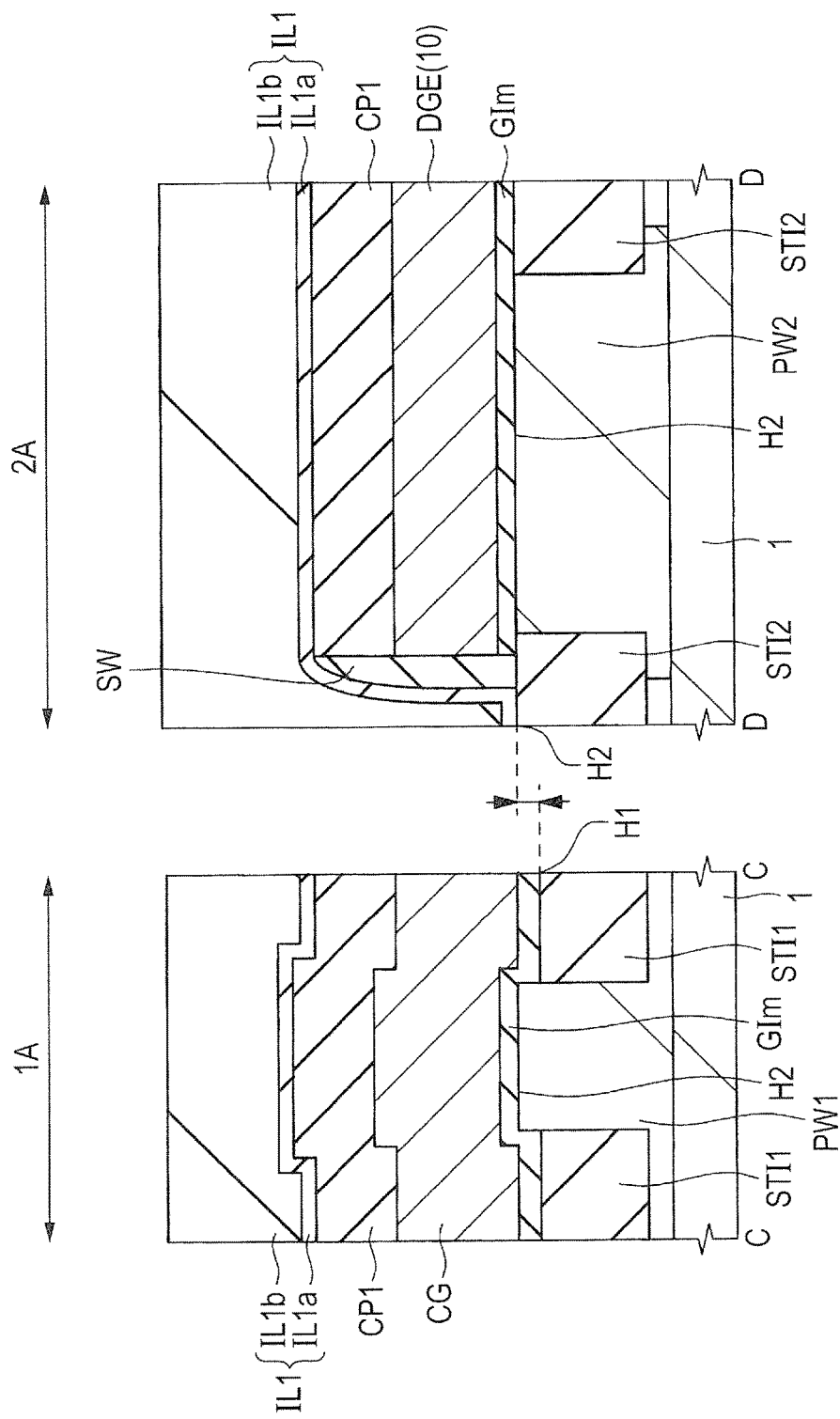
FIG. 73 is a cross section of the main part illustrating a process of manufacturing the semiconductor device of the second embodiment.

As illustrated in FIGS. 72 and 73, the interlayer insulating film IL1 is formed. In a manner similar to the first embodiment, the interlayer insulating film IL1 as a stack film of the thin silicon nitride film IL1a and the thick silicon oxide film IL1b is formed.

Figure 74:
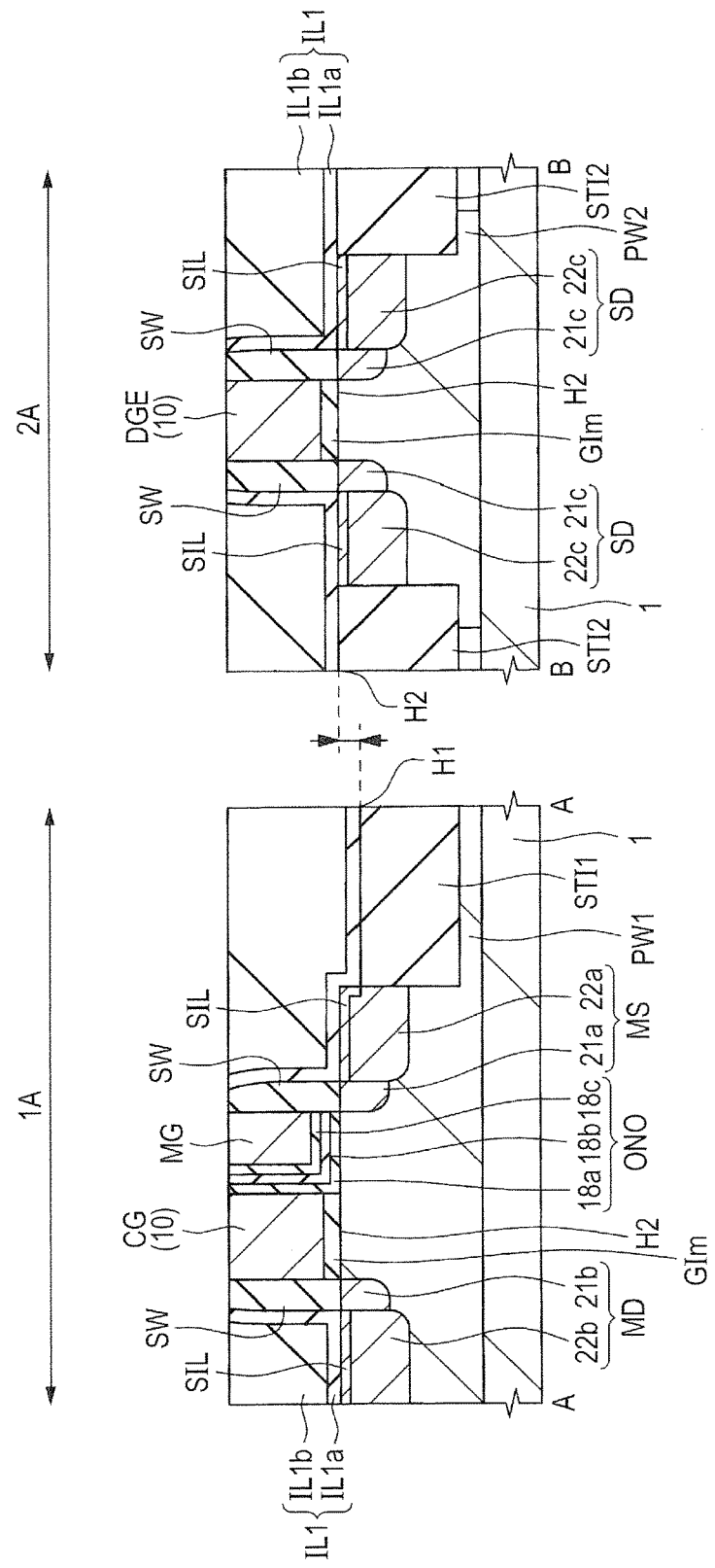
FIG. 74 is a cross section of the main part illustrating a process of manufacturing the semiconductor device of the second embodiment.
Figure 75:
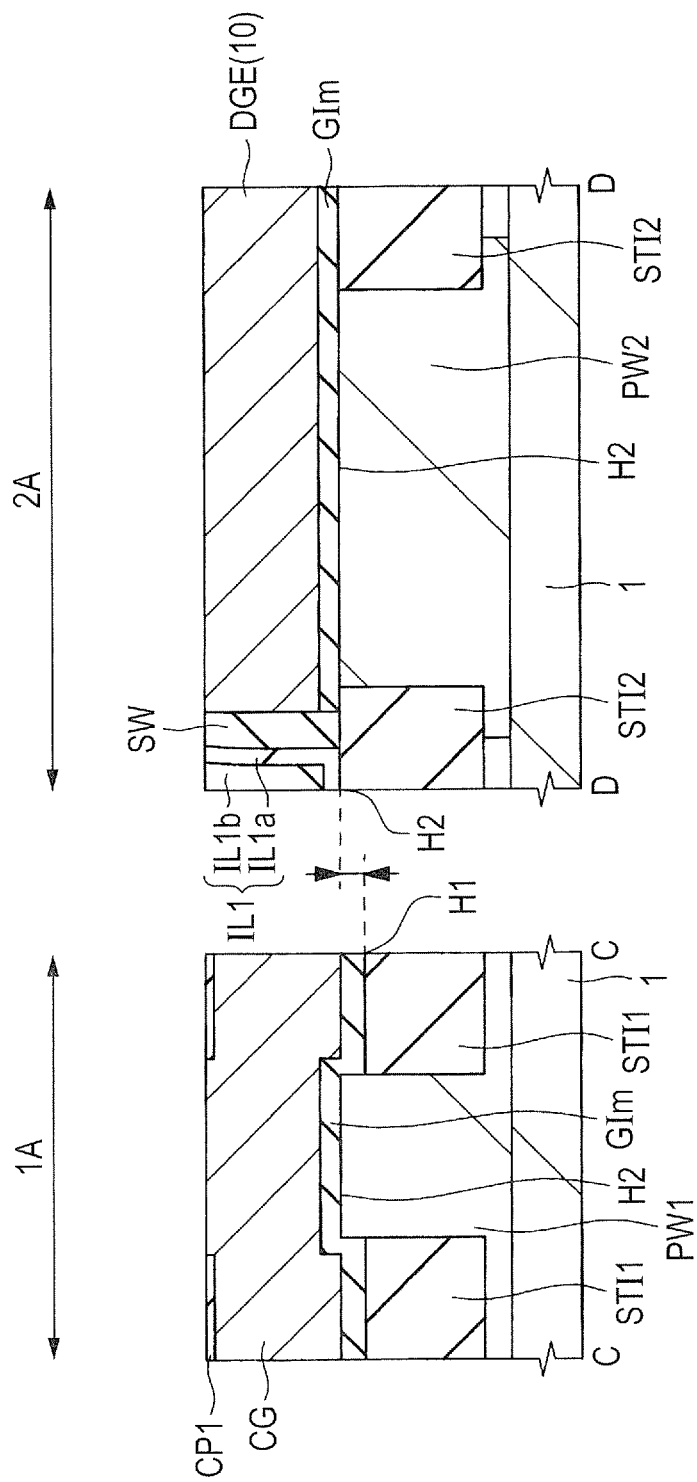
FIG. 75 is a cross section of the main part illustrating a process of manufacturing the semiconductor device of the second embodiment.

As illustrated in FIGS. 74 and 75, the upper part of the interlayer insulating film IL1 is removed. For example, the upper part of the interlayer insulating film IL1 is polished by using the CMP method or the like until the control gate electrode CG and the dummy gate electrode DGE are exposed. In such a manner, planarization is made so that the height of the memory cell region 1A and the peripheral circuit region 2A becomes the height of the control gate electrode CG and the dummy gate electrode DGE. In the example illustrated in FIG. 74, the metal silicide layer SIL formed over the surface of the memory gate electrode MG is removed.

Figure 76:
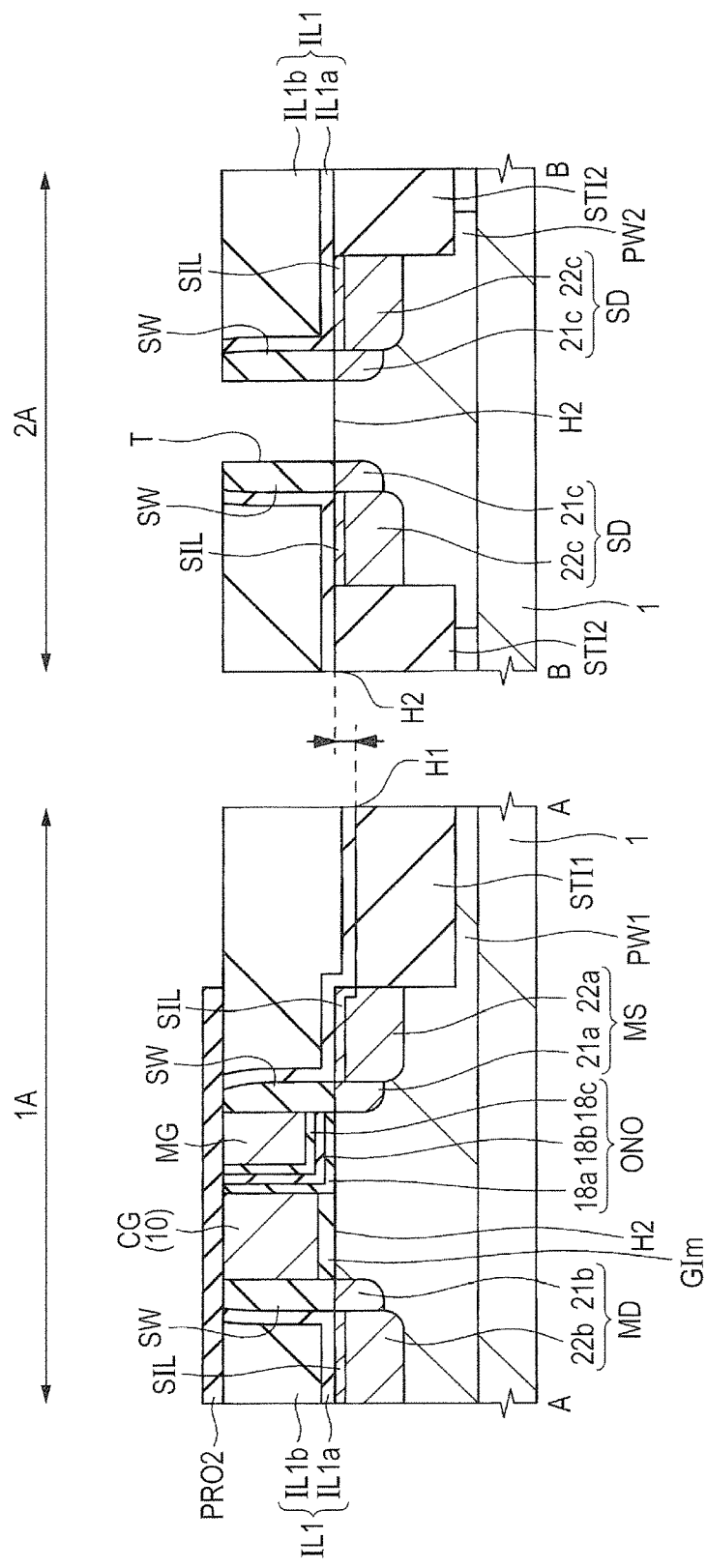
FIG. 76 is a cross section of the main part illustrating a process of manufacturing the semiconductor device of the second embodiment.
Figure 77:
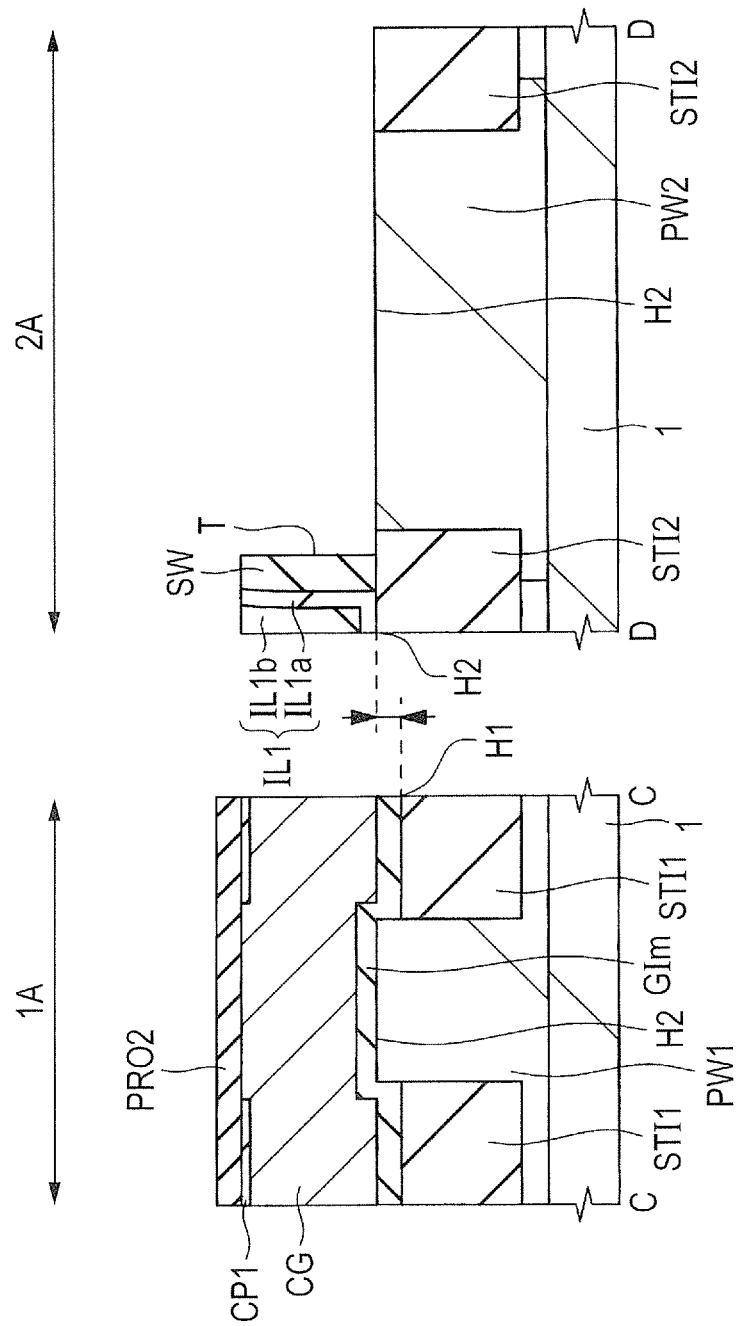
FIG. 77 is a cross section of the main part illustrating a process of manufacturing the semiconductor device of the second embodiment.

As illustrated in FIGS. 76 and 77, the protection film PRO2 covering the surface of the control gate electrode CG and the memory gate electrode MG in the memory cell region 1A is formed. For example, an insulating film which is a silicon oxide film or the like is formed over the semiconductor substrate 1 and patterned by using the photolithography technique and the etching technique. As a result, the surface of the control gate electrode CG and the memory gate electrode MG in the memory cell region 1A is covered with the protection film PRO2, and the surface of the dummy gate electrode DGE in the peripheral circuit region 2A is exposed.

After that, the exposed dummy gate electrode DGE and the gate insulating film GIm in the lower layer of the dummy gate electrode DGE are removed by etching. By the operation, the trench T is formed in the part from which the dummy gate electrode DGE is removed. In the bottom of the trench T, the p-type well PW is exposed. In the side faces of the trench T, the sidewall spacers SW are exposed.

As illustrated in FIGS. 78 and 79, over the interlayer insulting film IL1 including the inside of the trench T, the insulating film GIa which is a silicon oxide film, a silicon oxynitride film, or the like is formed with a thickness of, for example, about 1 nm by the thermal oxidation method or the like. Since the insulating film GIa is formed between the semiconductor substrate 1 and the insulating film GIb which will be described later, it can be regarded as an interface layer. The insulating film GIa may be formed by the CVD method or the like. Over the insulating film GIa of the lower layer, as the insulating film GIb of the upper layer, a high-dielectric-constant film (high-k film) is formed. The relative permittivity of the insulating film GIb is higher than that of silicon nitride. As such a film, a metal oxide film such as a hafnium oxide film, a zirconium oxide film, an aluminum oxide film, a tantalum oxide film, or a lanthanum oxide film can be used. The thickness of the insulating film GIb is, for example, about 1 to 3 nm. The insulating film GIb can be formed by using the sputtering method, the ALD method, the CVD method, or the like.

Over the gate insulating film GI (GIa, GIb), a conductive film constructing the gate electrode GE is formed. As the conductive film, for example, a metal film other than a silicon film such as a polycrystal silicon film can be used. Preferably, a metal film such as an aluminum (Al) film, a tantalum nitride (TaN) film, or a titanium nitride (TiN) film can be used. For example, a conductive film is formed over the gate insulating film GI by the sputtering method or the like and, after that, the gate insulating film GI and the conductive film on the outside of the trench T are removed by using the CMP method or the like. By the operation, the gate insulating film GI and the gate electrode GE made by the conductive film above the gate insulating film GI can be buried in the trench T. The gate insulating film GI is formed so as to cover the bottom face and the side face of the trench T. In other words, the gate insulating film GI is formed not only between the bottom face of the gate electrode GE and the bottom face of the trench T but also between the side face of the gate electrode GE and the side face of the trench T. A metal film for adjusting a work function of the gate electrode of the MISFET may be formed between the conductive film and the gate insulating film GI. The metal film becomes apart of the gate electrode GE.

At the time of eliminating the conductive film by polishing, the protection film PRO2 in the memory region 1A and the cap insulating film CP1 which can remain below the protection film PRO2 are removed. As described above, in a process of polishing the film in the upper layer of the dummy gate electrode DGE by the CMP method or the like (first polishing process), even when the cap insulating film CP1 remains over the control gate electrode CG (refer to FIG. 77), it is removed in a polishing process (second polishing process) performed at the time of burying the inside of the trench T with the conductive film. Particularly, when the recession amount of the surface of the element isolation region STI1 in the memory cell region 1A is in the range of 10 nm to 20 nm, the cap insulating film CP1 remaining over the control gate electrode CG is removed by the polishing process (second polishing process) performed at the time of buying the inside of the trench T with the conductive film.

After that, in a manner similar to the first embodiment, the metal silicide layer SIL is formed over the control gate electrode CG and the memory gate electrode MG in the memory cell region 1A. Further, the interlayer insulating film IL1 made by the stack film of the thin silicon nitride film IL1$a$, the thick silicon oxide film IL1$b$, and the silicon oxide film IL1$c$ over the silicon oxide film IL1$b$ is formed and, after that, the plug P1 is formed in it. Above the interlayer insulating film IL1 the wire M1 as the wire in the first layer is formed. Although a wire in an upper layer is formed subsequently, its description will not be given here.

As described above, the semiconductor device of the second embodiment is manufactured.

Third Embodiment

Figure 80A:
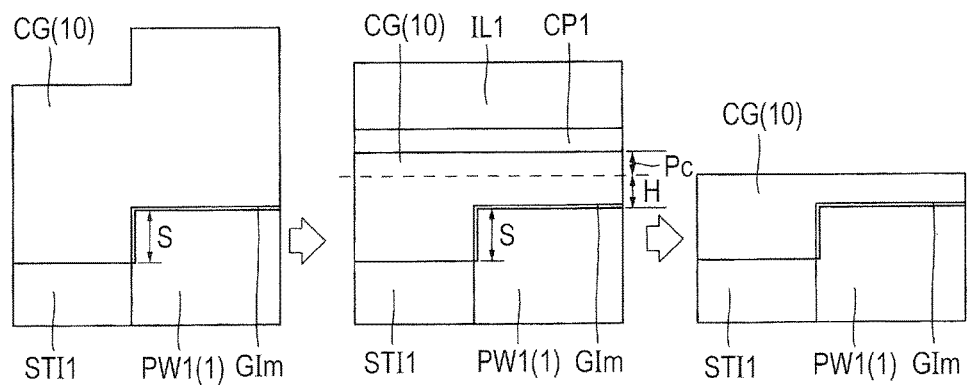
FIGS. 80A to 80C are diagrams for explaining a first application of a third embodiment.
Figure 80B:
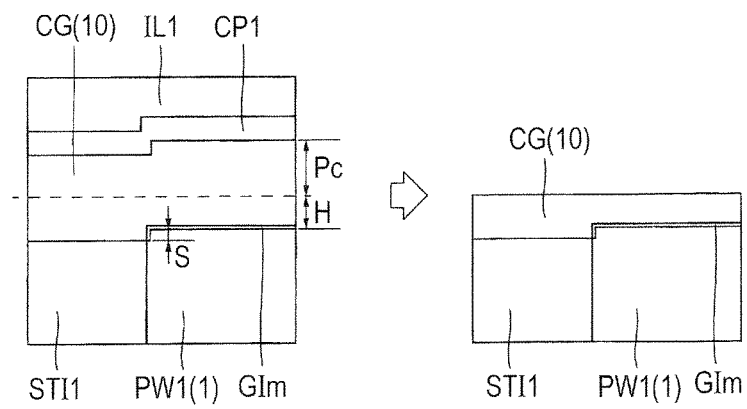
Figure 80C:
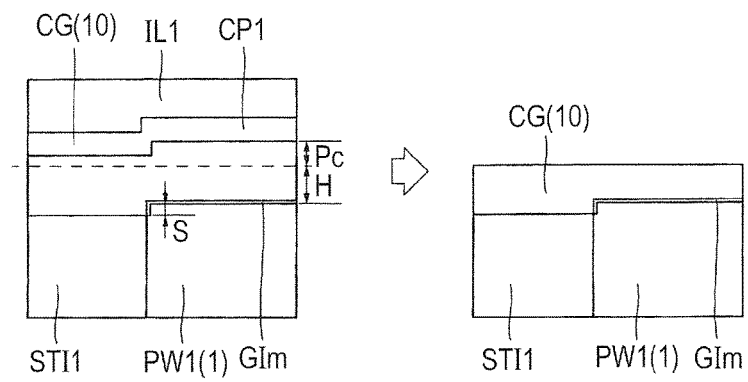
Figure 83:
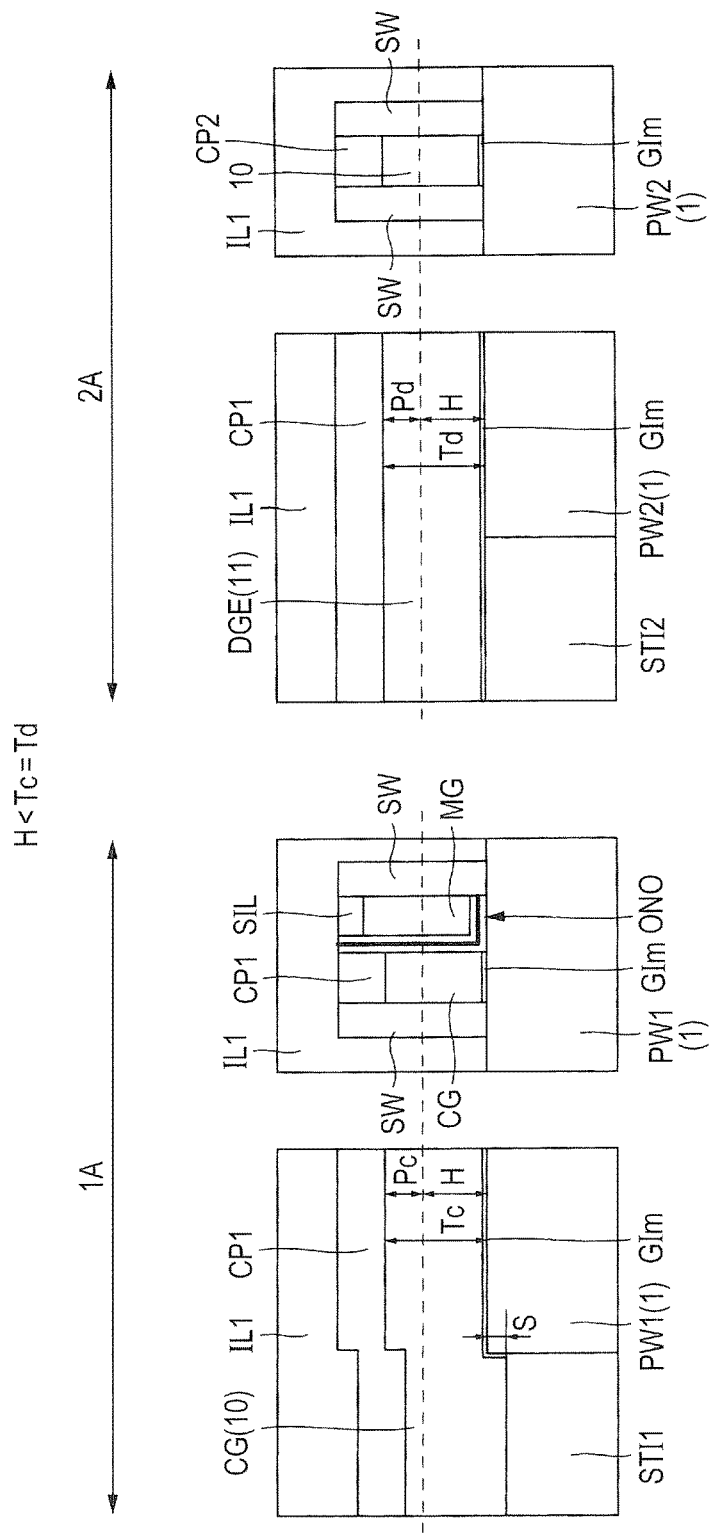
FIG. 83 is a diagram for explaining the first application of the third embodiment.

In a third embodiment, various applications of the foregoing embodiments will be described.
Application 1
In a first application, 1) a recession amount in the case of receding and lowering the surface of the element isolation region STI1 will be described. 2) The relation between height (Tc) from the surface of the semiconductor substrate after forming the polysilicon film for forming the control gate electrode in the memory cell region 1A and height (Td) from the surface of the semiconductor substrate after forming the polysilicon film for forming the dummy gate electrode in the peripheral circuit region 2A will be also described. FIGS. 80A to 80C, 81, 82, and 83 are diagrams for explaining the first application.
Recession Amount in the Case of Receding and Lowering the Surface of Element Isolation Region STI1
In the memory cell region 1A, the recession amount in the case of receding and lowering the surface of the element isolation region STI1 in the memory cell region 1A will be described below. FIGS. 80A to 80C are diagrams for explaining the recession amount of the surface of the element isolation region in the memory cell region 1A.

In the memory cell 1A, in the case where
S: Recession amount of the surface of the element isolation region STI1 (the difference between the surface height (H1) of the element isolation region STI1 and the surface height (H2) of the p-type well PW1 (semiconductor substrate 1) in the memory cell region 1A)

Pc: Polishing amount of the polysilicon film constructing the control gate electrode CG, and
H: Height of the polysilicon film from the surface of the p-type well PW1 (semiconductor substrate 1) in the control gate electrode CG after polishing (that is, the sum of the thickness of the CG gate insulating film GI and the thickness of the control gate electrode CG),
the following relations (1) to (6) can be considered for S, Pc, and H.

$$S<Pc<H \tag{1}$$

$$S<H<Pc \tag{2}$$

$$Pc<S<H \tag{3}$$

$$Pc<H<S \tag{4}$$

$$H<S<Pc \tag{5}$$

$$H<Pc<S \tag{6}$$

The relations (4), (5), and (6) relate to the case where H<S and the recession amount (STI step) is large (the case of a so-called Fin structure).

In this case, as illustrated in FIG. 80A, a process is considered such that the polysilicon film 10 for the control gate electrode CG is deposited thickly once and planarized by polishing the surface of the polysilicon film 10 and, after that, the polysilicon film 10 constructing the control gate electrode CG is polished. However, in this process, the number of steps is large.

FIG. 80B illustrates the case where the recession amount (STI step) is small. In this case, when the relations are Pc<S<H like (3), there is the possibility that the cap insulating film CP1 remains on the polysilicon film 10 for the control gate electrode CG, the polysilicon film 10 in a desired region is not exposed, and the metal silicide layer SIL is not formed on the surface of the control gate electrode CG. When the relations are S<H<Pc like (2), there is the possibility that the aspect ratio (horizontal to vertical ratio in section) at the time of processing the control gate electrode CG becomes high. When the polishing amount increases, it is feared that variations in the height of the control gate electrode CG after polishing become large.

By the above consideration, with respect to the relations of S, Pc, and H, (1) S<Pc<H is more preferable in (1) to (6). Specifically, it is preferable to set the recession amount (STI step) to be small and set the height of the control gate electrode CG to be larger than the polishing amount of the polysilicon film constructing the control gate electrode CG (FIG. 80C).

For example, when the channel width of the control gate electrode CG or the memory gate electrode MG is 100 nm, in the case of setting the recession amount (STI step) to 10 nm, the effective channel width increases to about 120 nm. As a result, current driving power can be increased by about 20%.

When the assumption that H is set to 60 nm and process variations of Pc are at least about ±10 nm is considered, in the case where the relations (1) are satisfied, S becomes 40 nm at maximum. When the recession amount (STI step) is large, in some cases, an abnormality of a bump shape is recognized in the I-V waveform which becomes a factor of characteristic variations. It is therefore preferable to set the range of 10 nm to 20 nm as the recession amount (STI step).

As described above, in the element isolation region in the peripheral circuit region 2A, the surface height H2 of the element isolation region STI1 is not receded from the surface height H2 of the semiconductor substrate 1 and the recession amount is decreased as much as possible. However, when the process variations are considered, the recession amount which is less than 10 nm, more preferably, 5 nm or less is allowed.

Relation between Height (Tc) from Surface of Semiconductor Substrate after Formation of Polysilicon Film for forming Control Gate Electrode in Memory Cell Region 1A and Height (Td) from Surface of Semiconductor Substrate after Formation of Polysilicon Film for forming Dummy Gate Electrode in Peripheral Circuit Region 2A The height from the surface of the semiconductor substrate after formation of the polysilicon film 10 (CG) for forming the control gate electrode in the memory cell region 1A is set to Tc, and the height from the surface of the semiconductor substrate after formation of the polysilicon film for forming the dummy gate electrode in the peripheral circuit region 2A or the polysilicon film 11 (DGE) for relaying is set to Td.

As illustrated in FIG. 81, in the case of H<Tc<Td, the polishing amount Pd of the polysilicon film 11 (DGE) in the peripheral circuit region 2A increases. When the polishing amount Pd of the polysilicon film 11 (DGE) increases, depending on the polishing precision, the variations of the height H of the polysilicon film 11 (DGE) in the peripheral circuit region 2A increase. In the case of forming a trench by eliminating the polysilicon film 11 (DGE) and forming a metal gate burying the trench with a metal film in such a state, deterioration in the stability of the transistor characteristics of the MISFET such as variation in the work function of the gate electrode may occur.

As illustrated in FIG. 82, in the case of H<Td<Tc, although the polishing amount of the polysilicon film 10 (CG) of the control gate electrode in the memory cell increases, the polysilicon film 10 (CG) is not replaced to a metal film. Consequently, from the view point of variations in the work function of the gate electrode, it is not a big issue.

In the case of forming the dummy gate electrode DGE by using the polysilicon film 10 (CG) for forming the control gate electrode in the memory cell region 1A as described above, as illustrated in FIG. 83, the relations become H<Td=Tc. In this case, the polishing amount is limited in correspondence with the STI step in the memory cell region 1A and therefore it cannot be helped but increasing the polishing amount of the polysilicon film 10 (CG) in the peripheral circuit region 2A.

Application 2

Although the whole element isolation region STI1 in the memory cell region 1A is receded in the first and second embodiments, only the element isolation region STI1 in the border part between the element isolation region STI1 and the p-type well (active region) PW1 may be receded. In other words, the height (H1, H2) of the element isolation region described in "Height of Element Isolation Region" may be defined by a part which is in contact with the end of the active region.

Figure 84:
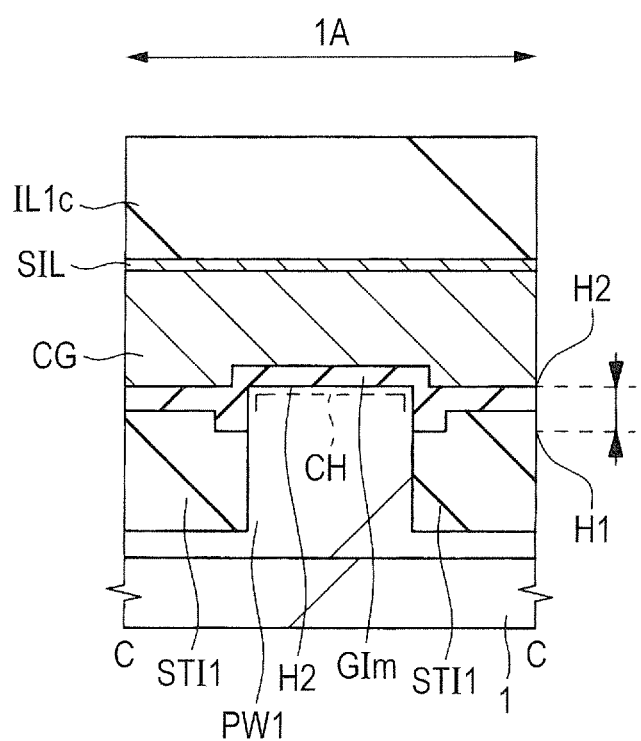
FIG. 84 is a diagram for explaining a second application of the third embodiment.

Also in such a case, as illustrated in FIG. 84, the effective channel widths in both of the control transistor and the memory transistor can be increased. FIG. 84 is a diagram for describing the second application.

Although the present invention achieved by the inventors herein has been concretely described on the basis of the embodiments, obviously, the invention is not limited to the foregoing embodiments but can be changed without departing from the gist.

What is claimed is:

1. A semiconductor device comprising a nonvolatile memory cell arranged in a first active region in a first region of a semiconductor substrate and an MISFET arranged in a second active region in a second region,
wherein the nonvolatile memory cell comprises:
a first gate electrode part arranged above the semiconductor substrate;
a second gate electrode part arranged above the semiconductor substrate so as to be adjacent to the first gate electrode part;
a first insulating film formed between the first gate electrode part and the semiconductor substrate, and
a second insulating film formed between the second gate electrode part and the semiconductor substrate and between the first gate electrode part and the second gate electrode part and having therein a charge accumulation part,
wherein the MISFET comprises:
a third gate electrode part arranged above the semiconductor substrate and including a metal film or a metal compound film;
a third insulating film formed between the third gate electrode part and the semiconductor substrate and including a high-dielectric-constant film; and
source and drain regions formed in the semiconductor substrate on both sides of the third gate electrode part, and
wherein the surface of a first element isolation region surrounding the first active region in the first region is lower than the surface of a second element isolation region surrounding the second active region in the second region.

2. The semiconductor device according to claim 1,
wherein in the first region, the surface of a first element isolation region surrounding the first active region is lower than the surface of the semiconductor substrate below a first gate electrode part, and the difference is a first level difference.

3. The semiconductor device according to claim 2,
wherein in the second region, the surface of a second element isolation region surrounding the second active region is lower than the surface of the semiconductor substrate below a third gate electrode part, and the difference is a second level difference.

4. The semiconductor device according to claim 3,
wherein the first level difference is larger than the second level difference.

5. The semiconductor device according to claim 3,
wherein the second level difference is less than 10 nm.

6. The semiconductor device according to claim 2,
wherein the first level difference is in the range of 10 nm to 20 nm.

7. The semiconductor device according to claim 1,
wherein a plurality of rectangular-shaped first active regions are arranged in the first region, and
wherein the height of the surface of the first element isolation region is the height of the first element isolation region between the first active regions.

8. The semiconductor device according to claim 1,
wherein a plurality of rectangular-shaped second active regions are arranged in the second region, and
wherein the height of the surface of the first element isolation region is the height of the second element isolation region between the second active regions.

* * * * *